(12) United States Patent
Kim et al.

(10) Patent No.: US 7,241,689 B2
(45) Date of Patent: Jul. 10, 2007

(54) MICROPROBE TIPS AND METHODS FOR MAKING

(75) Inventors: Kieun Kim, Pasadena, CA (US); Adam L. Cohen, Los Angeles, CA (US); Willa M. Larsen, Reseda, CA (US); Richard T. Chen, Burbank, CA (US); Ananda H. Kumar, Fremont, CA (US); Ezekiel J. J. Kruglick, San Diego, CA (US); Vacit Arat, La Canada Flintridge, CA (US); Gang Zhang, Monterey Park, CA (US); Michael S. Lockard, Lake Elizabeth, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 11/029,169

(22) Filed: Jan. 3, 2005

(65) Prior Publication Data

US 2005/0253606 A1 Nov. 17, 2005

Related U.S. Application Data

(63) Continuation-in-part of application No. 10/949,738, filed on Sep. 24, 2004, which is a continuation-in-part of application No. 10/772,943, filed on Feb. 4, 2004, now abandoned.

(60) Provisional application No. 60/533,975, filed on Dec. 31, 2003, provisional application No. 60/540,510, filed on Jan. 29, 2004, provisional application No. 60/533,933, filed on Dec. 31, 2003, provisional application No. 60/536,865, filed on Jan. 15, 2004, provisional application No. 60/540,511, filed on Jan. 29, 2004, provisional application No. 60/445,186, filed on Feb. 4, 2003, provisional application No. 60/506,015, filed on Sep. 24, 2003.

(51) Int. Cl.
*H01L 21/44* (2006.01)

(52) U.S. Cl. .............. 438/670; 438/689; 257/E21.159; 257/E21.523

(58) Field of Classification Search ............... 438/689, 438/670, 678, 736; 257/E21.159, E21.523, 257/E23.108
See application file for complete search history.

(56) References Cited

U.S. PATENT DOCUMENTS 6,692,145 B2 * 2/2004 Gianchandani et al. ..... 374/185
6,948,940 B2 * 9/2005 Lindsey et al. ............... 439/66

* cited by examiner

*Primary Examiner*—Caridad Everhart
(74) *Attorney, Agent, or Firm*—Dennis R. Smalley

(57) ABSTRACT

Embodiments of the present invention are directed to the formation of microprobe tips elements having a variety of configurations. In some embodiments tips are formed from the same building material as the probes themselves, while in other embodiments the tips may be formed from a different material and/or may include a coating material. In some embodiments, the tips are formed before the main portions of the probes and the tips are formed in proximity to or in contact with a temporary substrate. Probe tip patterning may occur in a variety of different ways, including, for example, via molding in patterned holes that have been isotropically or anisotropically etched silicon, via molding in voids formed in over exposed photoresist, via molding in voids in a sacrificial material that have formed as a result of the sacrificial material mushrooming over carefully sized and located regions of dielectric material, via isotropic etching of a the tip material around carefully sized placed etching shields, via hot pressing, and the like.

14 Claims, 49 Drawing Sheets

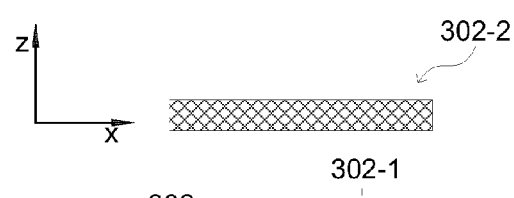
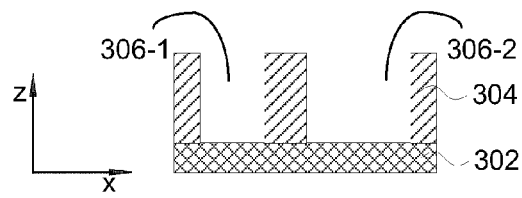
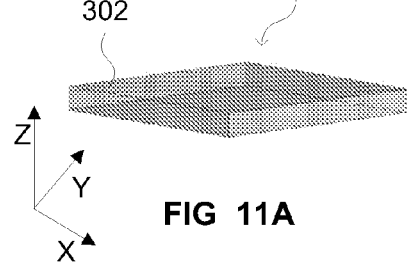
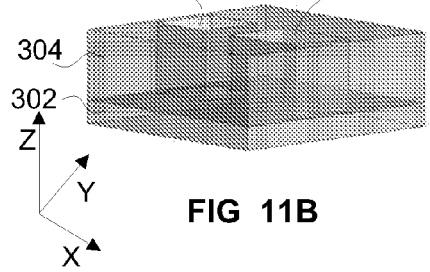
FIG 11A
FIG 11B
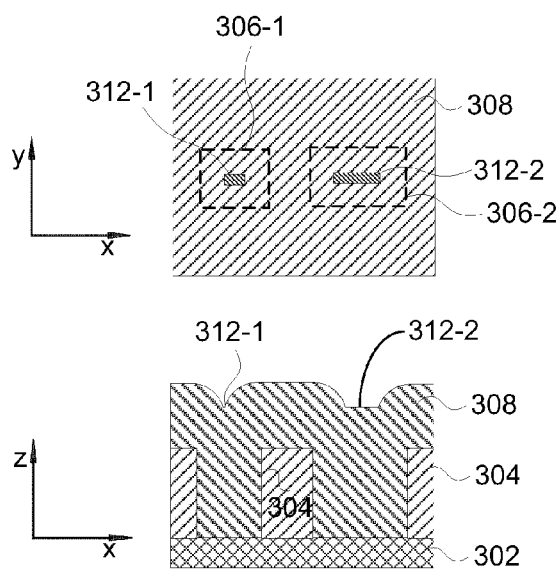
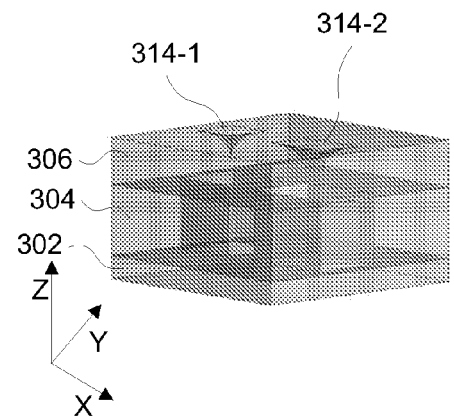
FIG 11C

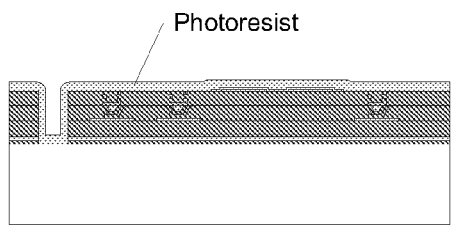
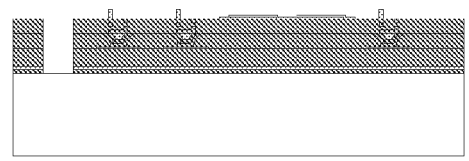
FIG 24M  FIG 24N
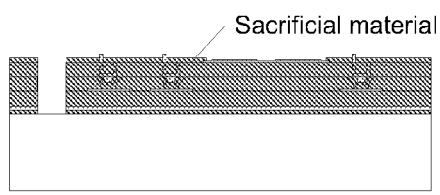
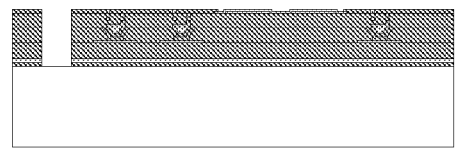
FIG 24O  FIG 24P
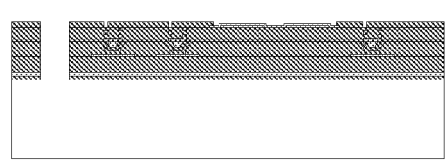
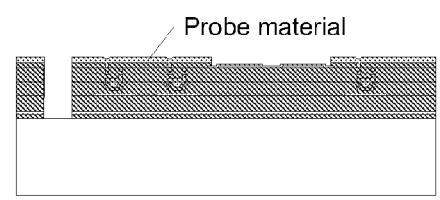
FIG 24Q  FIG 24R

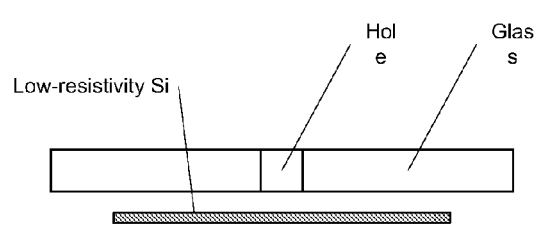
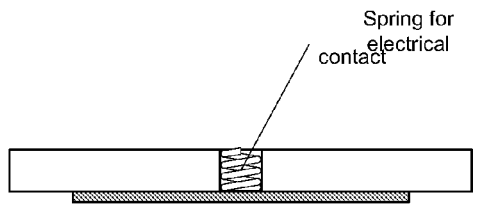
FIG 26A
FIG 26B
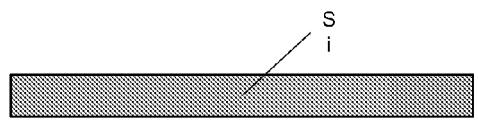
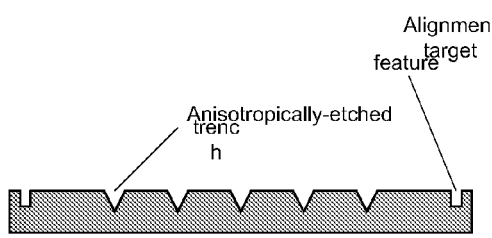
FIG 26C
FIG 26D
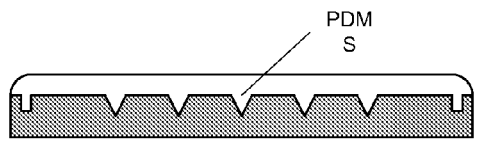
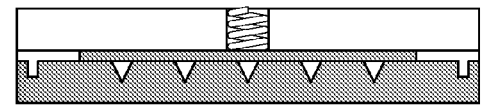
FIG 26E
FIG 26F
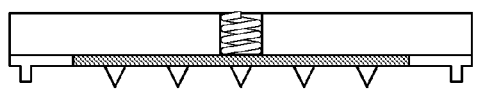
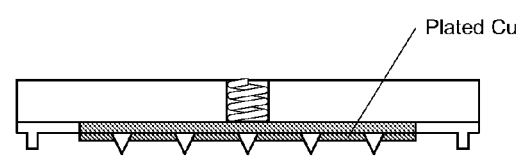
FIG 26G
FIG 26H Wafer
Wafer alignment target Deposited Cu Tip material (Rh, etc.)

Bonding point

MICROPROBE TIPS AND METHODS FOR MAKING

RELATED APPLICATIONS

This application claims benefit of U.S. App. Nos. 60/533,975, filed Dec. 31, 2003 60/540,510, filed Jan. 29, 2004 60/533,933, 60/536,865, filed on Dec. 31, 2003 filed on Jan. 15, 2004 filed on Jan. 29, 2004 and 60/540,511 and this application is a CIP of Ser. No. 10/949,738 filed on Sep. 24, 2004 which in turn is a CIP of Ser. No. 10/772,943, filed on Feb. 4, 2004 now abandoned which in turn claims benefit of U.S. App. Nos. 60/445,186; filed on Feb. 4, 2003 60/506,015; filed on Sep. 24, 2003 60/533,933, filed on Dec. 31, 2003 and 60/536,865; filed on Jan. 15, 2004 furthermore the '738 application claims benefit of U.S. App. Nos.: 60/506,015; filed on Sep. 24, 2003 60/533,933; filed on Dec. 31, 2003 and 60/536,865 filed on Jan. 15, 2004. Each of these applications is incorporated herein by reference as if set forth in full herein including any appendices attached thereto.

FIELD OF THE INVENTION

The present invention relates generally to microprobes (i.e. compliant contact elements) and EFAB™ type electrochemical fabrication processes for making them and more particularly to microprobe tips designs and process for making them.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1.) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2.) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3.) A. Cohen, "3-D Micromachining by Electrochemical Fabrication", Micromachine Devices, March 1999.

(4.) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5.) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6.) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7.) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8.) A. Cohen, "Electrochemical Fabrication (EFAB™)", Chapter 19 of The MEMS Handbook, edited by Mohamed Gad-EI-Hak, CRC Press, 2002.

(9.) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A–1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D–1F. FIG. 1D shows an anode 12' separated from a mask 8' that comprises a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A–2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A–3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, and/or more independence between geometric configuration and the selected fabrication process. A need also exists in the field of miniature (i.e. mesoscale and microscale) device fabrication for improved fabrication methods and apparatus.

A need also exists in the electrochemical fabrication field for enhanced techniques that supplement those already known in the field to allow even greater versatility in device design, improved selection of materials, improved material properties, more cost effective and less risky production of such devices, and the like.

SUMMARY OF THE INVENTION

It is an object of some aspects of the invention to provide an electrochemical fabrication technique capable of fabricating improved microprobe tips.

It is an object of some aspects of the invention to provide an electrochemical fabrication technique capable of fabricating improved microprobes and microprobe tips.

It is an object of some aspects of the invention to provide an improved electrochemical fabrication technique capable of fabricating microprobe tips.

It is an object of some aspects of the invention to provide an improved electrochemical fabrication technique capable of fabricating microprobes and microprobe tips.

Other objects and advantages of various aspects of the invention will be apparent to those of skill in the art upon review of the teachings herein. The various aspects of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single aspect of the invention even though that may be the case with regard to some aspects.

In a first aspect of the invention, a method for creating a contact structure, comprising: forming a contact tip having a desired configuration; forming compliant probe structure electrochemically; and adhering the contact tip to the probe structure to form a contact structure.

In a second aspect of the invention, a method for creating a contact structure, comprising: forming a contact tip having a desired configuration; forming compliant probe structure from a plurality of adhered layers of electrodeposited material; and adhering the contact tip to the probe structure to form a contact structure.

In a third aspect of the invention, a method for creating a contact structure, comprising: forming a contact tip having a desired configuration; and forming compliant probe structure electrochemically, wherein the compliant probe structure is formed on the contact tip.

In a fourth aspect of the invention, a method for creating a contact structure, comprising: forming a contact tip having a desired configuration; and forming compliant probe structure from a plurality of adhered layers of electrodeposited material, wherein the compliant probe structure is formed on the contact tip.

In a fifth aspect of the invention, a method for creating a contact structure, comprising: forming compliant probe structure electrochemically; and forming a contact tip having a desired configuration, wherein the contact tip is formed on the compliant probe structure.

In a sixth aspect of the invention, a method for creating a contact structure, comprising: forming compliant probe structure from a plurality of adhered layers of electrodeposited material; and forming a contact tip having a desired configuration, wherein the contact tip is formed on the compliant probe structure.

Further aspects of the invention will be understood by those of skill in the art upon reviewing the teachings herein. Other aspects of the invention may involve combinations of the above noted aspects of the invention. Other aspects of the invention may involve apparatus that can be used in implementing one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 11A–11F schematically depict partially transparent, perspective views, side views along a central cut plane, and top views at various stages of a process for forming an array of probe tips according to a seventh embodiment of the invention where the probe tips are formed using a mold formed from a patterned deposition that forms multiple voids (one per tip) followed by a blanket deposition that narrows the voids and gives them a desired shape.

FIGS. 26A–26H depict the process for making the contact mask, whereas

DETAILED DESCRIPTION OF PREFERRED EMBODIMENTS OF THE INVENTION

FIGS. 1A–1G, 2A–2F, and 3A–3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
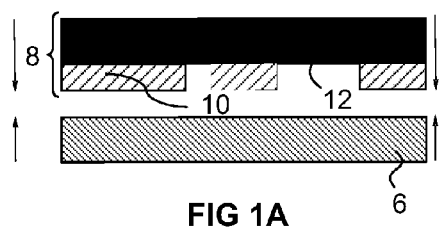
FIGS. 1A–1C schematically depict side views of various stages of a CC mask plating process, while FIGS. 1D–1G schematically depict a side views of various stages of a CC mask plating process using a different type of CC mask.
Figure 1B:
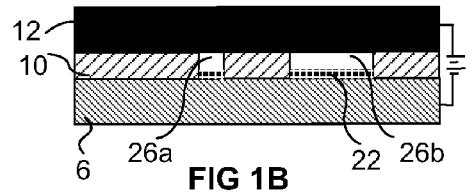
Figure 1C:
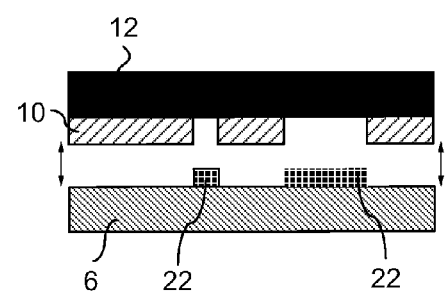
Figure 1D:
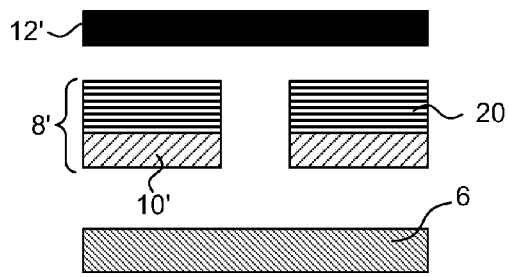
Figure 1E:
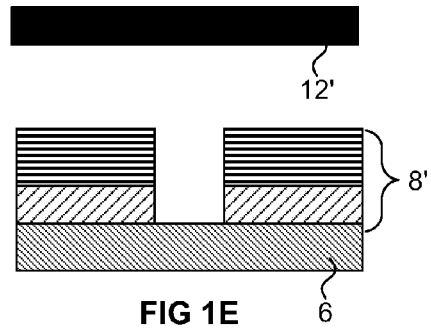
Figure 1F:
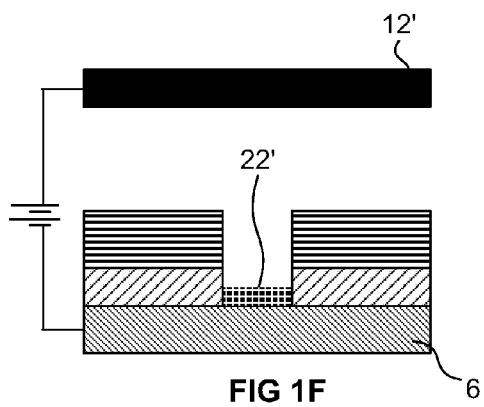
Figure 1G:
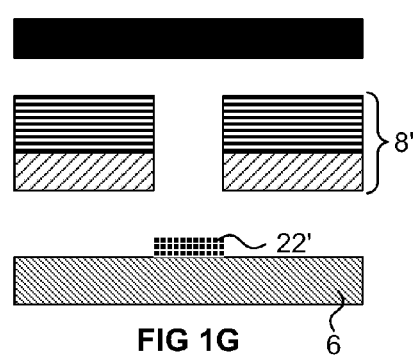
Figure 2A:
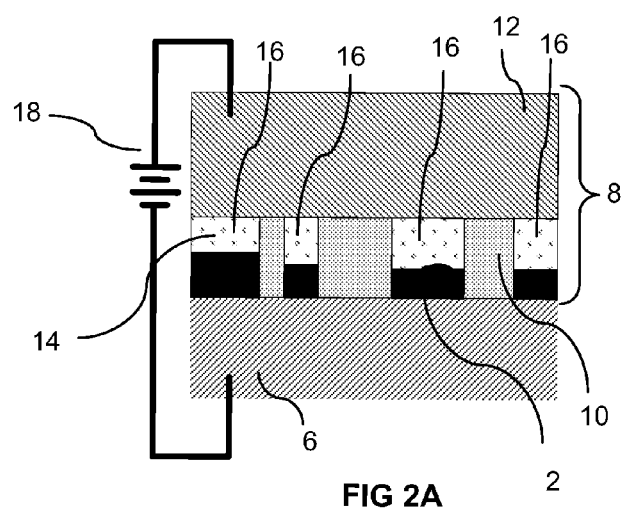
FIGS. 2A–2F schematically depict side views of various stages of an electrochemical fabrication process as applied to the formation of a particular structure where a sacrificial material is selectively deposited while a structural material is blanket deposited.
Figure 2B:
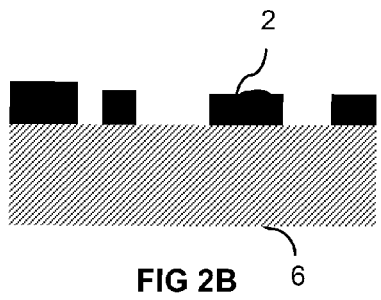
Figure 2C:
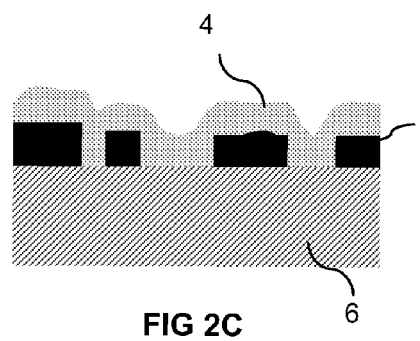
Figure 2D:
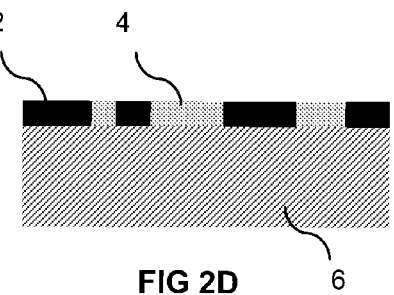
Figure 2E:
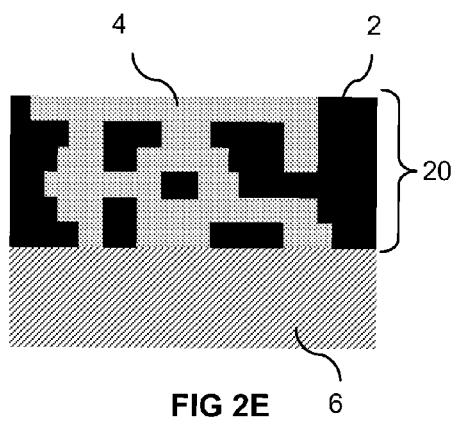
Figure 2F:
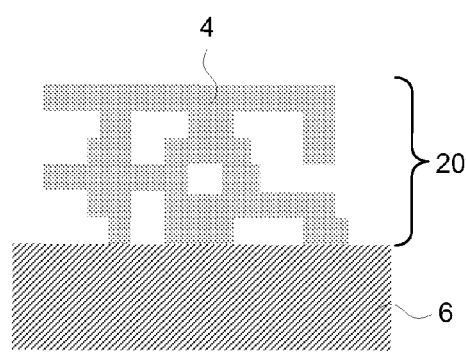
Figure 3A:
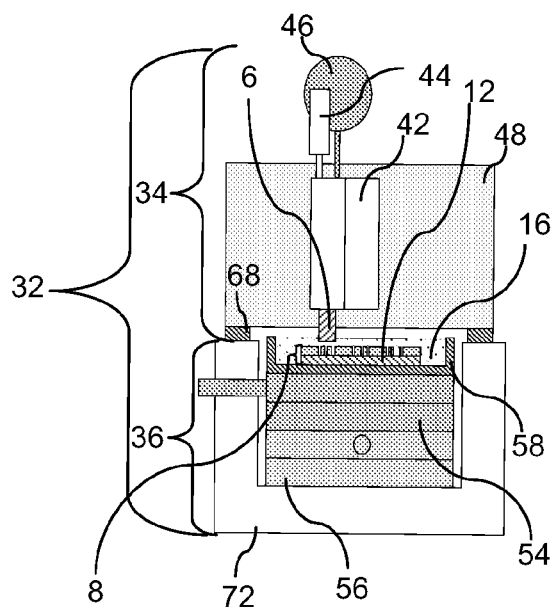
FIGS. 3A–3C schematically depict side views of various example subassemblies that may be used in manually implementing the electrochemical fabrication method depicted in FIGS. 2A–2F.
Figure 3B:
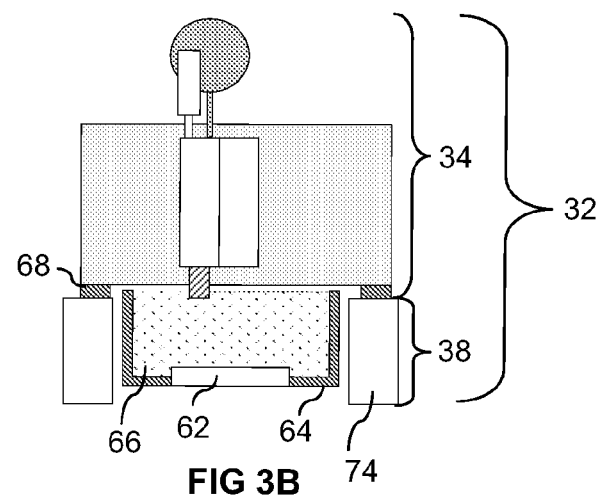
Figure 3C:
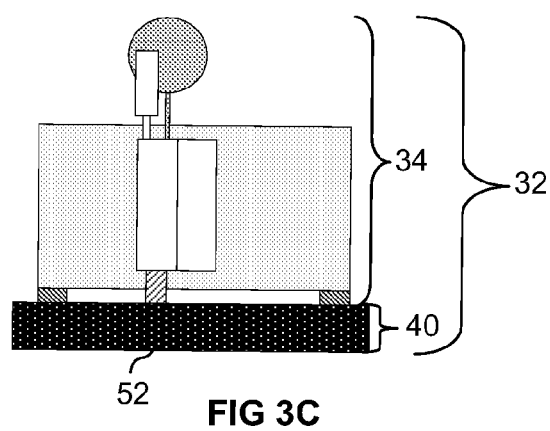
Figure 4A:
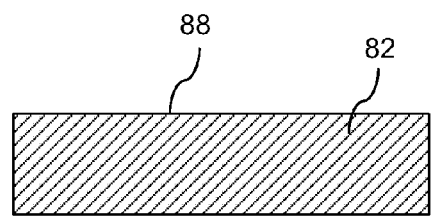
FIGS. 4A–4I schematically depict the formation of a first layer of a structure using adhered mask plating where the blanket deposition of a second material overlays both the openings between deposition locations of a first material and the first material itself.
Figure 4B:
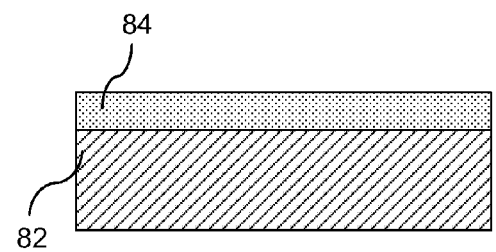
Figure 4C:
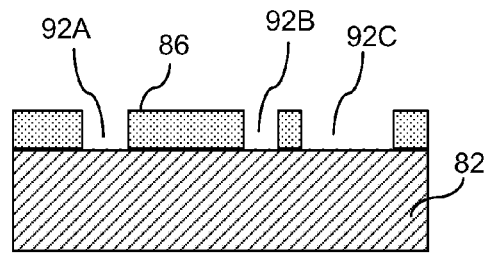
Figure 4D:
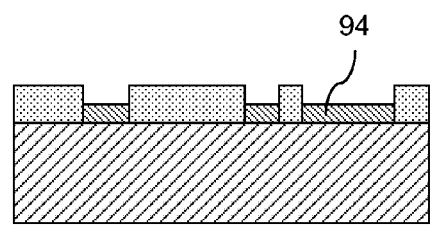
Figure 4E:
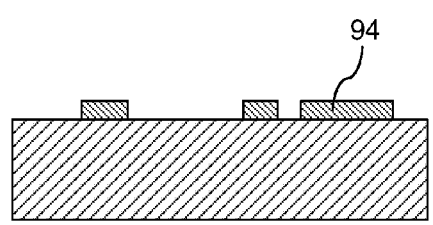
Figure 4F:
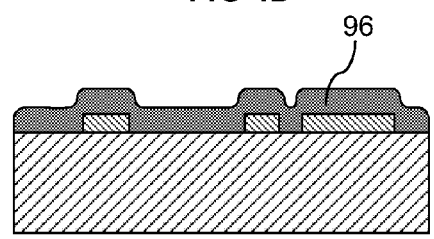
Figure 4G:
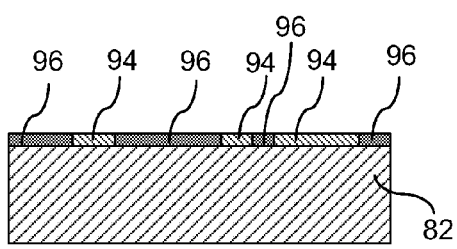
Figure 4H:
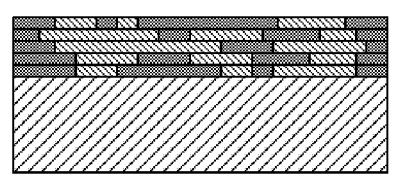
Figure 4I:
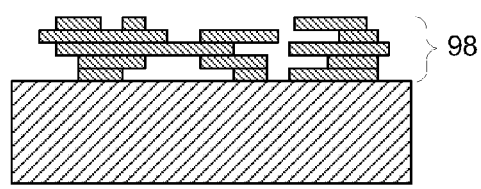

FIGS. 4A–4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)–92(c) extending from a surface 86 of the photoresist through the thickness of the photoresist to surface 88 of the substrate 82. In FIG. 4D, a metal 94 (e.g. nickel) is shown as having been electroplated into the openings 92(a)–92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B–4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may be combined with or be implemented via electrochemical fabrication techniques. Such combinations or implementations may be used to form multi-layer structures using a single patterning technique on all layers or using different patterning techniques on different layers. For example, different types of patterning masks and masking techniques may be used or even techniques that perform direct selective depositions without the need for masking. For example, conformable contact masks may be used during the formation of some layers while non-conformable contact masks may be used in association with the formation of other layers. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

FIGS. 5A–5J schematically depict side views at various stages of the process for forming an array of probe elements according to a first embodiment of the invention where the probe element tips are formed via electroplating onto a seed layer coated epoxy template which was molded from a silicon wafer that underwent patterned anisotropic etching.

Figure 5A:
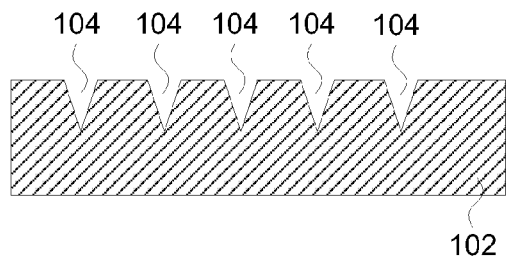
FIGS. 5A–5J schematically depict side views at various stages of the process for forming an array of probe elements according to a first embodiment of the invention where the probe element tips are formed via electroplating onto a seed layer coated epoxy template which was molded from a silicon wafer that underwent patterned anisotropic etching.

FIG. 5A depicts a state of the process after a patterned silicon wafer is supplied. The silicon wafer has been patterned by placing a mask over its surface and patterning the mask to have openings in regions that correspond to desired probe tip locations. While the mask is in place an isotropic etching is preformed to create V-shaped or conically shaped holes in the silicon.

Figure 5B:
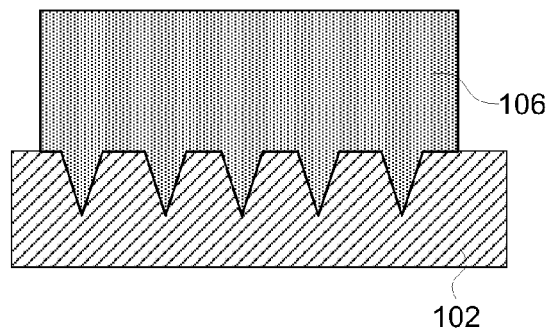

In alternative embodiments these openings may take the form of V-shaped trenches where it is desired that probe tips take such a form. The openings 104 and silicon 102 correspond to desired probe tip locations and represent the compliment of the probe tip shape. After the patterned silicon is obtained a casting material 106, such as an epoxy is molded over the patterned surface of the silicon as illustrated in FIG. 5B.

Figure 5C:
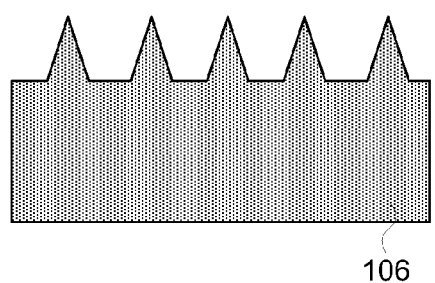

Next the molded inverted replica of the patterned silicon is separated from the silicon as shown in FIG. 5C.

Figure 5D:
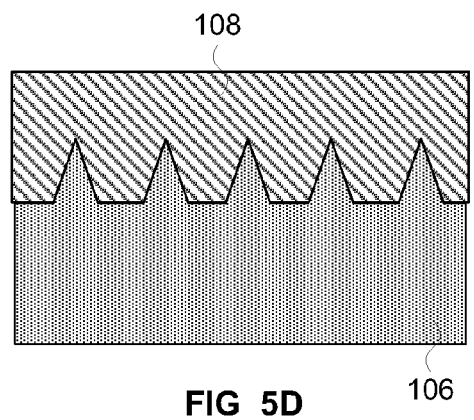

FIG. 5D depicts the state of the process after electrodepositing and planarizing a sacrificial material 108 over the patterned surface of the replica. The sacrificial material 108 may be, for example, copper. Depending on the conductive or dielectric nature of the material forming replica 106, it may be necessary to form a seed layer or plating base on the surface of material 106 prior to electroplating. Such a seed layer may take the form of sputtered titanium or chromium over which a sputtered seed layer material may be located in preparation for electroplating.

Figure 5E:
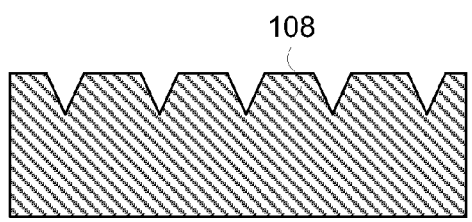

FIG. 5E depicts a state of the process after electroplated material 108 is separated from replica 106.

Figure 5F:
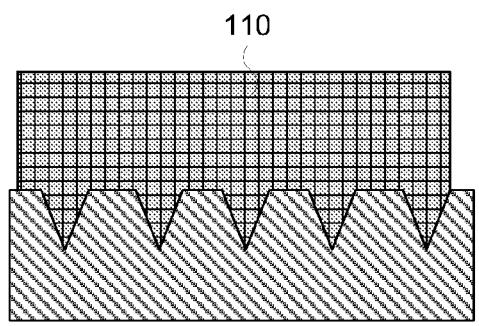

FIG. 5F depicts a state of the process after a desired tip material 110 is plated over the patterned surface of the sacrificial material 108.

Figure 5G:
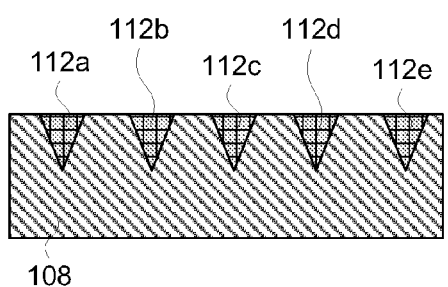

Next as indicated in FIG. 5G the tip material 110 and sacrificial material 108 are planarized to a level that causes individual tips 112a, 112b, 112c, 112d, and 112e, to become separated from one another.

Figure 5H:
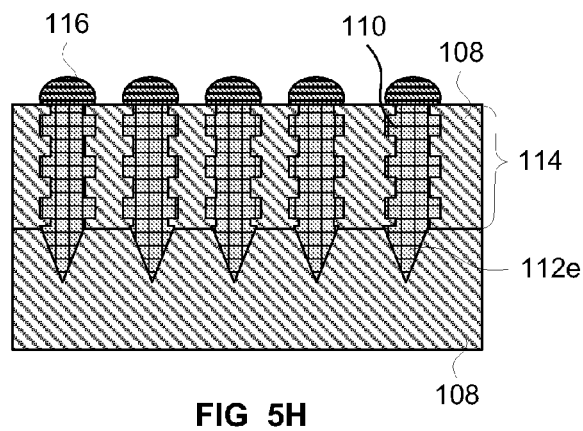

FIG. 5H depicts the state of the process after multiple layers of structure have been formed where each layer consists of regions of sacrificial material 108 and regions of structural material 110. Also as shown in FIG. 5H a bonding material 116 is shown as having been selectively applied to exposed regions of conductive material 110 associated with each probe element. Material 116 may be applied in a variety of manners such as, for example, electroplating via openings in a masking material. Material 116 may, for example, be a low melting point metal such as tin, lead, a tin lead alloy, or other solder like material. After depositing the adhesion material it may be reflowed to give it a ball like configuration as shown in FIG. 5H. Before or after application of the adhesion or bump material dicing of probe elements into desired groups may occur where the groups represent discrete quantities and patterns of probes that may be used in a desired application.

Figure 5I:
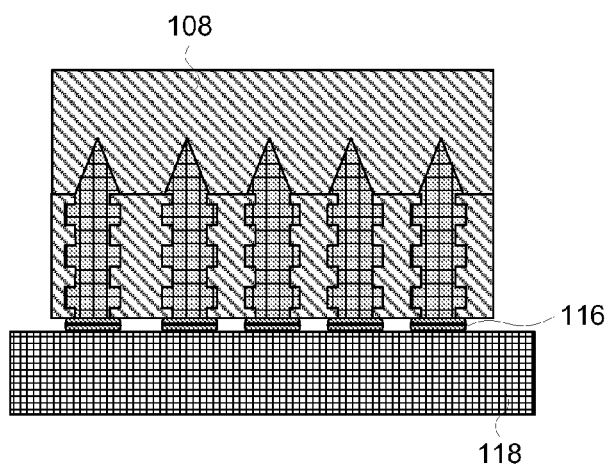

FIG. 5I depicts a state of the process after the probe structures have been flipped over and adhered to a substrate 118 via bumps or adhesion material 116. Substrate 118 may, for example, be a space transformer or intermediate structure containing a desired network of conductive leads.

Figure 5J:
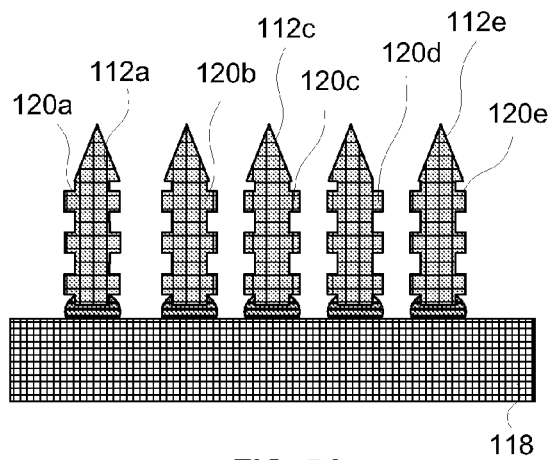

FIG. 5J depicts a state of the process after sacrificial material 108 has been removed resulting in probes 120a–120e being independently contacted and mounted to substrate 118. The layer by layer built up portions of probes 120a–120e as depicted are not intended to illustrate any particular probe features or design configurations but instead are intended to show the existence of an elongated structure extending from substrate 118 to tips 112a–112e. Probe configuration made tight on appropriate form, for example, probe forms described in U.S. Patent Application No. 60/533,933 filed Dec. 31, 2003 and entitled "Electrochemically Fabricated Microprobes" may be used. This referenced patent application is incorporated herein by reference as if set forth in full.

In summary, the primary elements of the first embodiment include: (1) An isotropically etching of desired probe tip configurations into silicon via a patterned mask. (2) Cast a complimentary replica of the openings in the silicon. The casting material may be, for example, an insulative or conductive epoxy material. Prior to casting the silicon surface may be treated with an appropriate release agent to aid in separating the wafer and the replicated pattern. (3) Separate the replica and the silicon wafer. (4) If the surface of the replica is not conductive or plate-able apply a seed layer to the patterned surface of the replica. If necessary prior to applying a seed layer material, an adhesion layer material may be applied. The application of either or both of these materials may occur via a physical deposition process, such as sputtering, a chemical vapor deposition process, an electroless deposition process, and or a direct metallization process. The adhesion layer material may be, for example, titanium, chromium, a titanium-tungsten alloy, or the like. The seed layer material itself may be, for example, copper, nickel, or any other material that may be applied to the adhesion layer material onto which subsequent plating may occur. (5) Electroplate a sacrificial material to a desired height which is at least as great as, and more preferably greater than, the height of the patterned protrusions on the replica. The sacrificial material may, for example, be copper or some other material that is readily separable from a structural material that the probe tips and rest of the probe elements will be made from. (6) Optionally planarize the surface of the sacrificial material so as to give the sacrificial material a reference surface that will be useful in performing subsequent operations. Alternatively a casting operation or the like may be used to give the sacrificial material a desired reference surface. (7) The sacrificial material is separated from the epoxy mold. (8) A desired tip metal is blanket plated onto the patterned surface of the sacrificial material to a sufficient height to fill the voids in the surface. (9) The tip material and the sacrificial material are planarized so that the tip metal separately fills each void in the sacrificial material without bridging the individual tip regions. A multi-layer electrochemical fabrication process occurs so as to build up probe elements from a plurality of adhered layers of structural material, where each layer includes structural material in desired locations and sacrificial material in the remaining locations. (10) After formation of all layers, an adhesion material or bonding material is selectively located on the structural material for each probe element. This bonding material may take the form of a low temperature metal such as tin, tin-lead or other solder like material. The selective application of the bonding material may occur in a variety of ways. For example, it may occur via a masking and selective plating operation, followed by removal of the masking material, and potentially followed by the reflowing of the deposited material to give it a rounded configuration over each probe element. (11) The structure may be diced into smaller groupings of probe elements having desired configurations in preparation for locating them on desired locations of substrates such as space transformers or probe chip structures or the like. (12) Use a flip chip process to bond the probe elements to the substrate using the bonding or adhesion material. (13) Remove the sacrificial material by etching to release and separate the individual probe elements that have been mounted to the substrate.

In alternative embodiments this process may be used to produce single probe elements. In some variations of this embodiment, master patterns may be made from other selective patterned materials and probe tip configurations may take on other shapes.

FIGS. 6A–6E schematically depict side views at various stages of process for forming an array of probe elements according to a second embodiment of the invention which is similar to the first embodiment of the invention with the exception that the probe element tips are formed a different material than the rest of the probe elements.

Figure 6A:
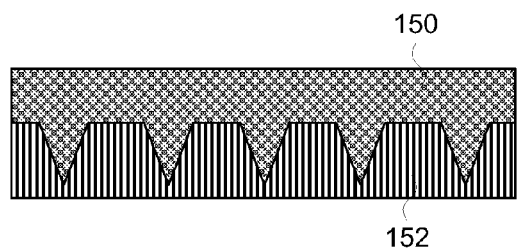
FIGS. 6A–6E schematically depict side views at various stages of process for forming an array of probe elements according to a second embodiment of the invention which is similar to the first embodiment of the invention with the exception that the probe element tips are formed a different material than the rest of the probe elements.

FIG. 6A depicts a state of the process after a tip material 150 is deposited into a sacrificial molding material 152. If sacrificial mold material 152 is not conductive or plate-able a seed layer and potentially an adhesion layer may be formed on mold surface prior to plating material 150. In variations of this embodiment, material 150 may be located on the patterned surface of material 152 using a process other then electroplating.

Figure 6B:
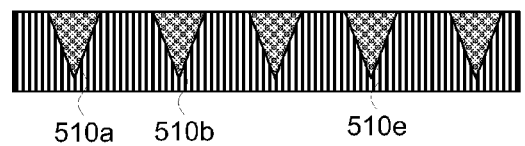

FIG. 6B depicts a state of the process after tip material 150 and mold material 152 have been planarized to make tip elements 150a–150e independent of one another by removing any bridging material 150 that connected them after the deposition operation.

Figure 6C:
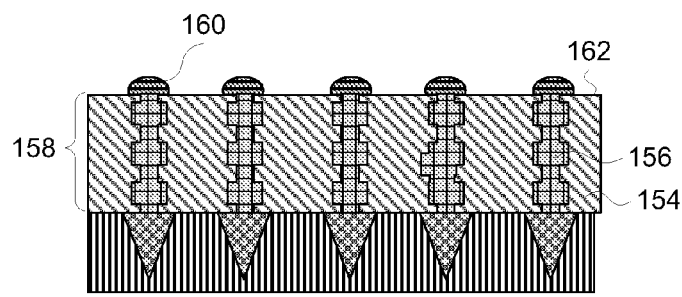

FIG. 6C depicts a state of the process after multiple layers of the probe elements have been formed according to an electrochemical fabrication process where each layer includes regions of a sacrificial material 154 and regions of structural material 156. The regions of these materials on each layer are defined by the desired cross section of the array of probe elements associated with that cross section. After formation of all layers 158 an adhesion or bonding material 160 is selectively located over the ends of structural material 156 (i.e. over the distal end of the probe elements). Material 160 may be selectively applied by masking surface 162 of layers 158 and then electrodepositing material 160, (e.g. tin, tin-lead, or other solder like materials) into the openings in the mask. After electrodeposition is completed the mask may be removed and if desired bonding material 160 may be heated so that it reflows to form rounded balls or bumps of material.

Figure 6D:
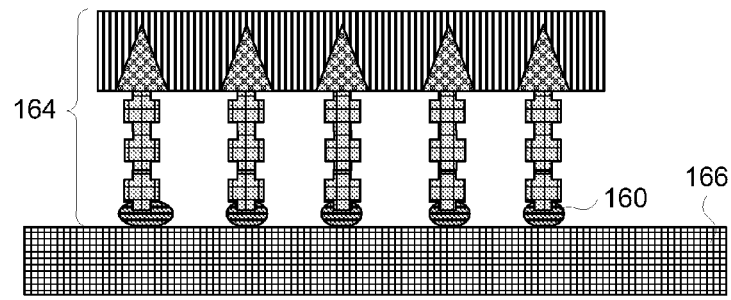

FIG. 6D depicts a state of the process after the array of probe elements 164 have been bonded via bonding material 160 to a substrate 16, and the sacrificial material 154 has been removed. The order of attachment and the order of removal may be performed in any desired manner. In other words, in some variations of this embodiment, the removal operation may occur prior to the attachment operation while in other variations of this embodiment the attaching operation may occur prior to the removal operation.

In still other variations of the present embodiment where removal of sacrificial material is to occur prior to attachment, the removal of sacrificial material may occur prior to formation of the bumps 160 of the adhesion material being attached to the distal ends of the structural material 156 forming the probe elements.

In still other variations of the present embodiment the last layer or layers of the probe elements may be formed using a different material than sacrificial material 154. This different material may be a conductive or dielectric sacrificial material or it may be a dielectric structural material. This different material may be put in place as part of the formation process for the last layer or layers or alternatively it may be put in place after layer formation is completed and an etching of the sacrificial material from surface 162 removes one or more layers of the material. After the different material is put in place, surface 162 may be re-planarized and then bumps 160 formed. In still further variations of the present embodiment, bumps 160 may not be directly formed on structural material 156 but instead may be formed in desired locations on a substrate 166 and then made to contact and bond to probe elements 164 during the adhesion operation.

Figure 6E:
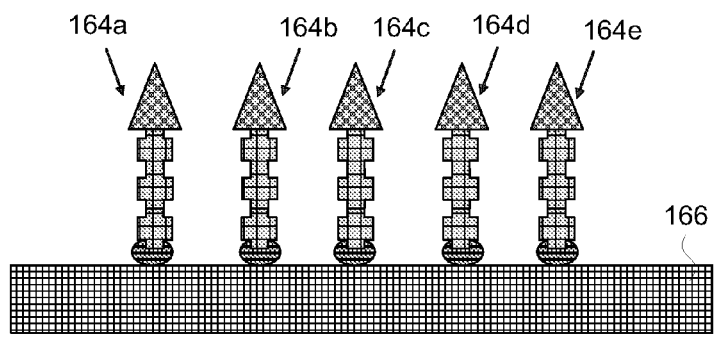

FIG. 6E shows the state of the process after the original sacrificial material 152 holding tips 150a–150e is removed thereby forming independent probe elements 164a–164e on substrate 166. If the different material described in one of the above variations is used, that different material may be removed before or after the adhesion process occurs or may remain as a part of the final structure and may actually be used to enhance adhesion between the probe elements 164a–164e and substrate 166.

FIGS. 7A–7F schematically depict side views at various stages of a process for forming a probe element according to a third embodiment of the invention where the probe element tip is formed using a protrusion of patterned photoresist that is made to have an undercut.

Figure 7A:
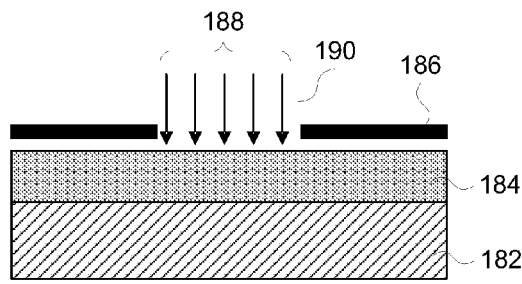
FIGS. 7A–7F schematically depict side views at various stages of a process for forming a probe element according to a third embodiment of the invention where the probe element tip is formed using a protrusion of patterned photoresist that is made to have an undercut FIGS. 8A–8F schematically depict side views at various stages of a process for forming a probe element according to a fourth embodiment of the invention where the probe element tip is formed using an indentation in a patterned photoresist that is made to have sidewalls that taper outward.

FIG. 7A depicts a state of the process where a temporary substrate 182 is coated with a negative photoresist material 184, e.g. Futurrex NR9-8000, which has one or more openings 188 through which radiation 190 may be directed to expose the photoresist material. Openings 188 correspond to locations where probe element tip material 192 will eventually be located on substrate 182.

Figure 7B:
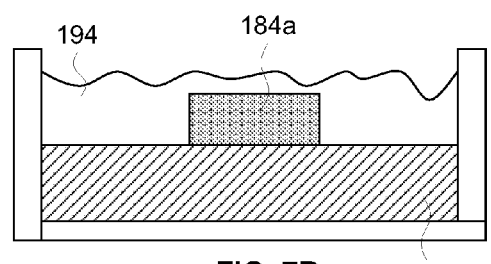

FIG. 7B depicts a state of the process after substrate 182 and photoresist 184 have been immersed in a developing solution 194 such that unexposed portions of photoresist 184 are removed and such that exposed region 184a remains.

Figure 7C:
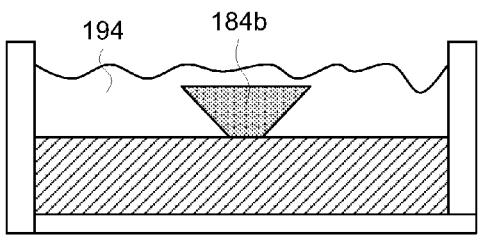

FIG. 7C depicts a state of the process after continuing to expose photoresist element 184a to developing solution so that it becomes overdeveloped which causes undercutting of the photoresist to occur leading to the trapezoidal shaped element 184b.

Figure 7D:
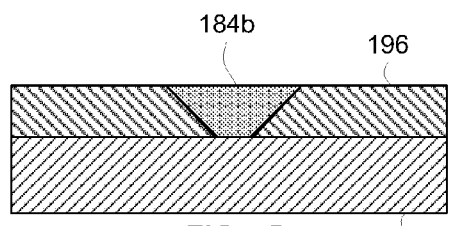

FIG. 7D depicts a state of the process after photoresist element 184b has been used as a mask in a through plating operation which results in the deposition of a sacrificial material 196 which may be the same or different from substrate material 182. If the deposition of sacrificial material 196 is not sufficiently uniform a planarization operation may be used to achieve the configuration depicted in FIG. 7D.

Figure 7E:
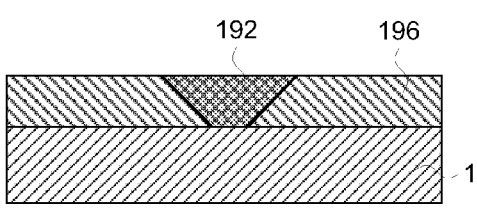

FIG. 7E depicts a state of the process after probe tip material 192 has been deposited into the void created by the removal of photoresist material 184b. If necessary to give probe tip material 192 and sacrificial material 196 a desired surface configuration the upper surface of these two materials may be planarized to yield the configuration shown in FIG. 7E.

Figure 7F:
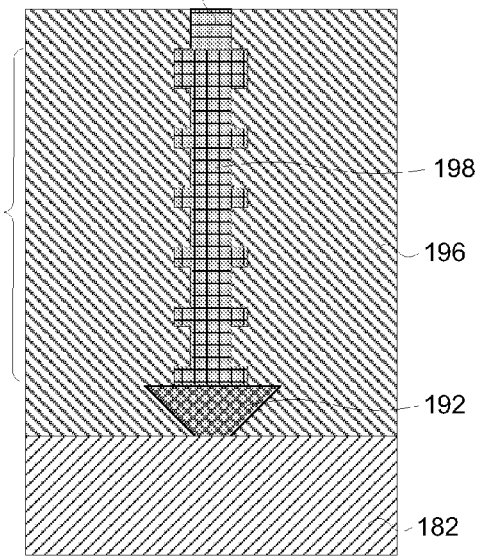

FIG. 7F depicts a state of the process after electrochemical fabrication of a plurality of layers produces probe element 202 bounded on one end by probe tip material 192 and bounded on the other end by an adhesion material 200. After formation of the completed probe tip (as shown) or probe tip array (not shown) the sacrificial material 196 may be removed and the probe elements bonded to a substrate after which temporary substrate 182 may be removed.

In variations of this embodiment adhesion material 200 need not be surrounded by sacrificial material 196 as it may be directly pattern deposited. In such cases, or in cases where removal of the upper most portion of the sacrificial material occurs it may be possible to bond probe elements 202 to a desired substrate via bonding material 200 prior to removal of all of the sacrificial material. In such cases temporary substrate material 182 maybe removed before or after adhesion has taken place.

The variations and features of this embodiment may have application in variations of the previously discussed embodiments or embodiments to be discussed hereinafter just as variations and features of the previous embodiments may have application to creation of further variations of the present embodiment or variations of embodiments to be described hereinafter just as features of the various embodiments to be discussed hereinafter and their variations may have applications to create further variations of the present embodiment or previously discussed embodiments.

FIGS. 8A–8F schematically depict side views at various stages of a process for forming a probe element according to a fourth embodiment of the invention where the probe element tip is formed using an indentation in a patterned photoresist that is made to have sidewalls that taper outward.

Figure 8A:
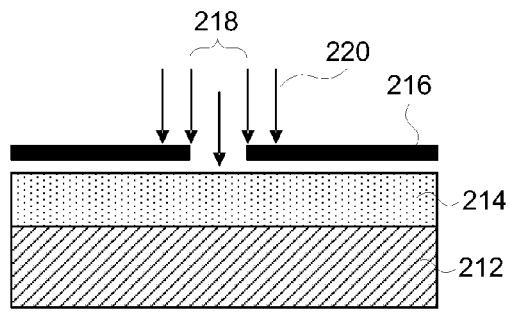

FIG. 8A depicts a state of the process after a temporary substrate 212 is coated with a positive photoresist 214 and a mask 216 with one or more openings 218 positioned above the photoresist. Radiation 220 is allowed to expose the photoresist in hole regions 218.

Figure 8B:
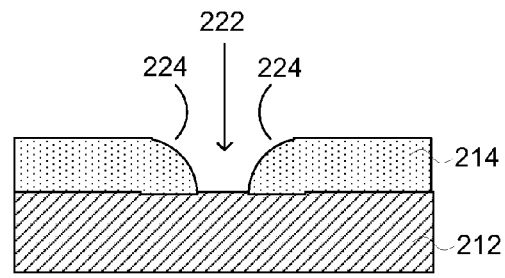

FIG. 8B depicts a state of the process after exposed photoresist 214 is developed and then overdeveloped to yield opening or openings 222 having tapered side walls 224.

Figure 8C:
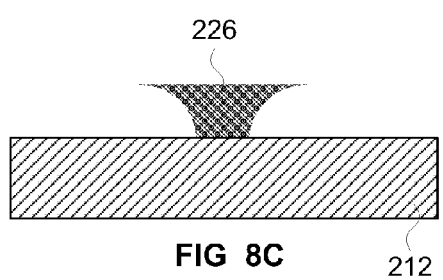

FIG. 8C depicts a state of the process after a probe element tip material 226 is deposited into opening 222 of photoresist 214 and then photoresist 214 is removed.

Figure 8D:
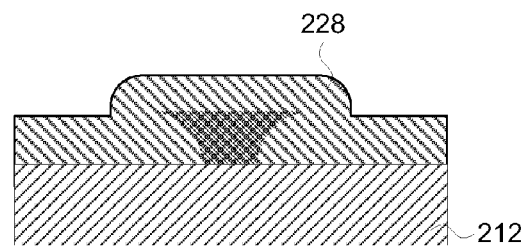

FIG. 8D depicts a state of the process after a sacrificial material 228 is electrodeposited over substrate 212 and over probe tip material 226.

Figure 8E:
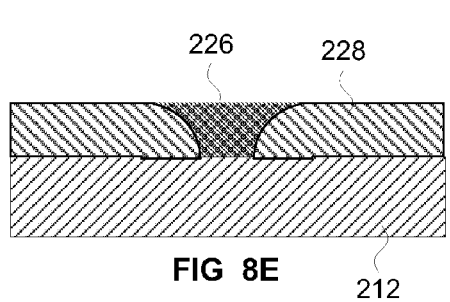

FIG. 8E depicts a state of the process after the sacrificial material and probe tip material have been planarized.

Figure 8F:
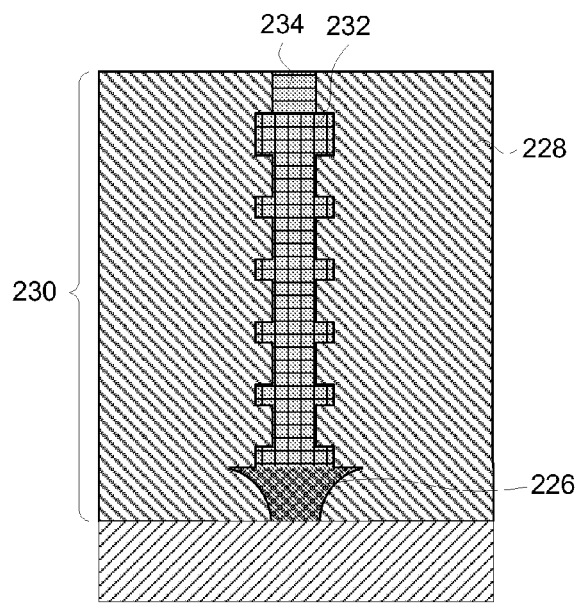

FIG. 8F depicts a state of the process after a plurality of layers of probe element 230 have been formed from a structural material 232 and sacrificial material 228. On one end probe element 230 includes the probe tip made from material 226 and on the other end an adhesion or bonding material 234.

Next as described in association with the previous embodiments, probe element 230 or an array of probe elements (not shown) may be released from the sacrificial material and from the temporary substrate and bonded to a desired substrate via adhesion material 234.

In variations of the above embodiment enhanced sloping or tapering of the photoresist material may occur not just as a result of overdevelopment but also as a result of underexposure and/or tailored baking operations.

FIGS. 9A–9G schematically depict side views at various stages of a process for forming an array of probe elements according to a fifth embodiment of the invention where the probe element tips are formed using protrusions of a patterned photoresist material over which an electroplated material is made to mushroom and through which openings are etched.

Figure 9A:
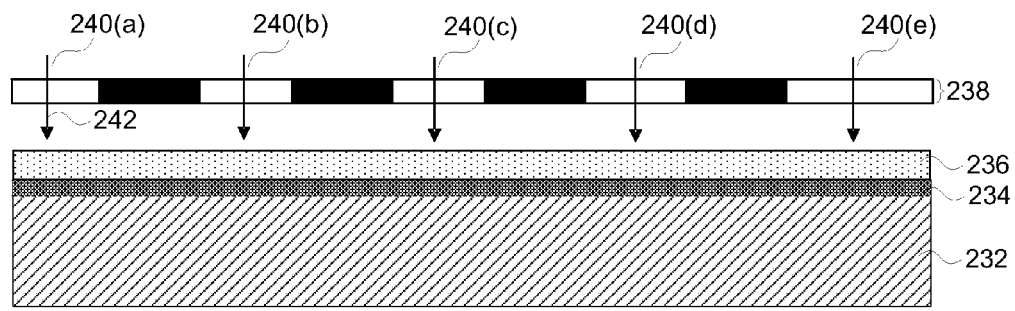
FIGS. 9A–9G schematically depict side views at various stages of a process for forming an array of probe elements according to a fifth embodiment of the invention where the probe element tips are formed using protrusions of a patterned photoresist material over which an electroplated material is made to mushroom and through which openings are etched.

FIG. 9A depicts a state of the process after a temporary substrate 232 is coated with a seed layer material or seed layer stack 234 and that is in turn coated with a photoresist material 236. Located above the photoresist material is a photomask 238 which contains openings 240*a*–240*e* through which radiation 242 may expose and latently pattern photoresist material 236.

Figure 9B:
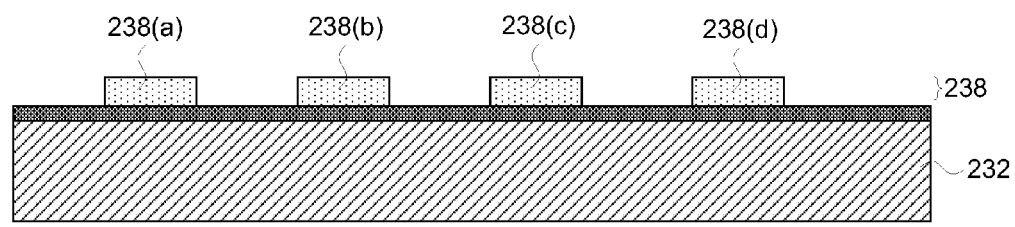

FIG. 9B depicts a state of the process after development of the exposed and latently patterned photoresist 238 yields small plugs of photoresist material 238*a*–238*d* which mark locations where probe tip elements will be formed.

Figure 9C:
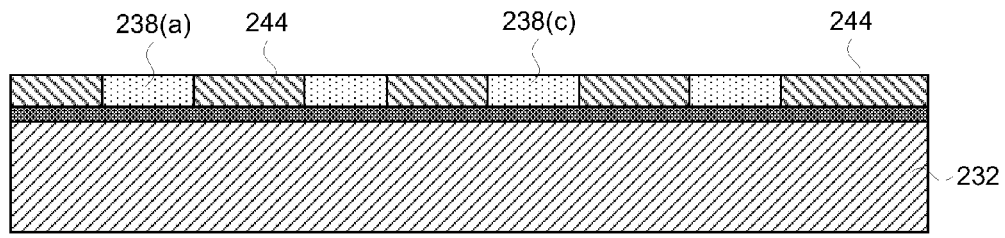

FIG. 9C depicts a state of the process after a sacrificial material 244 is deposited into the openings between and adjacent to photoresist plugs 238*a*–238*d*. If necessary the photoresist plugs and deposited sacrificial material 244 may be planarized to yield the structural configuration shown in FIG. 9C.

In variations of the embodiment such planarization may not be necessary while in other embodiments such planarization may be useful in enhancing the uniformity of mold patterns that will be created.

Figure 9D:
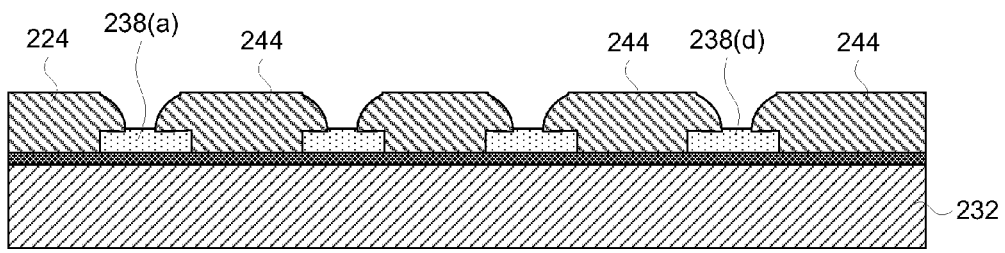

FIG. 9D depicts a state of the process after additional deposition or continued deposition operations causes outward mushrooming of sacrificial material over the photoresist plugs. In the context of the present application mushrooming refers to the in plane spreading of the electrodeposited material occurring over dielectric material as the height of the deposition grows.

Figure 9E:
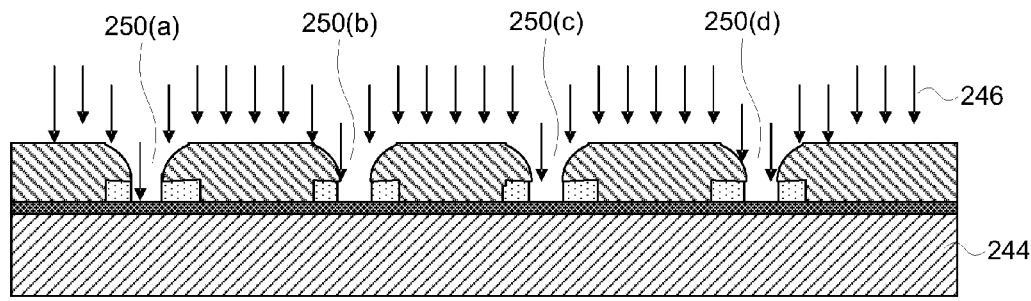
Figure 9F:
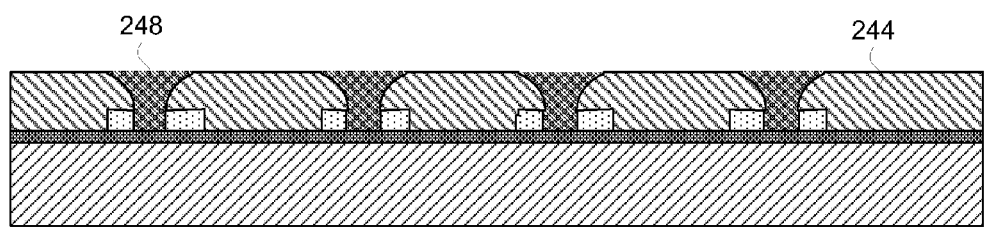

FIG. 9E depicts a state of the process after a desired amount of mushrooming has occurred (i.e. spillover of deposited conductive sacrificial material onto the dielectric photoresist plugs) and as RIE exposure 246 has isotropically etched through the photoresist plugs to vertically create an opening extending from plating base 232 through the dielectric and sacrificial materials. These openings and surrounding conductive and sacrificial materials form molds in which probe tip material may be deposited. The probe tip material may consist of a single material 248 (see FIG. 9F) that fills openings 250*a*–250*d*, or alternatively may be a relatively thin coating of a desired material that is backed by a secondary tip material (not shown). If necessary, after deposition of probe tip material 248 the surface of the sacrificial and probe tip materials may be planarized to yield the configuration shown in FIG. 9F.

Figure 9G:
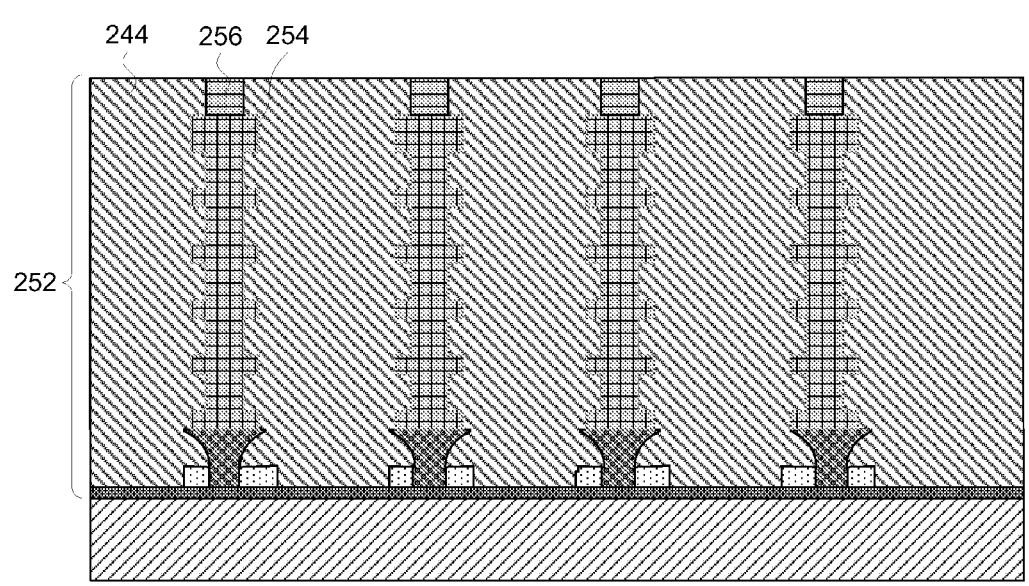

FIG. 9G depicts a state of the process after a plurality of electrochemically fabricated layers complete formation of probe elements 252 out of a structural material 254 and sacrificial material 244 and after deposition of an adhesion or bonding material 256 has occurred.

As with the previously discussed embodiments probe elements may individually or in desired array patterns be diced from one another, temporary substrate material may be removed, seed layer material may be removed, remaining photoresist material may be removed and probe elements 252 may be bonded to a desired substrate via bonding or adhesion material 256.

Figure 10A:
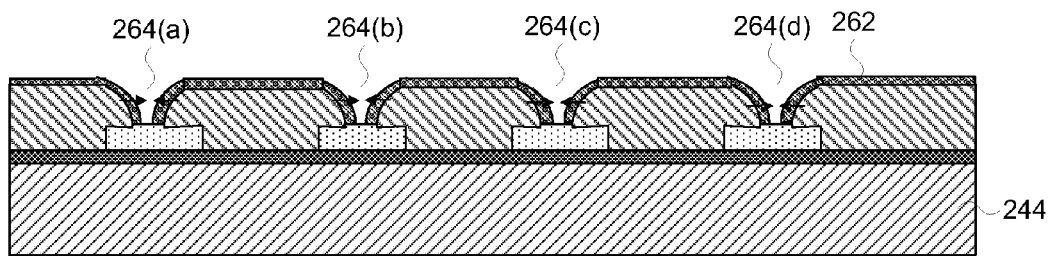
FIGS. 10A–10C schematically depict side views at various stages of a process for forming an array of probe elements according to a sixth embodiment of the invention where the probe element tips are formed using protrusions of a patterned photoresist material over which an electroplated material is made to mushroom.
Figure 10B:
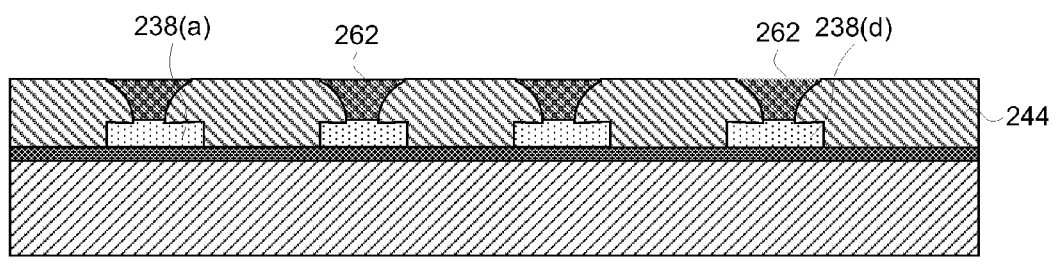
Figure 10C:
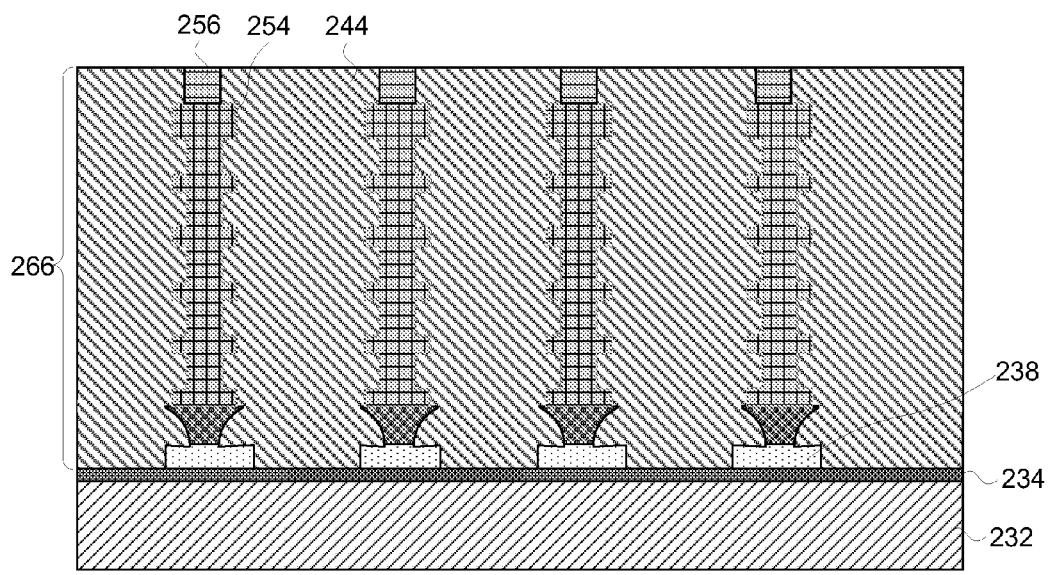

FIGS. 10A–10C schematically depict side views at various stages of a process for forming an array of probe elements according to a sixth embodiment of the invention where the probe element tips are formed using protrusions of a patterned photoresist material over which an electroplated material is made to mushroom. The embodiments of FIGS. 10A–10C are similar to that of FIGS. 9A–9G with the exception that the photoresist material over which mushrooming of sacrificial material occurs is not etched though.

FIG. 10A depicts a state of the process after a probe tip material 262 begins to fill voids 264a to 264d but horizontal growth of the deposit from the sides of sacrificial material 244.

FIG. 10B depicts a state of the process after openings 264a–264d have been filled with tip probe material 262 and after planarization has removed portions of material 262 that bridged over sacrificial material 244 and connected individual probe tip elements together.

FIG. 10C depicts a state of the process after probe elements 266 have been completed by the electrochemical fabrication of a plurality of layers of structural material 254 and sacrificial material 244 and after a bonding or adhesion material 256 has been deposited. As with the embodiment of FIGS. 9A–9G probe elements 266 may be adhered to a desired substrate via bonding material 256 and sacrificial material 244 may be removed along with photoresist material 238, seed layer material 234, and temporary substrate 232 to yield a plurality of independent probe elements connected to a substrate with desired conductive interconnects and the like.

FIGS. 11A–11F schematically depict partially transparent, perspective views, side views along a central cut plane, and top views at various stages of a process for forming an array of probe tips according to a seventh embodiment of the invention where the probe tips are formed using a mold formed from a patterned deposition that forms multiple voids (one per tip) followed by a blanket deposition that narrows the voids and gives them a desired shape.

FIG. 11A depicts three views of the state of the process after a substrate is supplied. View 302-1 provides a perspective view of the substrate. View 302-2 provides a side view of the substrate along the X-axis while view 302-3 provides a top view of the substrate in the X-Y plane. Substrate 302 is a temporary substrate and may be made from a conductive material or a dielectric material having a seed layer formed thereon.

FIG. 11B depicts three views of the substrate after a patterned deposition of a sacrificial material (e.g. copper) has been patterned thereon. Sacrificial material 304 is patterned to contain two voids 306-1 and 306-2. These voids represent locations where probe tips will be located and in this illustration, only two probe tips will be formed. Of course, this process may be used to form a single probe tip or used to form arrays of probe tips including tens, hundreds, or even thousands of elements. As with FIG. 11A the various views of FIG. 11B are shown in conjunction with coordinate axis symbols which indicate the perspective from which the view is taken.

FIG. 11C depicts three views of the state of the process after a blanket deposition of a sacrificial material 308 occurs. Material 308 may or may not be the same material as sacrificial material 304. The blanket deposition of material 306 results in a filling in and a closing up of the voids 306-1 and 306-2 from the initial deposition of material 304. The closing up of the voids results in sloped walls of material 308 surrounding unfilled portions of voids 306-1 and 306-2. Filling in of void 306-1 occurs up to a position indicated by 312-1 while the filling in of void 306-2 occurs up to a line element 312-2. The shape of the unfilled portion of the voids depends on the initial debt and configuration of original voids 306-1 and 306-2.

Figures 11D, 11E:
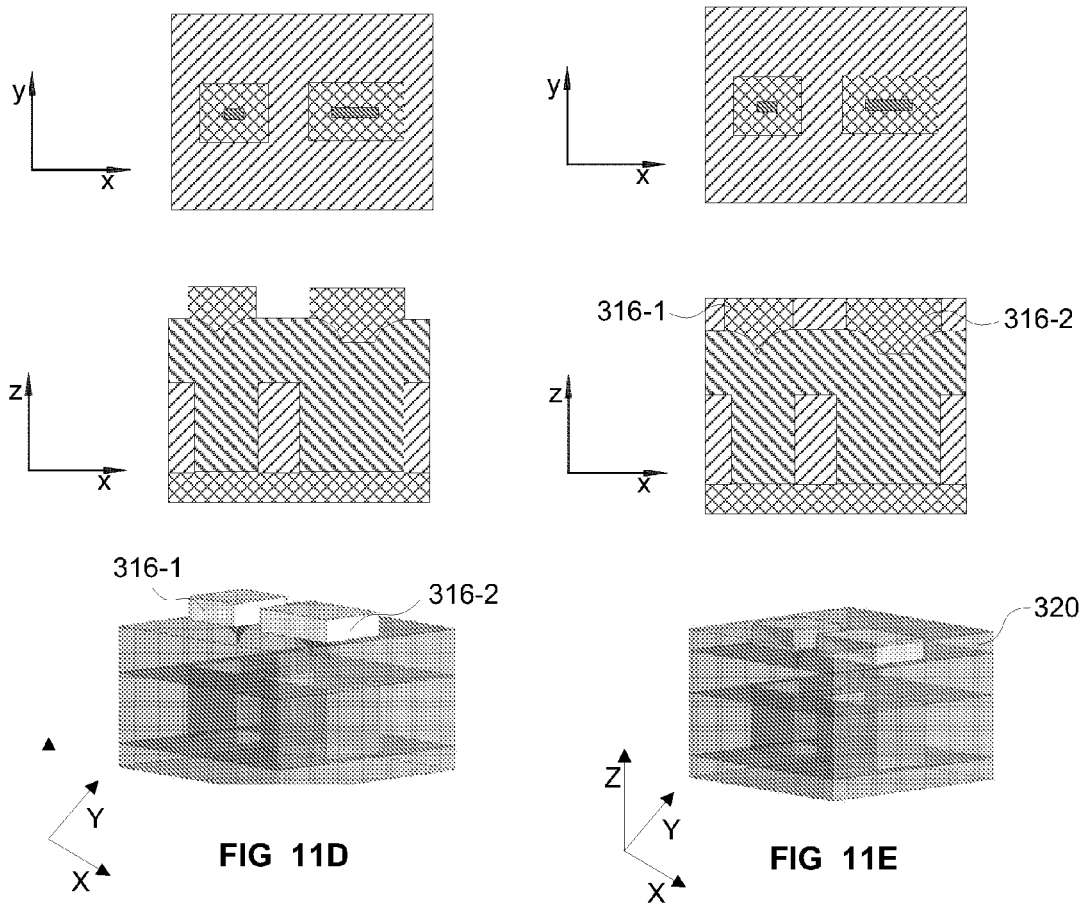

FIG. 11D provides three views of the state of the process after sacrificial material (i.e. nickel) deposition occurs and after a planarization operation occurs and after removal of any masking material associated with the patterned deposition occurs. The blanket deposit of material 306 as indicated in FIG. 11C provided desired void configurations 314-2 and 314-1 which possessed shapes complimentary to the desired shapes of probe tip elements to be formed. The operations leading to FIG. 11D result in creation of probe tip elements 316-1 and 316-2.

FIG. 11E depicts three views of the state of the process after deposition of another sacrificial material 320 occurs and after planarization of the resulting deposits occurs. Sacrificial material 320 may be identical to sacrificial materials 308 and 304 or may be different from one or both of them. The performance of the deposition and planarization operation of FIG. 11E is based on the assumption that layers of structural material forming probe elements will be added to the tips as was indicated in the various previous embodiments set forth herein. If no such addition was to occur, the operations leading to FIG. 11E need not have occurred.

Figure 11F:
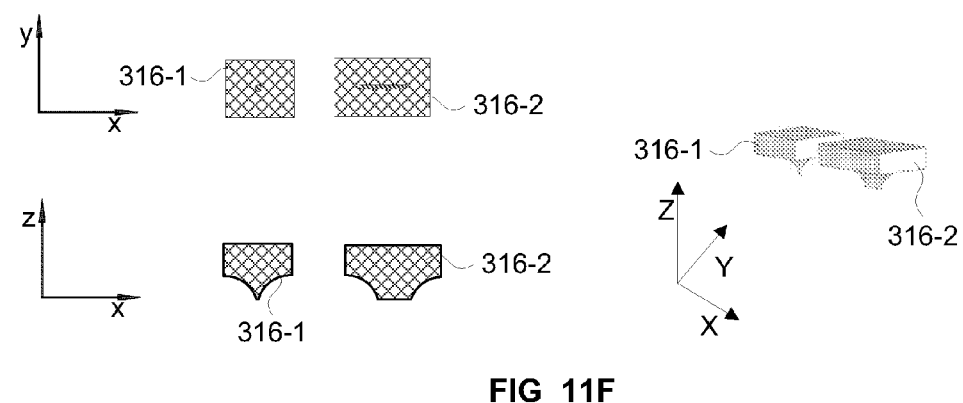

FIG. 11F shows three views of the state of the process after each of the sacrificial materials and the substrate have been removed and under the assumption that no additional layers of structure (e.g. of probe elements) have occurred.

The seventh embodiment of the invention as illustrated in FIGS. 11A–11F may be considered to include the following major operations: (1) Supply a substrate. (2) Pattern deposit a first sacrificial material onto the substrate leaving openings or voids in the sacrificial material in locations which will give rise to probe tip elements. The patterning of the sacrificial material may occur in a variety of ways, for example, it may occur by first locating and patterning a masking material onto the surface of the substrate and thereafter plating the sacrificial material onto exposed regions of the substrate. Alternatively, a blanket deposition of a sacrificial material may occur followed by patterned masking and selective etching. In a further alternative, direct deposition of the sacrificial material may occur, for example, by ink jet printing or the like. (3) Blanket deposit a second sacrificial material which may be identical to the first sacrificial material to build up the second sacrificial material over regions of the first sacrificial material and to partially fill in voids in the first sacrificial material such that voids of desired configuration occur in the second sacrificial material which take on a shape complimentary to that of the probe tip elements to be formed. (4) Pattern deposit a structural material into the voids formed in the second sacrificial material and potentially to form structures of desired configuration above the second sacrificial material. The patterned deposition of the structural material may occur in a variety of manners, for example, it may occur by locating and patterning a mask material over those portions of the second sacrificial material not to receive structural material. (5) The surface of the structural material and the masking material may optionally be planarized at a desired height. (6) Assuming that additional layers of material are to be added, deposition of a third sacrificial material may occur. The third sacrificial material may be the same as or different form either one or both of the first and second sacrificial materials. The deposition of the third sacrificial material may occur in a blanket or patterned manner. (7) The surface of the deposited materials may next be planarized if needed so that both sacrificial and structural materials are exposed and ready for accepting additional material depositions associated with build up of probe elements or the like. (9) Build up layers of the structure as desired for example using electrofabrication techniques as disclosed elsewhere herein. (10) Remove the sacrificial material to release the probe tips and other elements of the probe structures. Such-release may occur before or after bonding of the probe elements to a new substrate.

Various alternatives to this seventh embodiment are possible. For example, after the patterned deposition operation of the first sacrificial material and prior to any removal of associated masking material the surface of the sacrificial material may be planarized so as to give a controlled surface as a starting point for subsequent operations.

In another variation of the embodiment, after the blanket deposition operation of the second sacrificial material a flash or quick etching operation or series of etching and deposition operations may occur to smooth out any irregularities in the surface of the second sacrificial material and particularly any irregularities the void regions of the second sacrificial material which will be used for molding probe tip elements.

In addition or alternatively, after deposition of the second sacrificial material the voids therein may be filled with a temporary conductive or dielectric material and the surface of the second sacrificial material planarized and thereafter the temporary material removed. This planarization operation may improve the quality of the probe tip elements in regions slightly displaced from tip regions.

In another variation of the present embodiment the deposition of the sacrificial material and the deposition of the structural material may be reversed such that the deposition of the sacrificial material is a patterned deposition while the deposition of the structural material may be a blanket deposition or may continue to be a selective deposition.

The embodiments discussed thus far have contemplated the formation of probe tip elements prior to the formation of the remaining portions of the probe elements themselves. It should be understood that in alternative embodiments it may be possible to form, for example, the arms (i.e. extended portions) of the probe elements and thereafter to form and adhere the tip elements to the arm elements. Several of the embodiments discussed up to this point are susceptible to this reversal in formation order.

FIGS. 12A–12E schematically depicts partially transparent, perspective views at various stages of a process for forming an array of probe tips according to an eighth embodiment of the invention where the probe tips are formed using a partially masked area of structural material or tip material surrounded by a sacrificial material and then etching the structural or tip material relative to the sacrificial material to achieved desired tip configurations.

Figure 12A:
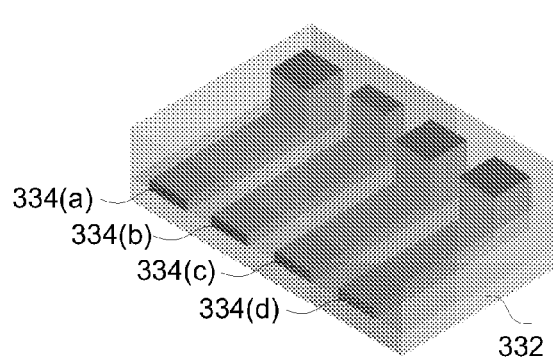
FIGS. 12A–12E schematically depicts partially transparent, perspective views at various stages of a process for forming an array of probe tips according to an eighth embodiment of the invention where the probe tips are formed using a partially masked area of structural material or tip material surrounded by a sacrificial material and then etching the structural or tip material relative to the sacrificial material to achieved desired tip configurations.

FIG. 12A depicts an initiation point for this state of the process where an array of probe elements $334a$–$334d$ have been formed on a substrate 332 and are encapsulated (with the exception of an upper surface) with a sacrificial material 336. In some variations of this embodiment the substrate may be a temporary substrate while in other variations it may be a permanent substrate.

Figure 12B:
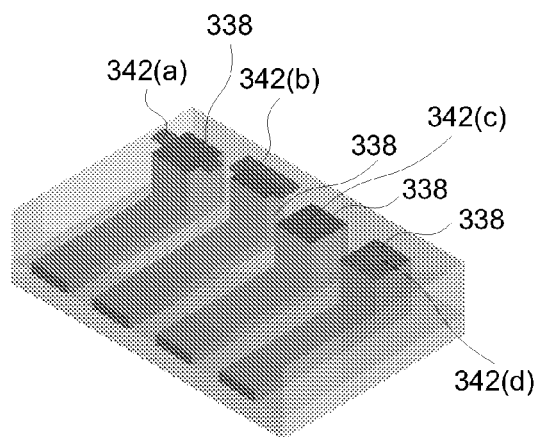

FIG. 12B depicts a state of the process after a masking material of desired configuration has been located over regions of the structural material 338 from which at least the tips of elements $334a$–$334d$ were formed. The masking may take on a variety of patterns. For example, as indicated by element $342a$ the masking material may be centered relative to the last layer of material 338 of one of the probes, it may be offset toward one side or the front or back of one of the probe elements as indicated by $342b$, it may be a circular patch centered over the tip material as indicated by $342c$, or it may be a square patch located over the tip material as indicated by $342d$.

Figure 12C:
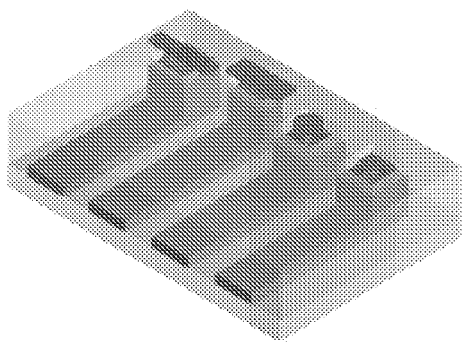

FIG. 12C depicts a state of the process after a selective etching operation (e.g. a wet etch of nickel) is allowed to operate on the structural material in the unmasked regions.

Figure 12D:
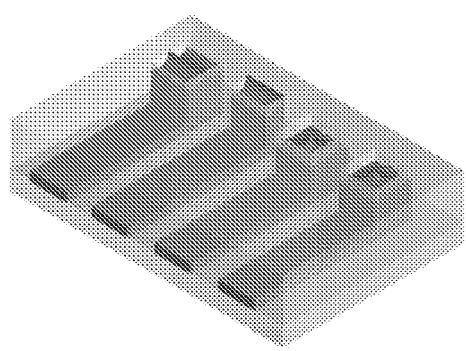

FIG. 12D depicts a state of the process after mask material overlaying the etched structural material has been removed.

Figure 12E:
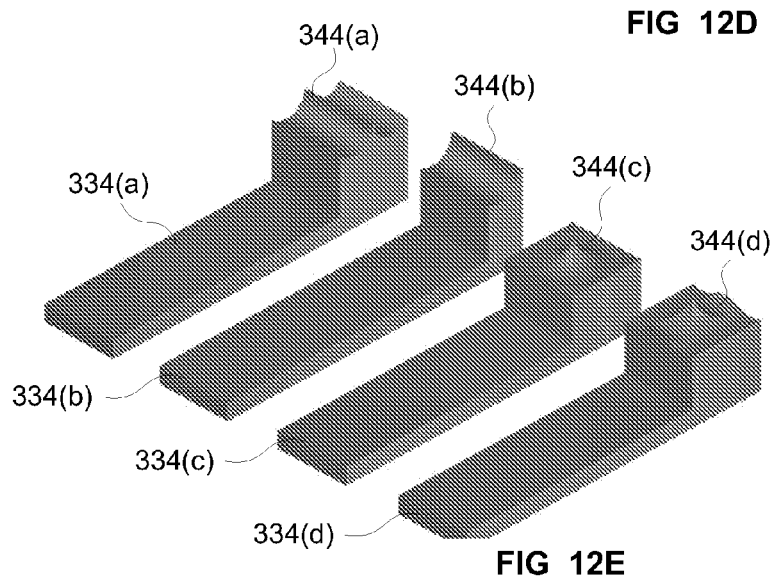

FIG. 12E depicts a state of the process after the substrate and sacrificial material have been removed leaving elements $334a$–$334d$ with tips structures $344a$–$344d$ which resulted form the relationship between the mask size, its location and the size of the structural material exposed to the etchant.

In this embodiment the probe elements took the form of lever arm structures as opposed to the form of vertically elongated structures as presented in some of the previous embodiments. It will be understood by those of skill in the art that the probe structures may be utilized in conjunction with the probe tip creation technique of the present embodiments or may be of the indicated form or of the form presented in the previous embodiments. Similarly it will be understood by those of skill in the art that the probe tip creation techniques of those embodiments mat be combined with the formation of the cantilever type structures of the present embodiment. It will be understood by those of skill in the art that probe tip materials may be different from the materials used to form the rest of the probe elements or they may be of the same material. It will also be understood by those of skill in the art that contact materials associated with probe elements may be different form the probe tip materials themselves. Such contact materials may be applied after tip formation, for example, by a selected electrochemical deposition process or sputtering process or the like. Alternatively contact materials may be deposited during operations for the tip structure itself. It will also be understood by those of skill in the art that according to the present embodiment different probe tips in a probe tip array may have similar tip configurations or alternatively they may have different configurations depending on how they were formed and how it is intended that they will be used.

Figure 13A:
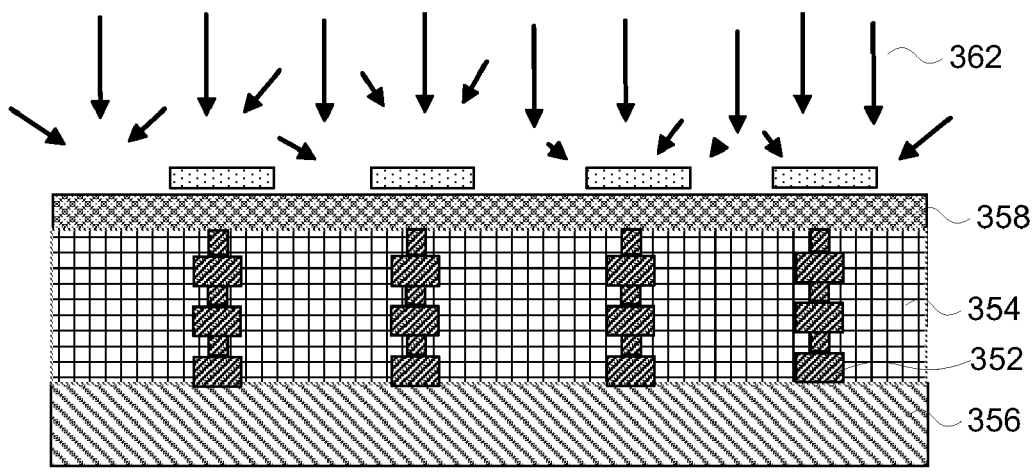
FIGS. 13A–13C schematically depict side views at various stages of a process for forming an array of probe elements according to a ninth embodiment of the invention where the probe tips are formed after forming the other portions of elements by placing patterned masking material over a tip material and etching away the tip material in the exposed regions leaving behind tip elements located on previously formed portions of the elements.
Figure 13B:
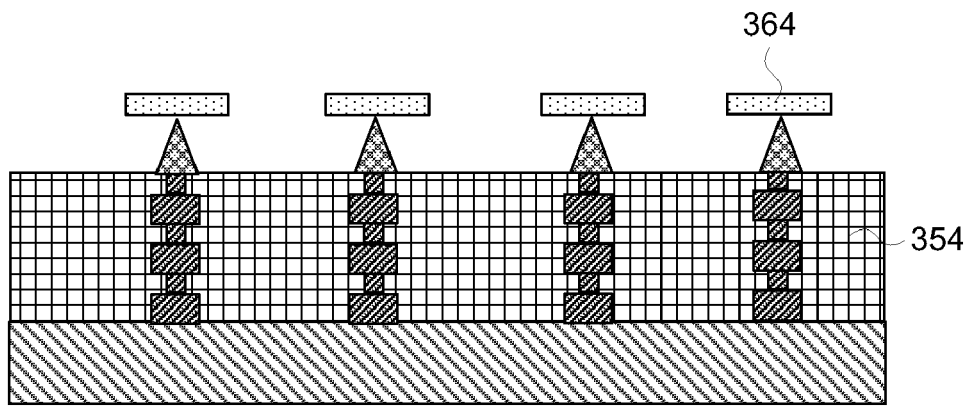
Figure 13C:
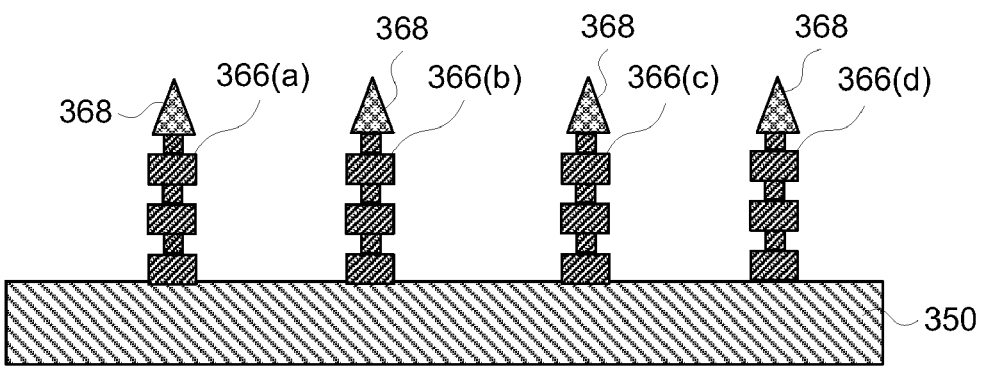

FIGS. 13A–13C schematically depict side views at various stages of a process for forming an array of probe elements according to a ninth embodiment of the invention where the probe tips are formed after forming the other portions of elements by placing patterned masking material over a tip material and etching away the tip material in the exposed regions leaving behind tip elements located on previously formed portions of the elements.

FIG. 13A depicts a state of the process after a plurality of probe elements have been formed from a plurality of stacked and adhered layers of structural material 352 and sacrificial material 354. These layers were formed on a substrate 356 which may be a temporary substrate or a permanent substrate. The final layer of the built up probe elements are covered with a layer of probe tip material 358 which are in turn overlaid with a masking material which has been patterned to locate plugs of the masking material over locations where probe tip elements are to exist. The size and shape of the plugs of masking material will dictate the resulting tip configuration after an etchant 362 isotropically etches the probe tip material.

FIG. 13B depicts a state of the process after etching has been completed and probe tip material is etched and the sacrificial material is exposed. The shadowing from the masking material provides for a tapered etching of the covered tip material and thus results in probe tips of a desired configuration. In variations to the present embodiment, multiple masking operations and etching operations may be used to further tailor the final shape of the probe tips.

FIG. 13C depicts a state of the process after sacrificial material 354 has been removed which yields the array of probe elements 366a–366d adhered to substrate 356 and including tips 368 of desired configuration.

FIGS. 14A–14D schematically depict side views at various stages of a process for forming an embossing tool for forming probe tips with all array elements present and having a first tip configuration.

Figure 14A:
FIGS. 14A–14D schematically depict side views at various stages of a process for forming an embossing tool for forming probe tips with all array elements present and having a first tip configuration.
Figure 14B:
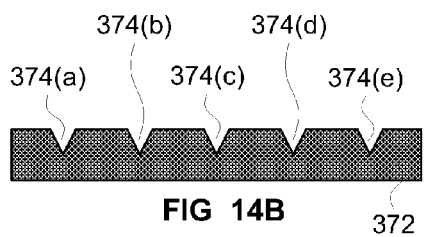

FIG. 14A depicts a state of the process after a desired substrate material 372 is supplied while FIG. 14B depicts a state of the process after selective etching of substrate material 372 results in voids 374a–374e being formed. The etching that occurred to yield the voids of 374a–374e may have been implemented via the location and patterning of a mask material onto the surface of substrate 372. Substrate 372 may for example be silicon and the etchant may be, for example, KOH.

Figure 14C:
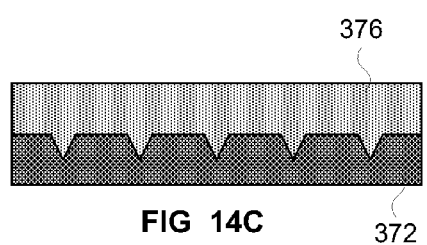

FIG. 14C depicts a state of the process after a mold material (e.g. epoxy material) 376 has been cast over the patterned surface of substrate 372.

Figure 14D:
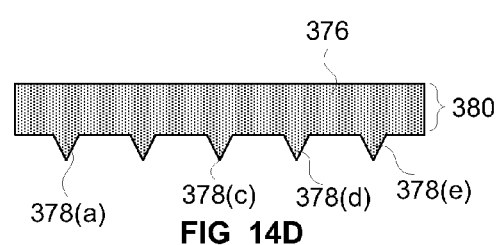

FIG. 14D depicts a state of the process after mold material 376 has solidified and has been separated from the patterned substrate 372. The spacing of protrusions 378a–378e on tool 380 corresponds to locations where probe tip elements are to be formed, for example, as will be described in the embodiment of FIG. 16.

FIGS. 15A–15D schematically depict side views at various stages of a process for forming an embossing tool for forming probe tips with only a portion of the array elements present and having a second tip configuration.

FIGS. 15A–15D illustrate states of the process which are analogous to those illustrated in FIGS. 14A–14B with the exception that voids 384c and 384d are etched so as to have a different configuration than voids 374c and 374d, and where no voids in substrate 382 are formed which correspond to locations of voids 374a, 374b and 374e of FIG. 14B. As such, after completion of tool 390 from solidified molding material 386 the tool only contains protrusions 378c and 378d.

Figure 15A:
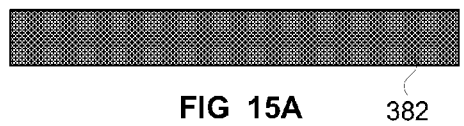
FIGS. 15A–15D schematically depict side views at various stages of a process for forming an embossing tool for forming probe tips with only a portion of the array elements present and having a second tip configuration.
Figure 15B:
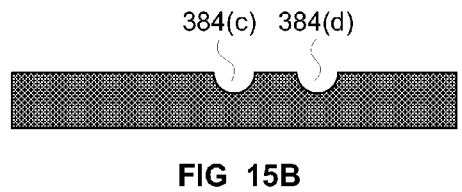
Figure 15C:
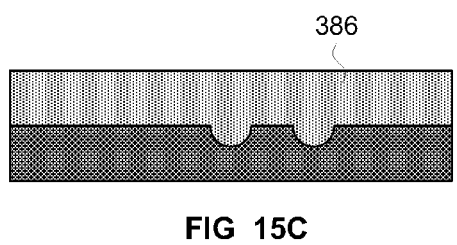
Figure 15D:
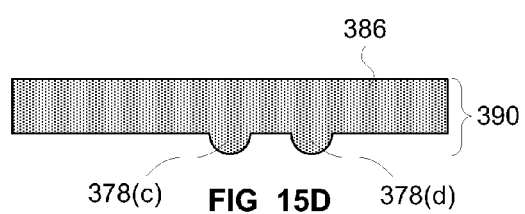

In comparing the tools of FIG.15D and FIG.14D it may be considered that the tool of FIG. 15B includes only a portion of the possible protruding elements necessary to form a complete array of probe tips whereas the protrusions of FIG. 14D may be used to form a complete array. As will be understood after reviewing the next embodiments, each of these tools may have use in forming probe element arrays with tips of desired configuration.

FIGS. 16A–16M schematically depict side views at various stages of a process for forming an array of probe elements according to a tenth embodiment of the invention where the probe element tips are formed using the embossing tool produced according to FIGS. 14A–14D.

Figure 16A:
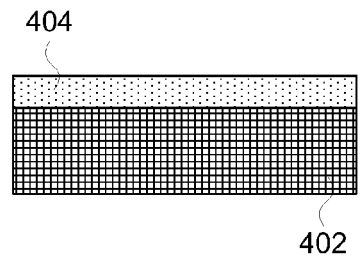
FIGS. 16A–16M schematically depict side views at various stages of a process for forming an array of probe elements according to a tenth embodiment of the invention where the probe element tips are formed using the embossing tool produced according to FIGS. 14A–14D.

FIG. 16A depicts a state of the process after a substrate 402 is coated with a photoresist or other polymeric material 404.

Figure 16B:
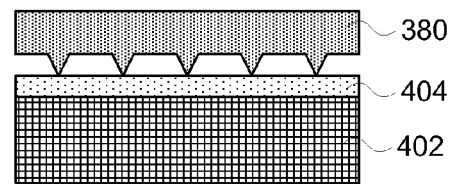
Figure 16C:
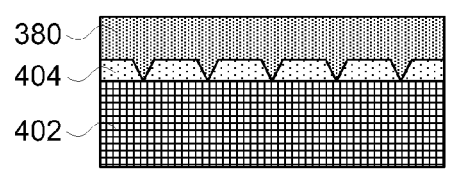

FIG. 16B depicts a state of the process after embossing tool 380 has been placed against polymeric material 404 while FIG. 16C depicts a state of the process after embossing tool 380 is made to emboss polymeric material 404.

Figure 16D:
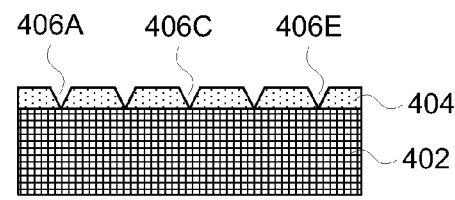

FIG. 16D depicts a state of the process after tool 380 has been removed leaving behind substrate 402 with polymeric material 404 located thereon and with voids 406a–406e located in the polymeric material.

Figure 16E:
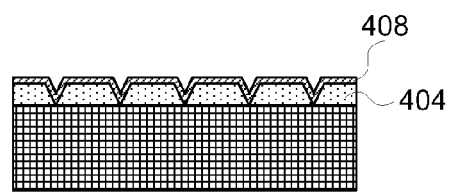

FIG. 16E depicts a state of the process after a seed layer material 408 is coated over the patterned polymeric material 404. The seed layer material may be of any appropriate sacrificial material that may be separated from a probe tip material without damaging it. For example, the seed layer material may be sputtered copper, tin, gold or the like. Prior to formation of the seed layer, if necessary, an adhesion layer may be located onto the surface of the patterned polymeric material.

Figure 16F:
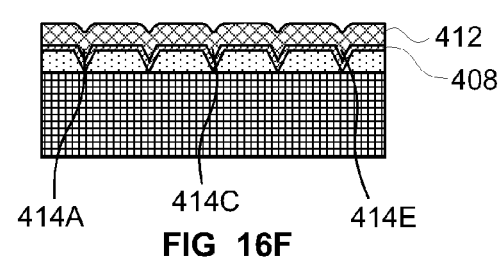

FIG. 16F depicts a state of the process after a probe tip material 412 has been plated over plating base 408. As indicated in FIG. 16F the deposition of probe tip material 412 occurs in a blanket fashion. In variations of this embodiment, probe tip material may be deposited in a selected manner such that regions between probe tip locations 414a–414e would not receive probe tip material.

In such variations masking material associated with the selective deposition may be removed and a sacrificial material deposited (which may be the same as the seed layer material) and then the sacrificial material and probe tip material planarized to a desired level on which layers of structure may be formed.

Alternatively, prior to removal of the masking material, planarization of the combined masking material and probe tip material may occur. The masking material may then be removed and then sacrificial material added and another planarization operation implemented if desired.

Figure 16G:
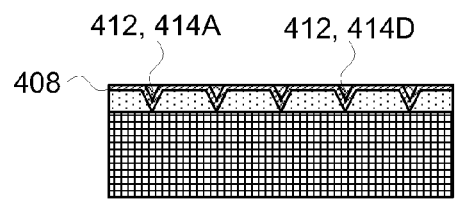
Figure 16H:
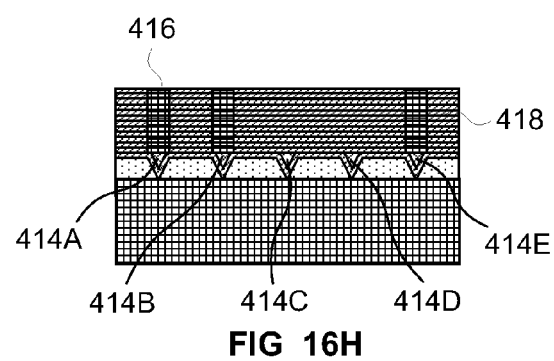

FIG. 16G depicts a state of the process after a planarization operation trims the height of probe tip material and sacrificial material (e.g. seed layer material) to a common level such that probe tip material is removed from regions that separate desired probe tip locations. In achieving the result depicted in FIG. 16G it is assumed that the initial seed layer thickness was sufficient to allow the planarization operation to occur. If this was not the case one of the alternative embodiments mentioned above in association with FIG. 16F could be implemented, FIG. 16H depicts a state of the process after a plurality of layers of structural material 416 and sacrificial material 418 have been deposited to build up the structure of the probe elements. The structural material may, for example, be nickel or nickel-cobalt, and the probe tip material may be, for example, rhodium, or rhenium, while the sacrificial material may, for example, be copper or tin. As indicated in FIG. 16H though all probe element tips in the array were formed not all associated probe element structures were formed. In particular probe tips 414a, 414b and 414e have associated elements of probe structure formed while probe tips 414c and 414d do not. During a subsequent operation of the process probe tips 414c and 414d will be removed from the probe array.

In an alternative embodiment instead of forming probe tip elements 414c and 414d those probe tip locations may simply have been masked prior to deposit of probe tip material.

Figure 16I:
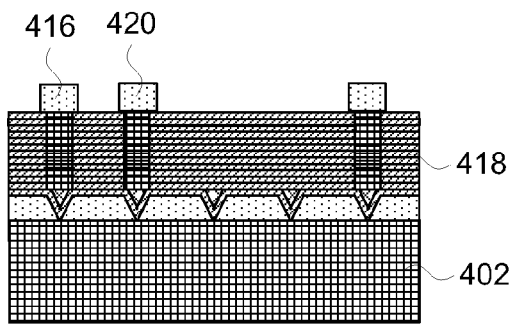

FIG. 16I depicts a state of the process after an adhesion or bonding material has been selectively deposited onto the distal end of the probe structures.

Figure 16J:
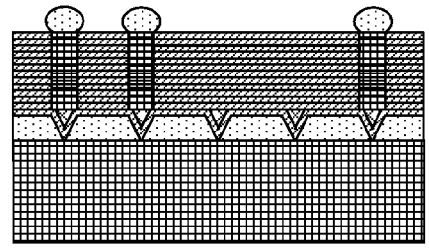

FIG. 16J depicts a state of the process after adhesion material has been reflowed to give it a rounded or ball like configuration.

Figure 16K:
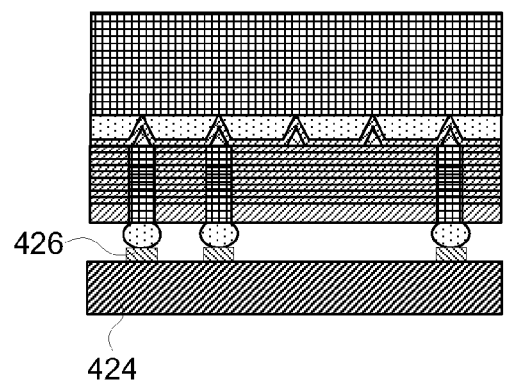

FIG. 16K shows the state of the process after unreleased probe structures have been inverted and contacted to a permanent substrate 424 which includes regions of a second adhesion material 426 that correspond to locations of adhesion material 420.

Figure 16L:
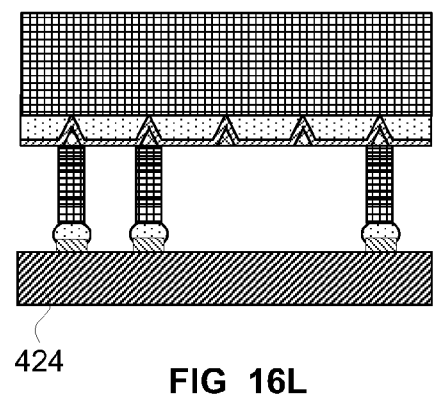

FIG. 16L depicts a state of the process after bonding of the probe structures and the permanent substrate occur and sacrificial material 418 is removed.

Figure 16M:
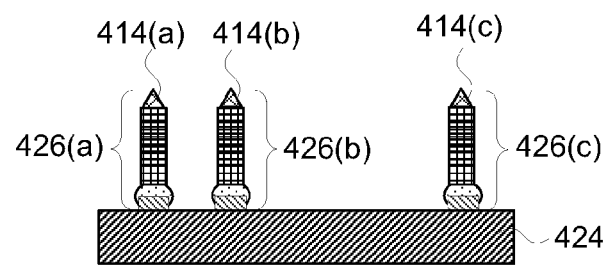

FIG. 16M depicts the state of the process after probe tips 414a, 414b and 414d have been released from the seed layer material, polymeric material and substrate 402 to yield completed probes 426a, 426b and 426e on the permanent substrate 424.

FIGS. 17A–17L schematically depict side views at various stages of a process for forming an array of probe elements according to an eleventh embodiment of the invention where the probe element tips are formed using the embossing tool produced according to FIGS. 14A–14D, where the embossed material is conductive, and where selected probe elements are not formed.

The process of FIGS. 17A–17L is similar to that of FIGS. 16A–16M with the exception that the seed layer of FIG. 16E is not necessary (as the material to be embossed is a conductor such as tin in this embodiment).

Figure 17A:
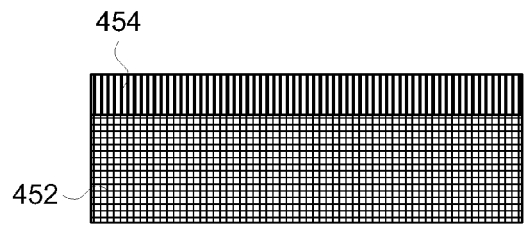
FIGS. 17A–17L schematically depict side views at various stages of a process for forming an array of probe elements according to an eleventh embodiment of the invention where the probe element tips are formed using the embossing tool produced according to FIGS. 14A–14D, where the embossed material is conductive, and where selected probe elements are not formed.

FIG. 17A depicts a state of the process after a temporary substrate 452 is provided with a planarized coating of a conductive sacrificial material 454 located thereon. Sacrificial material 454 may be any appropriate material that may be removed from a probe tip material without damaging the tips and possibly removed from a material of substrate 452.

In some variations of this embodiment the sacrificial material 454 and the material substrate 452 may be one and the same material.

Figure 17B:
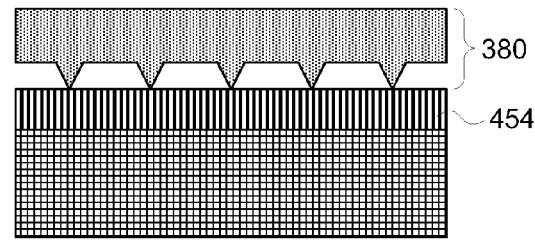

FIG. 17B depicts a state of the process after embossing tool 380 is brought into initial contact with sacrificial material 454.

Figure 17C:
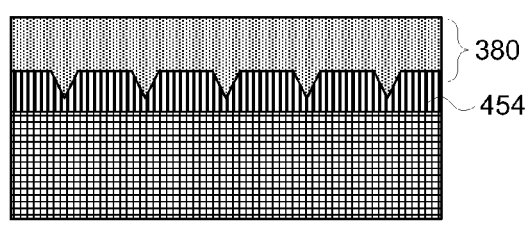

FIG. 17C depicts a state of the process after embossing tool 380 has been made to penetrate into sacrificial material 454. This may be done, for example, by heating the embossing tool and/or the sacrificial material such that in locations where contact is made the sacrificial material is flowable and can be flowed or otherwise reshaped to take the form dictated by the patterning on tool 380.

Figure 17D:
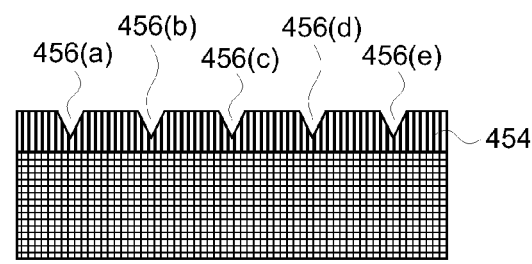

FIG. 17D depicts a state of the process after embossing tool 380 has been removed from embossed sacrificial material 454 leaving behind voids 456a–456e corresponding to locations where probe tips may exist in a probe tip array that is to be formed.

Figure 17E:
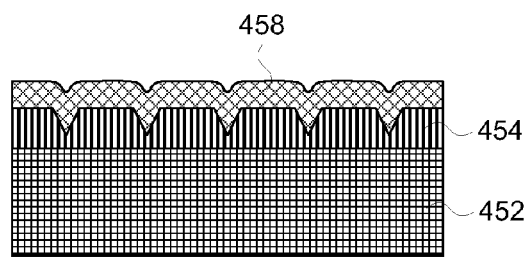

FIG. 17E depicts a state of the process after a probe tip material 458 is deposited over the patterned surface of sacrificial material 454.

Figure 17F:
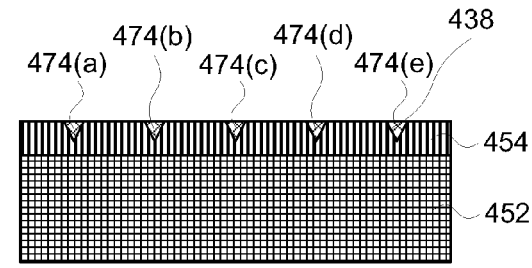

FIG. 17F depicts a state of the process after the sacrificial material and probe tip material have been planarized to a common level.

Figure 17G:
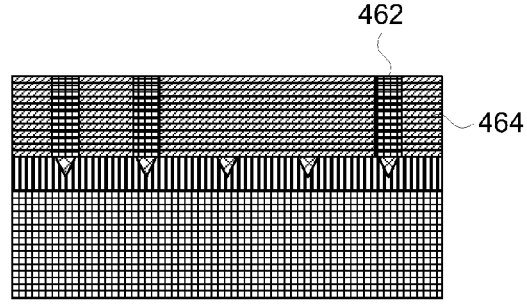

FIG. 17G depicts a state of the process after formation of probe elements has been completed as the result of the electrodeposition of a plurality of layers where each layer contains regions of structural material 462, corresponding to locations of probe elements, and sacrificial material 464. Sacrificial material 464 may be the same or different from sacrificial material 454.

Figure 17H:
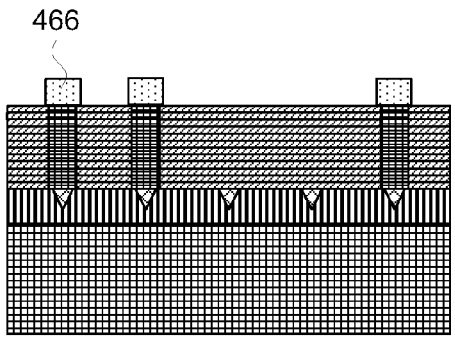

FIG. 17H depicts a state of the process after an adhesion material or bonding material 466 has been pattern deposited onto the uppermost surface of the probe structures.

Figure 17I:
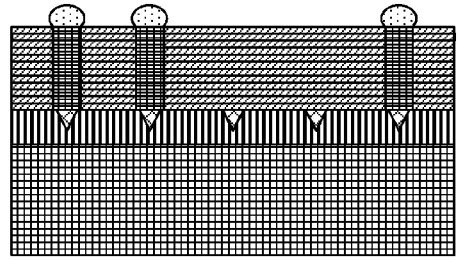

FIG. 17I depicts a state of the process after adhesion material 466 has been reflowed to give it a rounded or bubbled up shape as shown in FIG. 17I.

Figure 17J:
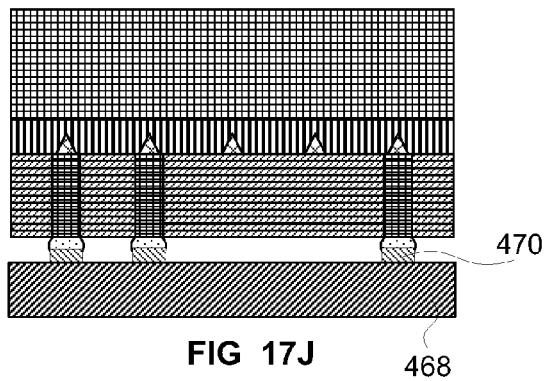

FIG. 17J depicts a state of the process after unreleased probe structures have been inverted and bonded to a permanent substrate 468 which includes regions of a second adhesion material 470 which correspond to regions of the first adhesion material 466 located on the electrochemically fabricated layers of structure making up the probe elements.

Figure 17K:
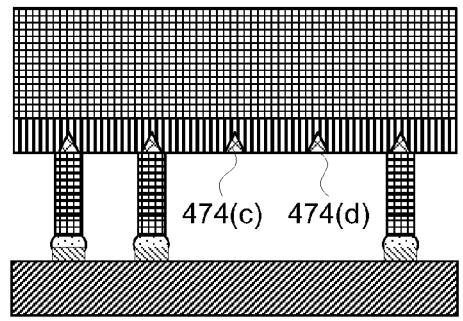

FIG. 17K depicts a state of the process after sacrificial material 464 has been removed.

Figure 17L:
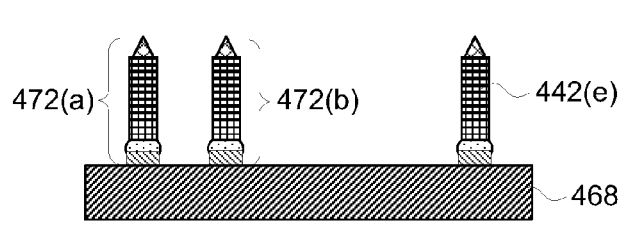

FIG. 17L depicts a state of the process after the original substrate 452 and sacrificial material 454 have been removed thereby yielding released probe structures 472a, 472b and 472e which are bonded to permanent substrate 468. As indicated in FIG. 17G probe tip regions 474a, 474b and 474e had structural material corresponding to probe elements adhered thereto whereas probe tip elements 474c and 474d did not.

As such, after the final separation of sacrificial material 454 and substrate 452 from the probe elements bonded to substrate 468, tip elements 474c and 474d were removed.

FIGS. 18A–18J schematically depict side views at various stages of a process for forming an array of probe elements according to a twelfth embodiment of the invention where the probe element tips are formed using the embossing tool produced according to FIGS. 14A–14D and where selected probe elements and probe tips are not formed.

Figure 18A:
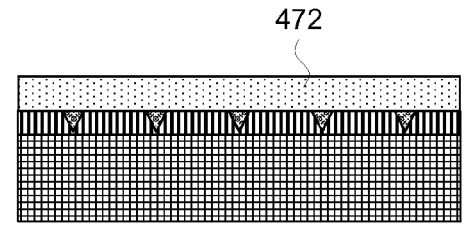
FIGS. 18A–18J schematically depict side views at various stages of a process for forming an array of probe elements according to a twelfth embodiment of the invention where the probe element tips are formed using the embossing tool produced according to FIGS. 14A–14D and where selected probe elements and probe tips are not formed.

FIG. 18A begins with a structure similar to that shown in FIG. 17F along with a masking material 472 located above the probe tip elements.

Figure 18B:
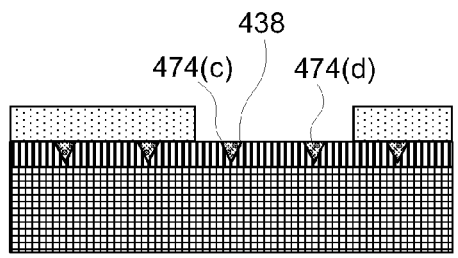

FIG. 18B depicts a state of the process after patterning of the masking material results in an opening or openings above probe elements 474c and 474d that are to be removed.

Figure 18C:
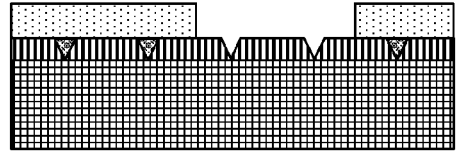

FIG. 18C depicts a state of the process after a selective etching operation removes probe tip material 438 from probe tip locations 474c and 474d.

Figure 18D:
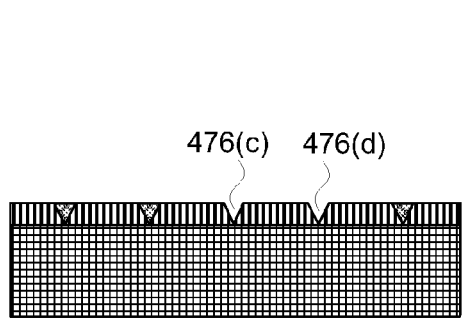

FIG. 18D depicts a state of the process after masking material 472 has been removed.

Figure 18E:
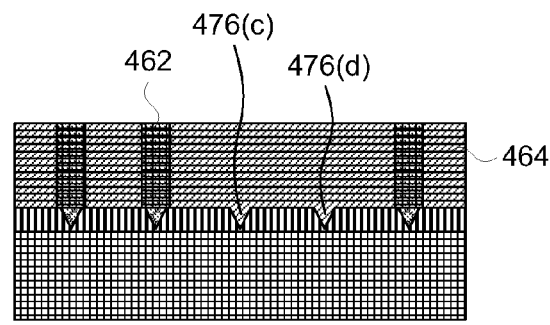
Figure 18F:
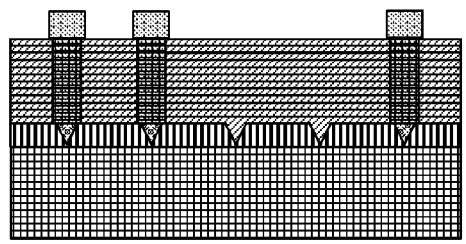
Figure 18G:
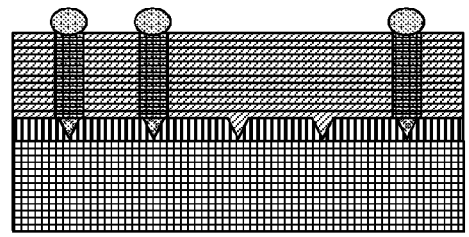
Figure 18H:
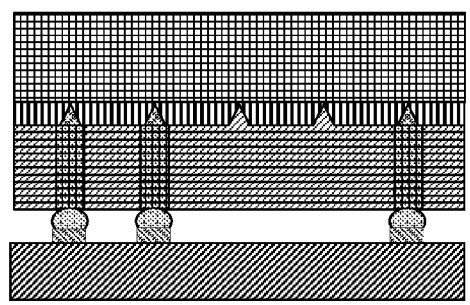
Figure 18I:
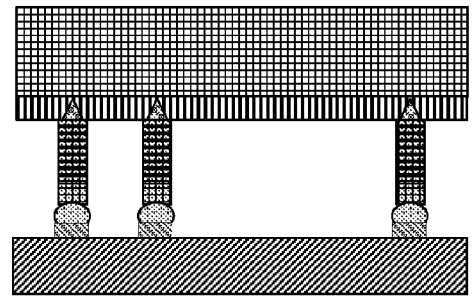
Figure 18J:
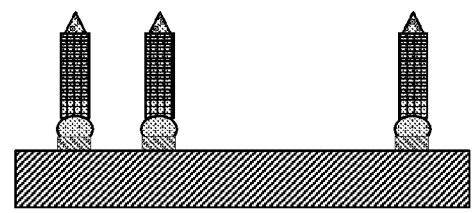

FIG. 18E depicts a state of the process after electrochemical fabrication of a plurality of layers occurs above the probe tip elements. In particular a structural material 462 is deposited along with a sacrificial material 464. In the process of forming the first electrochemically fabricated layer sacrificial material 464 is made to fill in voids 476c and 476d.

FIGS. 18F–18J are similar to FIGS. 17H–17L and thus will not be discussed in detail at this time with the exception of noting that upon final release there are no probe tip elements 474c or 474d that need to be removed.

Figure 19A:
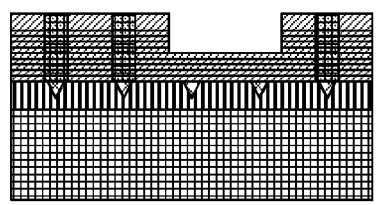
FIGS. 19A–19N schematically depict side views at various stages of a process for forming an array of probe elements according to a thirteenth embodiment of the invention where some probe elements have different heights and different tip configurations and where the probe tip elements are formed using the embossing tools produced according to FIGS. 14A–14D and FIGS. 15A–15D.
Figure 19B:
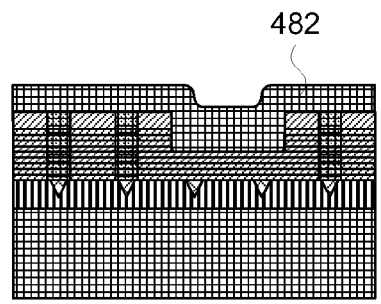
Figure 19C:
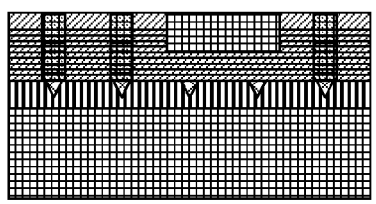
Figure 19D:
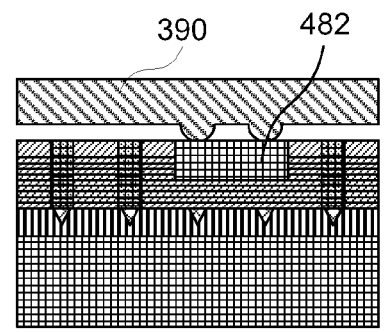
Figure 19E:
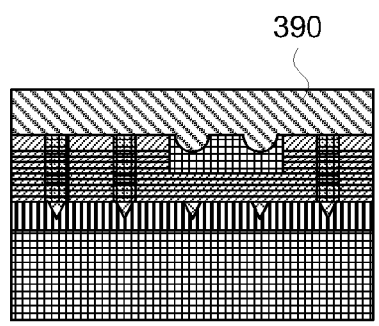
Figure 19F:
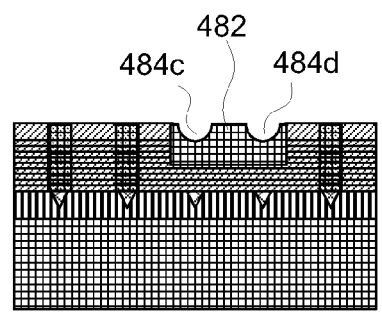
Figure 19G:
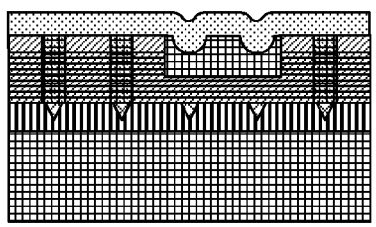
Figure 19H:
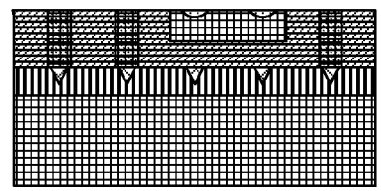
Figure 19I:
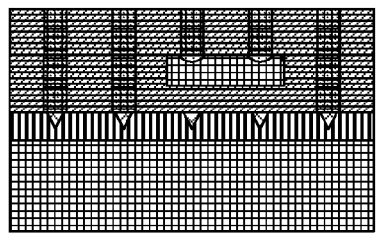
Figure 19J:
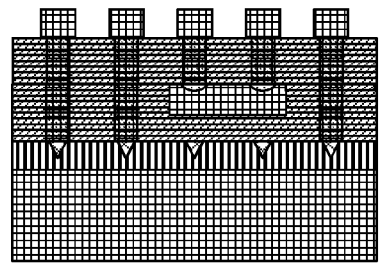
Figure 19K:
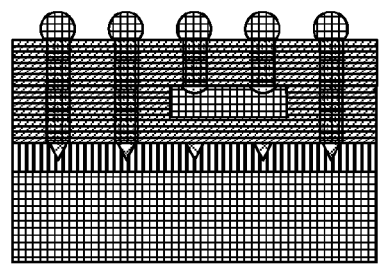
Figure 19L:
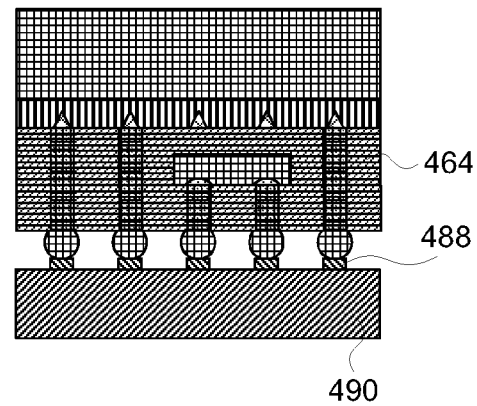
Figure 19M:
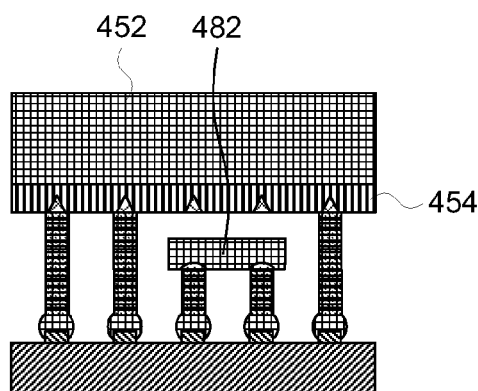
Figure 19N:
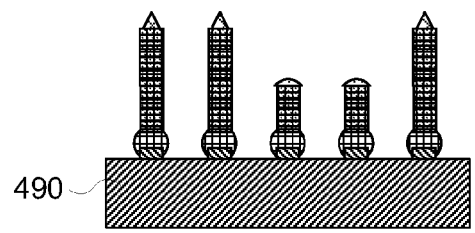

FIGS. 19A–19N schematically depict side views at various stages of a process for forming an array of probe elements according to a thirteenth embodiment of the invention where some probe elements have different heights and different tip configurations and where the probe tip elements are formed using the embossing tools produced according to FIGS. 14A–14D and FIGS. 15A–15D.

The process of FIGS. 19A–19N begins with the state of the process of forming an array of microstructures as depicted in FIG. 17G.

FIG. 19A depicts a state of the process after an opening has been etched through a number of layers of deposited sacrificial material in the region overlying probe tips 474c and 474d. This etching operation may occur by masking the upper surface of the last formed layer of the structure with a masking material patterning the mask material to have a opening located therein above the regions of probes 474c and 474d and then etching into the sacrificial material and removing the mask.

FIG. 19B depicts a state of the process after an embossable sacrificial material is located in at least the opening etched through the layers of sacrificial material. As shown in FIG. 19B the embossable material 482 is blanket deposited over the previously deposited materials. The embossable material may be tin or indium or the like.

FIG. 19C depicts a state of the process after the deposited embossable material has been planarized to remove it from all locations except where it is filling the opening etched through the sacrificial material.

FIG. 19D depicts a state of the process after embossing tool 390 is located in initial contact with embossable material 482 while FIG. 19E depicts a state of the process after tool 390 has been inserted into an embossed material 482.

FIG. 19F depicts a state of the process after embossing tool 390 has been removed.

FIG. 19G depicts a state of the process after deposition of a desired probe tip material fills holes 484*c* and 484*d* in embossed material 482. The probe tip material may be rhenium or rhodium, for example.

FIG. 19H depicts a state of the process after a planarization operation has trimmed the deposited materials back to a level corresponding to that of the last layer of the structure formed. In variations of this embodiment the last layer of structure formed may have been formed with excess height initially, such that the various planarization operations performed could incrementally trim it down until a desired height is achieved as a result of a processing that led to the state of the process depicted in FIG. 19H.

FIG. 19I depicts a state of the process after a number of additional layers of structure have been formed where these additional layers of structure include regions of structural material corresponding to probe elements and regions of sacrificial material located there between.

FIG. 19J depicts a state of the process after all layers of the structures have been formed and after application of an adhesion or bonding material, for example, tin or tin lead or other solder like material or the like has been selectively deposited over regions of structural material.

FIG. 19K depicts a state of the process after the adhesion material has been reflowed to give it a rounded or bold appearance.

FIG. 19L depicts a state of the process after the probe structures have been inverted and located adjacent to bonding pads 488 located on a permanent substrate 490 (e.g. a space transformer).

FIG. 19M depicts a state of the process after adhesion of the probe elements to the permanent substrate 490 has occurred and after sacrificial material 464 has been removed.

FIG. 19N shows the state of the process after sacrificial material 454, substrate 452, and embossing material 482 have been removed thereby yielding a released probe array attached to permanent substrate 490. As can be seen in the figure, three of the probe elements have pointed tips while the other probe elements have rounded tip configurations. Similarly three of the elements are more elongated in nature then the other two elements.

Those of skill in the art will understand that use of the processes associated with this thirteenth embodiment of the invention can produce probe element arrays with any combination of numbers of probe elements, different tip configurations (whether as a single height or at multiple heights) single or multiple or variable height probe elements and/or probe elements of different structural configurations (e.g. vertical extending spring like elements), and substantially horizontally extending cantilever type elements).

FIGS. 20A–20E schematically depict side views at various stages of a process for forming a probe element according to a fourteenth embodiment of the invention where the probe tip is coated with a desired contact material which is protected from a sacrificial material use in forming the probe element.

The process of FIGS. 20A–20E may be used to form a desired coating material on a probe tip while protecting that probe tip material from attack by a sacrificial material etchant or the like that it may not be compatible with.

Figure 20A:
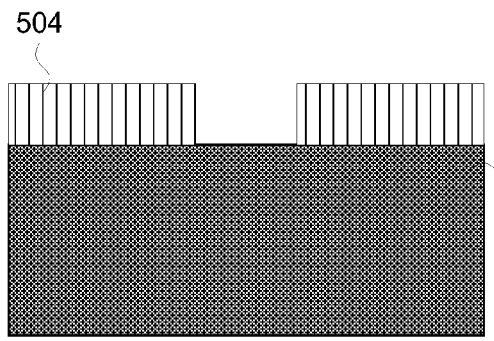
FIGS. 20A–20E schematically depict side views at various stages of a process for forming a probe element according to a fourteenth embodiment of the invention where the probe tip is coated with a desired contact material which is protected from a sacrificial material use in forming the probe element.

FIG. 20A depicts a state of the process after a sacrificial material 502 has received a patterned coating of a sacrificial material 504 (for example, copper). Substrate 502 may be of the same sacrificial material as 504 or it alternatively may be some other sacrificial material or potentially even a structural material that can eventually be separated from a probe tip. The openings over substrate 502 through the sacrificial material 504 correspond to locations where probe tip elements are to be formed.

Figure 20B:
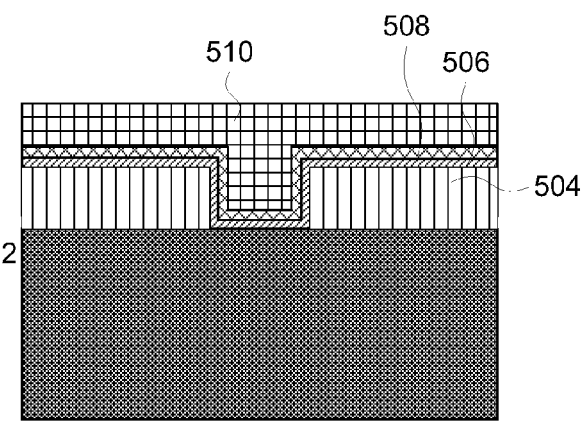

FIG. 20B depicts a state of the process after a blanket deposition of a protective material 506 is made to overcoat both the substrate and the sacrificial material. Next a probe tip floating material 508 is blanket deposited over the protective material 506 and thereafter a structural material 510 is blanket deposited.

Figure 20C:
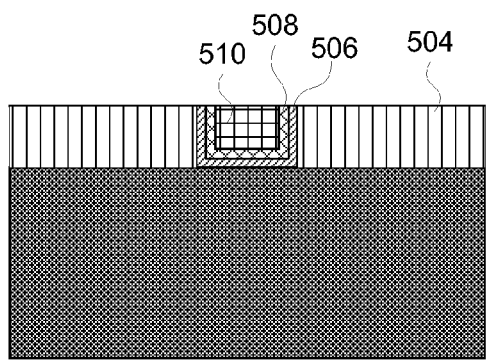

FIG. 20C depicts a state of the process after a planarization operation trims off those portions of the protective material 506, the probe tip coating material 508 and the structural material 510 that overlay regions of sacrificial material 504. As can be seen in FIG. 20C, probe tip coating material 508 is separated from sacrificial material 504 by a coating of the protective material 506.

Figure 20D:
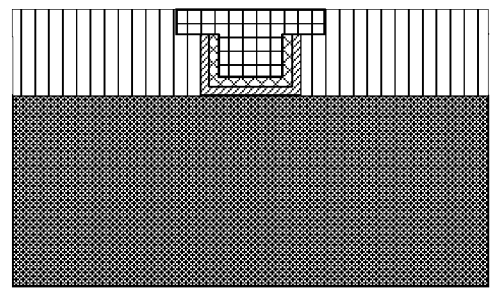

FIG. 20D depicts a state of the process after an additional layer of structural and sacrificial material is added. In particular it is noted that the structural material forming part of a probe element is provided with an extended width that completely covers the probe tip coating material and the protective material as well. As a result of the selecting of the size and configuration of the second layer to completely overlay the probe tip coating material the probe tip coating material is sandwiched between structural material 510 and protective material 506 and thus any subsequent etching operations that are intended to remove material 504 will not cause damage to probe tip coating material 508.

Figure 20E:
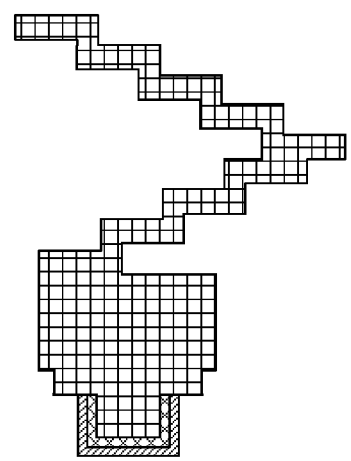

FIG. 20E depicts a state of the process after a spring like probe element has been formed wherein the contact area of the probe element is shown as still being over-coated with the protective material and with the probe tip coating material. In a subsequent operation not shown protective material 506 may be removed to yield a probe element with a desired probe tip coating material.

It will be understood by those of skill in the art that though a single probe tip and probe element have been illustrated in this embodiment the principles set forth in the process of this embodiment may be extended to the simultaneous creation of an array of probe tip elements or a plurality of arrays of probe tip elements.

FIGS. 21A–21F schematically depict side views at various stages of a process for forming a probe element according to a fifteenth embodiment of the invention where the probe tip is given a tapered configuration and a coating of desired contact material which is protected from a sacrificial material used in forming the probe element.

Figure 21A:
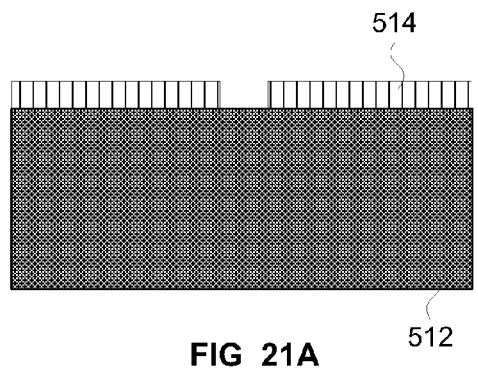
FIGS. 21A–21F schematically depict side views at various stages of a process for forming a probe element according to a fifteenth embodiment of the invention where the probe tip is given a tapered configuration and a coating of desired contact material which is protected from a sacrificial material used in forming the probe element.

FIG. 21A depicts a state of the process after a substrate 512 receives a patterned deposit of a sacrificial material 514. The substrate may be, for example, a structural material that can later be separated from the probe tip or tips that are to be formed or alternatively it may be a sacrificial material that may be destructively removed from the probe tip or probe tip elements that are formed.

In some variations of the embodiment it may be of the same material as sacrificial material 514. In some embodiments of the invention sacrificial material 514 may be copper, tin, gold or the like.

Figure 21B:
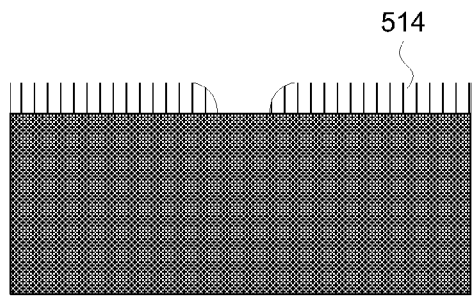

FIG. 21B depicts a state of the process after electrochemical polishing or etching is used to round the corners of the sacrificial material bounding the opening that extend therethrough.

Figure 21C:
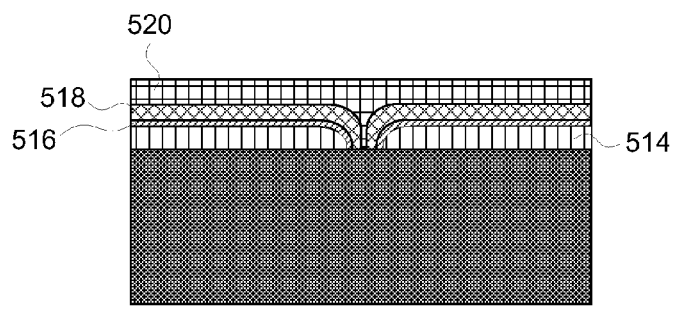

FIG. 21C depicts a state of the process after deposition of a protective material 516, a probe tip coating material 518 and deposition of a probe tip structural material 520 occurs.

Figure 21D:
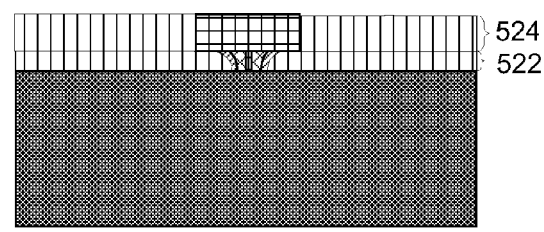

FIG. 21D depicts a state of the process after two additional operations have occurred, the first operation being a planarization operation of the deposited materials so that materials 516, 518 and 520 that overlay material 514 are removed. Operation two involves the formation of a next layer 524 over planed layer 522.

Figure 21E:
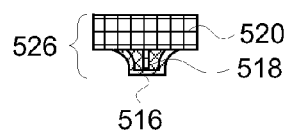

FIG. 21E depicts the probe tip element 526 released from the substrate 512 and sacrificial material 514 where the probe tip element still includes protective material 516 surrounding probe tip coating material 518 and where probe tip coating material 518 is kept by probe tip structural material 520.

Figure 21F:
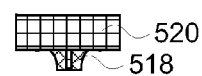

FIG. 21F depicts a state of the process after protective coating 516 is removed leaving probe tip coating material 518 surrounding probe tip structural material 520.

FIGS. 22A–22H schematically depict partially transparent, perspective views of an example structure at various stages of a process for forming an array of probe tips and elements according to a sixteenth embodiment of the invention where the probe tips are formed using a silicon mold and the tips are protected from sacrificial material etchants by sealing them between structural material and silicon prior removing sacrificial material.

Figure 22A:
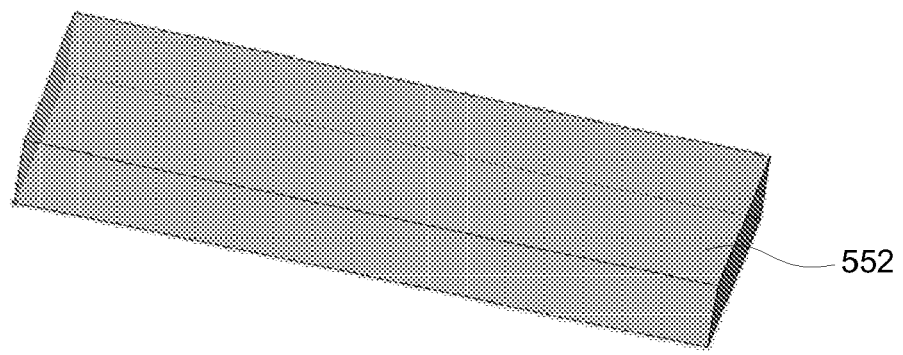
FIGS. 22A–22H schematically depict partially transparent, perspective views of an example structure at various stages of a process for forming an array of probe tips and elements according to a sixteenth embodiment of the invention where the probe tips are formed using a silicon mold and the tips are protected from sacrificial material etchants by sealing them between structural material and silicon prior removing sacrificial material.

FIG. 22A depicts the starting point of the embodiment which illustrates that a silicon substrate 552 (e.g. having a 100 orientation) is supplied. In embodiments where other tip configurations are desired different substrates could be selected. In the present embodiment the silicon substrate is selected to have low resistance.

Figure 22B:
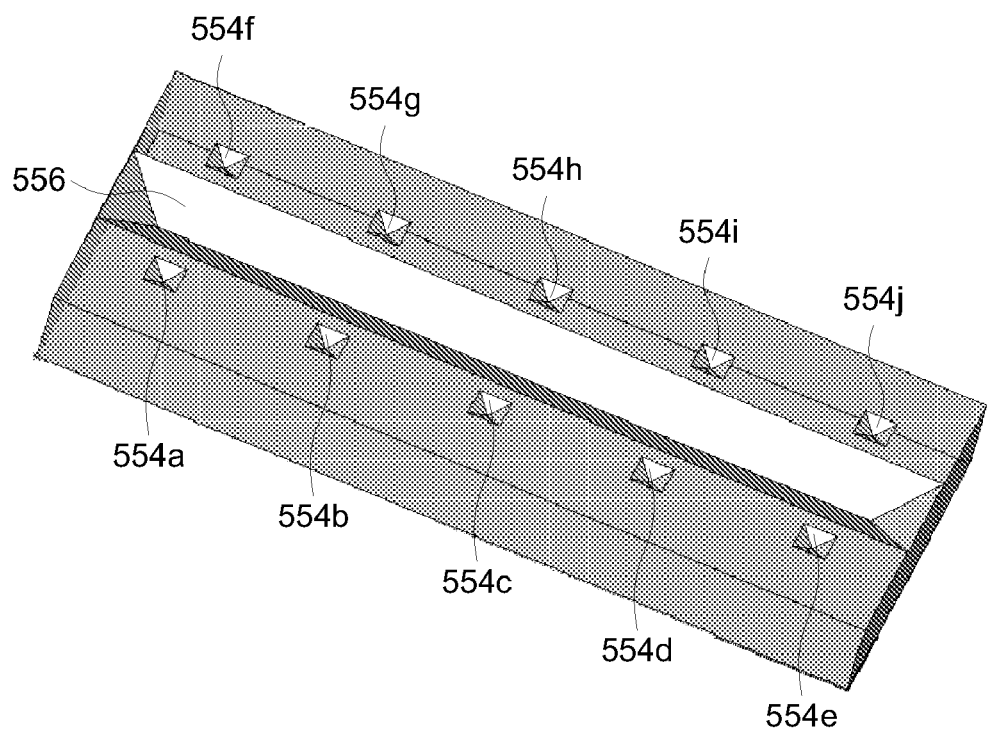

FIG. 22B depicts a state of the process after a number of voids 554a–554j have been etched in the substrate each one corresponding to a probe tip shape and relative position. As illustrated a trench 556 is also etched into the silicon. The formation of such a trench is optional as its use is strictly as an etching aid when it comes time to separate the tip structures from the silicon. The tip configurations may be that of pyramids or wedges formed by use of an anisotropic etchant such as KOH or TMAH and the like. Spherical or semi-spherical configurations may be obtained by using other etchants such as HCN or $XeF_2$. Rounded pyramids or wedges may be obtained by using a combination of etchants.

In variations of the embodiment etching of all openings may be simultaneously performed using a single mask or alternatively multiple masks could be used and etching could be performed at different times.

Figure 22C:
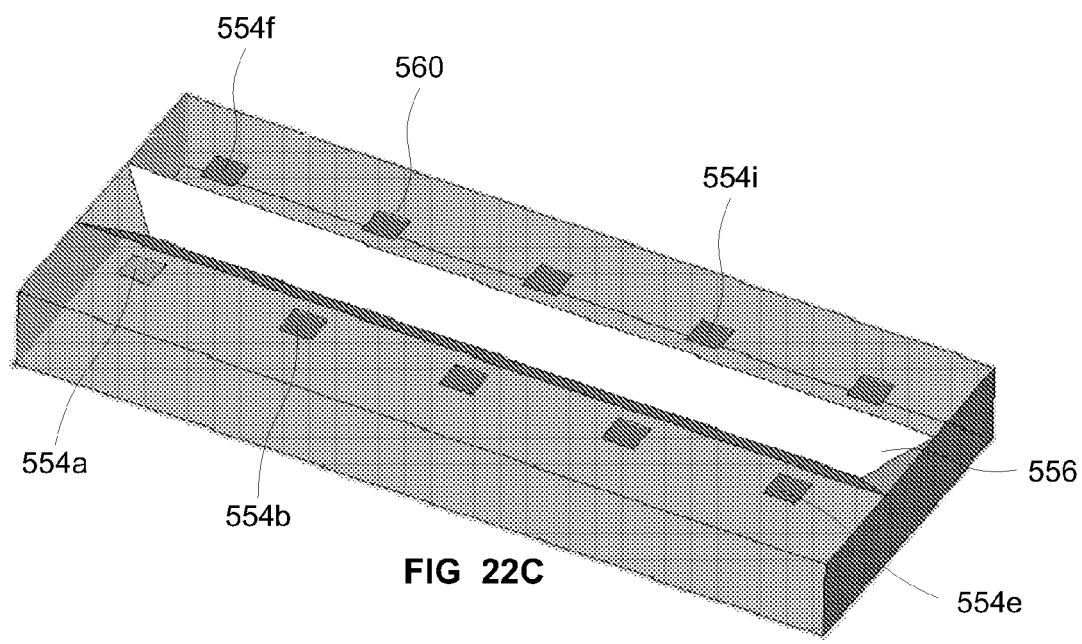

FIG. 22C depicts a state of the process after voids 554a–554j have been filled in with a desired tip material 560. The filling in of voids 554a–554j may occur by an electroplating operation, a sputtering operation or in some other manner. The filling in of the voids may occur with trench 556 masked or with trench 556 open as any deposition tip material in the trench 556 will simply fall away in a later operation. The filling of voids 554a–554j may involve the use of not only a probe tip material but also a probe tip coating material.

Figure 22D:
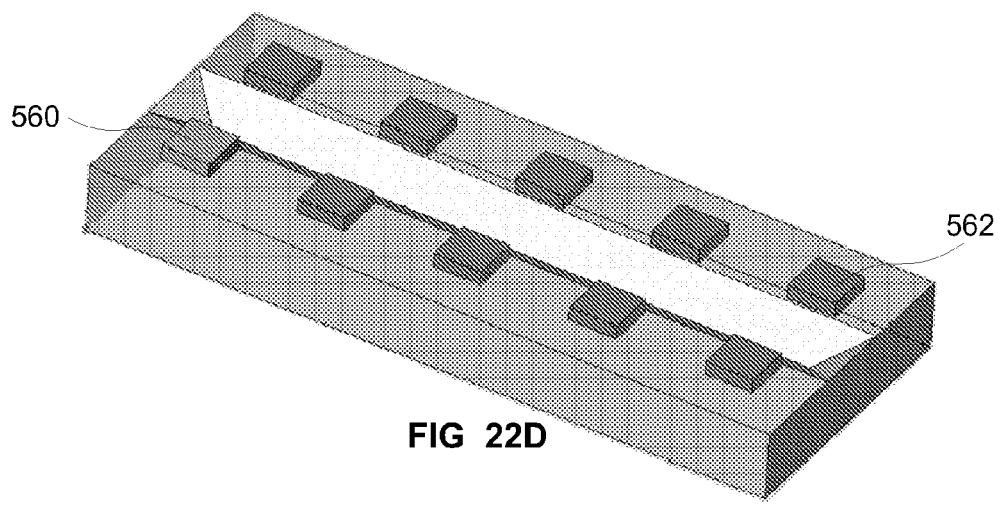

FIG. 22D depicts a state of the process after selective deposition of a structural material 562 forms sealing caps over the probe tip material. The sealing caps preferably extend beyond the region of the probe tip material to completely enclose the tip material between the silicon substrate and the structural material. If the probe tip material was not deposited in a selective manner then prior to the deposition of the structural material as indicated in FIG. 22D a planarization operation may optionally be used to ensure that the structural material may bond directly to the silicon material.

After deposition of the structural material a sacrificial material may be blanket deposited and the surface planarized leaving an exposed region of structural material over the tip locations and sacrificial material elsewhere (not shown).

Figure 22E:
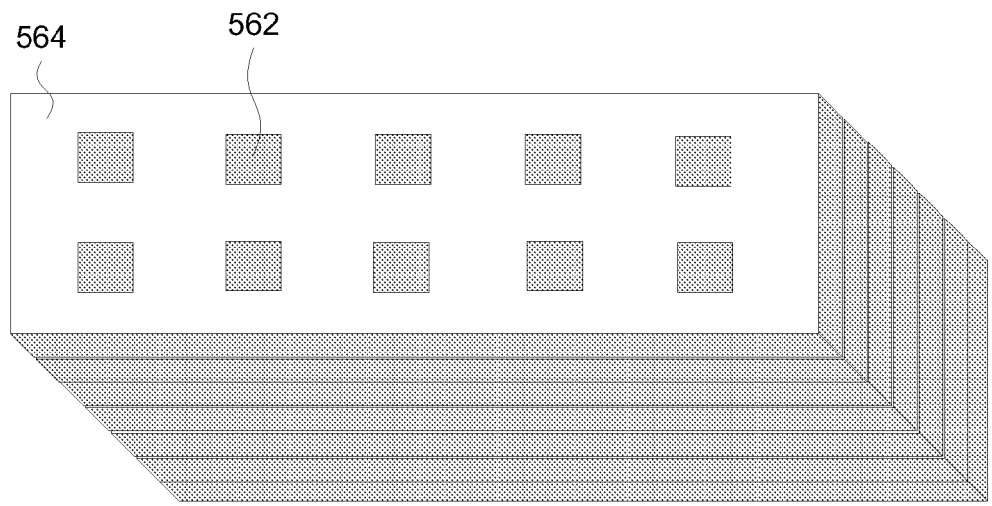

FIG. 22E depicts a state of the process after multiple layers of the probe elements have been built up via an electrochemical fabrication process or the like where the last layer leaves exposed regions of structural material corresponding to the last layer of the probe elements being surrounded by sacrificial material.

Figure 22F:
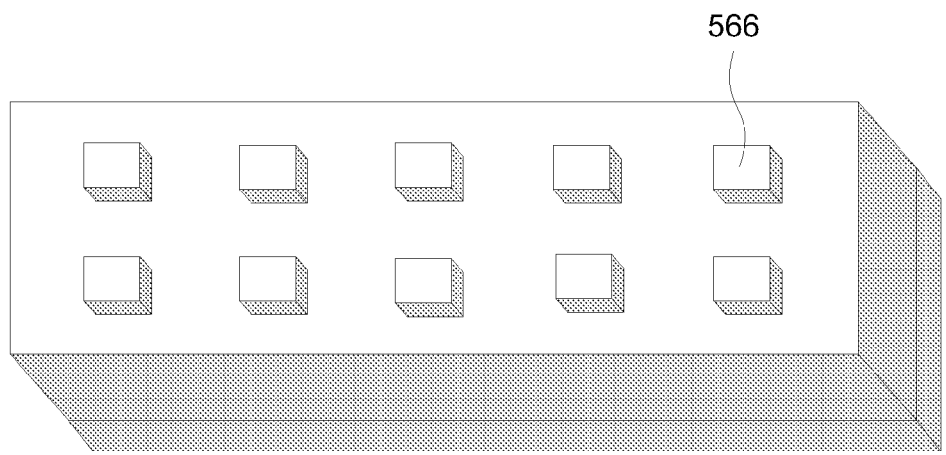
Figure 22G:
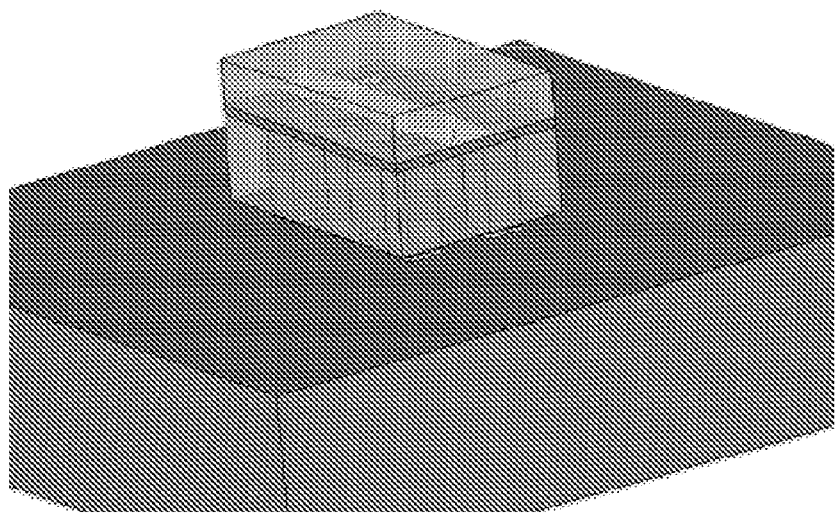

FIG. 22F shows the state of the process after an adhesion or bonding material 566 is formed over the regions of structural material 562 which may or may not be surrounded by sacrificial material 564. The un-released probe elements and substrate 552 are next flip chip bonded to a desired permanent substrate (e.g. a space transformer) as shown in FIG. 22G.

Next the sacrificial material is removed via an etching operation that may proceed from the sides of the array towards the center or alternatively the silicon substrate may be ground back to expose the trench area which is filled with sacrificial material and then etching may proceed from the sides as well as from the central region of the array.

Figure 22H:
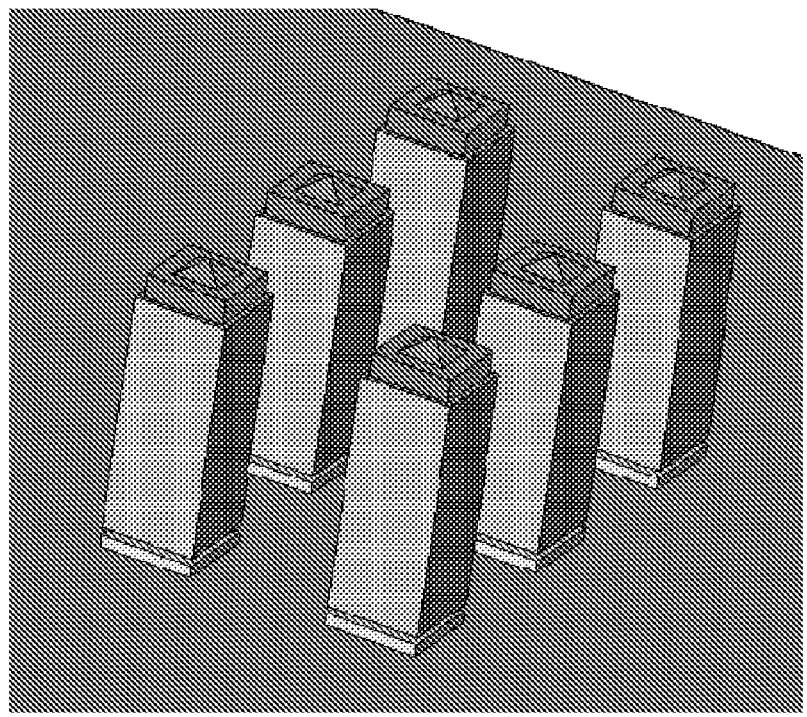

FIG. 22H depicts a state of the process after both the silicon substrate and the sacrificial material have been removed.

A next embodiment of the invention relates to the fabrication of tips for microprobes using the 'mushrooming' approach described previously herein for tip fabrication, as well as the transfer/bond/release approach to building microprobes upside down on a temporary wafer and ending up with them bonded to a space transformer, (which is described in more detail in U.S. Patent Application No. 60/533,947). This patent application is incorporated herein by reference. This embodiment also relates to a method of fabricating probes having different heights which allows tips to be fabricated using the mushrooming approach on these different-height tips.

When tip-equipped probes of multiple heights are produced with EFAB™, the tips at intermediate heights (i.e., not adjacent to the release layer on the temporary wafer) must be formed at the same height as normal layer features that form part of other probes whose tips are at different heights than these (e.g., adjacent to the release layer). A major challenge in producing tips at intermediate heights using mushrooming occurs if the tip is taller than the thickness of single layer at the height of the tip, as is often the case unless one is willing to distort the layer thicknesses in this region (undesirable) to accommodate the tip height. This embodiment of the invention is of a means for fabricating tips of intermediate height in which a) the tip height can be greater than the height of the corresponding layer; b) the corresponding layer height need not be altered in any way to accommodate the tip.

Figure 23A:
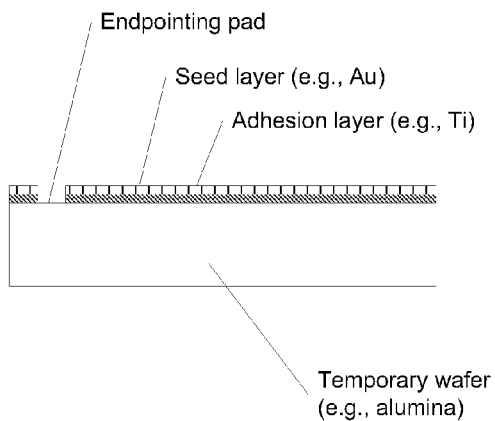
FIGS. 23A–23U depict an example process flow for fabricating probes of a single height using mushrooming to produce the tips.
Figure 23B:
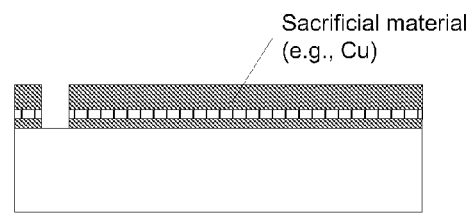
Figure 23C:
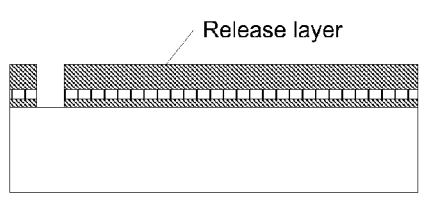
Figure 23D:
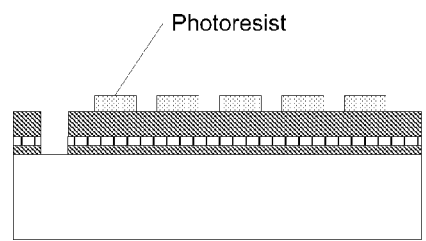
Figure 23E:
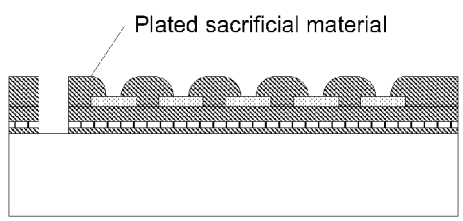
Figure 23F:
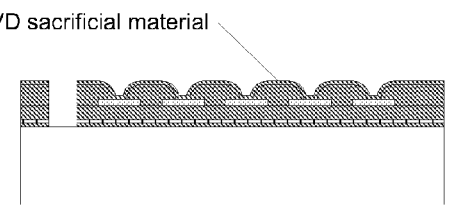
Figure 23G:
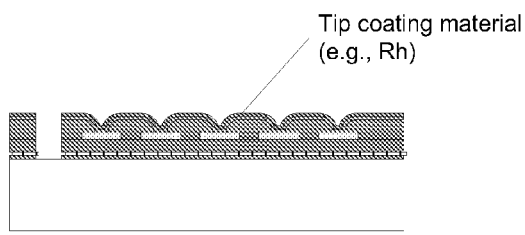
Figure 23H:
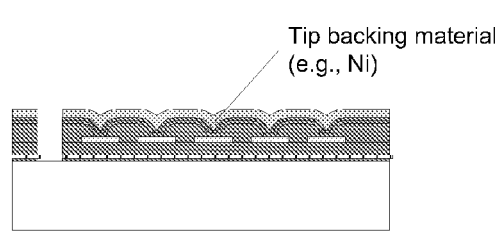
Figure 23I:
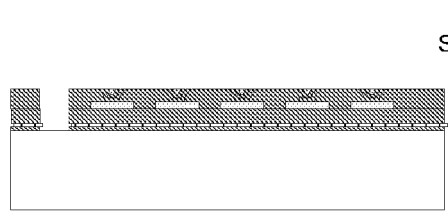
Figure 23J:
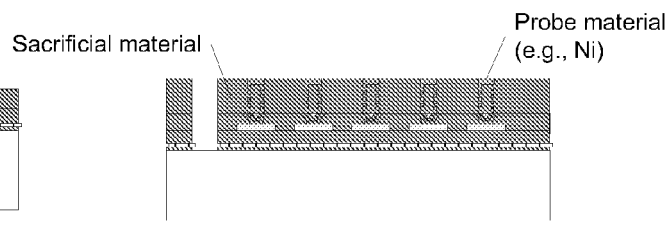
Figure 23K:
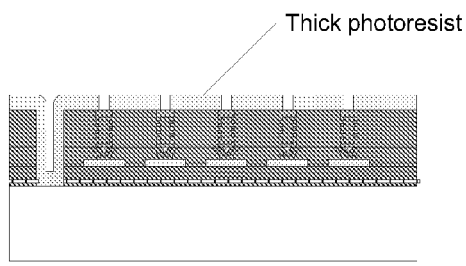
Figure 23L:
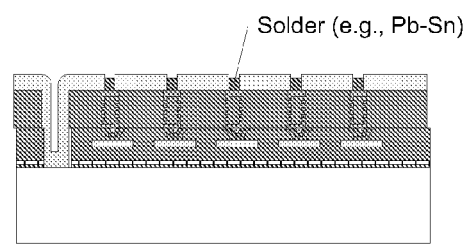
Figure 23M:
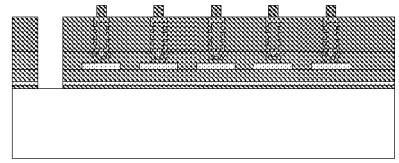
Figure 23N:
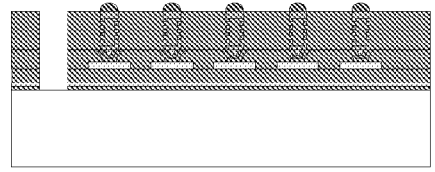
Figure 23O:
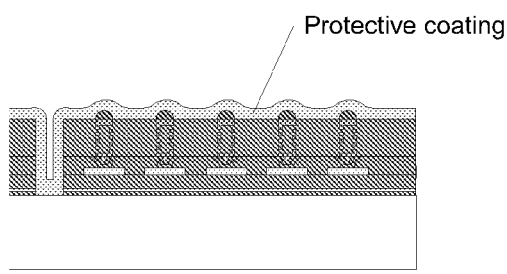
Figure 23P:
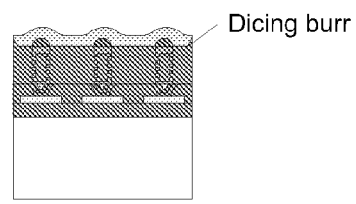
Figure 23Q:
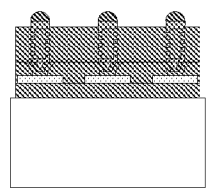
Figure 23R:
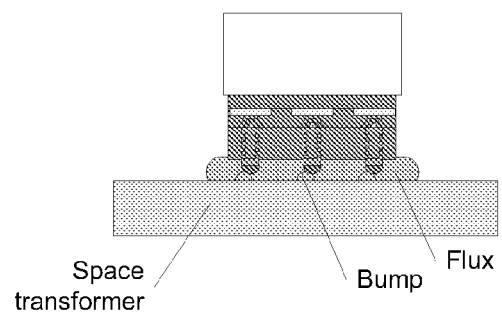
Figure 23S:
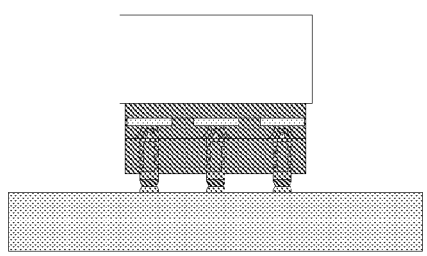
Figure 23T:
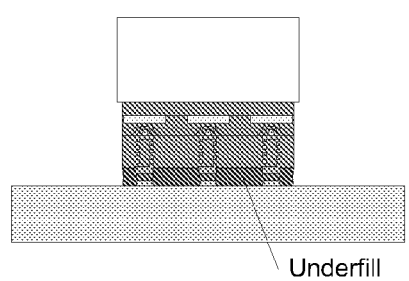
Figure 23U:
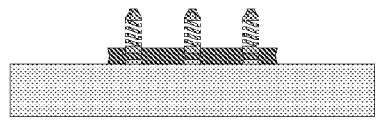

FIGS. 23A–23U depict an example process flow for fabricating probes of a single height using mushrooming to produce the tips. In FIG. 23A a temporary wafer (assumed to be alumina coated with seed and adhesion layers) is shown. A blank region on the wafer surface to allow direct access to the end-pointing probes is shown; this can be produced by locally etching the seed and adhesion layers. Other than mushrooming in from the edges of this end-pointing 'pad' region (this mushrooming is not shown in the figures), the pad will not be plated. In FIG. 23B a thick layer of sacrificial material (assumed to be Cu) has been plated, and in FIG. 23C, it has been planarized to form a release layer of the desired thickness. In FIG. 23D, thin photoresist has been patterned to form insulating structures over which sacrificial metal can mushroom to form tip geometries and in FIG. 23E, Cu has been mushroomed over these by plating for a controlled time.

FIG. 23F depicts a state of the process where Cu has been deposited by PVD (e.g., sputtering) over the wafer so that there is a continuous metal film for plating the tips (otherwise the exposed resist area could not be plated over except via mushrooming, which requires thick plating). FIG. 23F also shows that the Cu has been removed from the end-pointing pad area (e.g., by etching) so that it won't plate up.

FIG. 23G depicts a state of the process where tip coating material (e.g., Re) has been applied, for example, by plating (if the tip coating material is applied by PVD, then the previous step of applying Cu by PVD can be bypassed).

FIG. 23H depicts a state of the process where a tip backing material (e.g., Ni) has been plated. Note that in some cases, tips can be fabricated made entirely of the tip coating material and no backing material is needed. However, for tip coatings that are too soft (e.g., Au) or which have too much residual stress (e.g., possibly Re or Rh) as deposited, a thin coating would preferably be used, backed by another material.

FIG. 23I depicts a state of the process where the wafer has been planarized, resulting in the final form of the tips. In FIG. 23J the remaining layers of the probes (including a base for the solder) will have been fabricated. In FIG. 23K, a thick resist has been deposited and patterned. In FIG. 23L, solder has been plated into the resist apertures and in FIG. 23M the resist has been stripped. In FIG. 23N, the solder has been reflowed.

FIG. 23O depicts a state of the process where a protective coating has been added to protect the build prior to dicing. This coating, if somewhat hard, can also minimize the degree to which burrs on the top (eventually, the bottom) surface of the die will be produced during dicing. In FIG. 23P, the wafer has been diced, yielding a single die with several probes; the burr is visible. In FIG. 23Q, the die has been partially released in order to a) remove the burr; b) recess the Cu surface below that of the solder. The latter is done for two reasons: 1) to eliminate the risk of solder wicking out across the Cu and shorting together neighboring probes; 2) to separate the solder from the Cu, allowing the former to be embedded in an underfill that protects it during Cu release. A third possible reason for the partial release is to facilitate and reduce the time required for the full release later; in this regard, the release may be continued much further than shown here (limited only by the desire to a) hold all the probes in good alignment until bonded; b) minimize the risk of damage to the probes until bonded); c) prevent the underfill polymer (if used) from enveloping the probes and interfering with their compliance (indeed, if the gap is too large the underfill may not properly wick in due to reduced capillary pressure).

FIG. 23R depicts a state of the process where the die has been flipped and aligned roughly to the bumps on a space transformer. A flux has been applied to either or both the die or space transformer to a) adhere the two together well enough to retain alignment until bonded; b) minimize oxide formation which can interfere with good bonding.

FIG. 23S depicts a state of the process where the solder has been reflowed, self-aligning the die, and the flux has been removed. In FIG. 23T, an underfill polymer has been wicked in to fill the space under the die.

FIG. 23U depicts the state of the process where the die has been fully released from Cu. During this process, the Cu-enveloped photoresist features patterned earlier would typically fall away or become dissolved. If desired, the release process can be stopped and a photoresist stripper used once the resist is exposed, then the release continued.

Figure 24A:
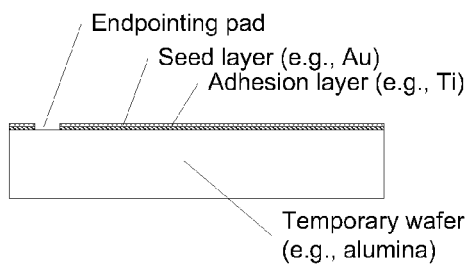
FIGS. 24A–24CC depict the process flow for an embodiment of the invention in which the photoresist patterns needed to define the tips through mushrooming are formed at the appropriate layer, but the mushrooming deposition of sacrificial material is deferred until layers are built to a sufficient height to allow the full tip height to be formed.
Figure 24B:
Figure 24C:
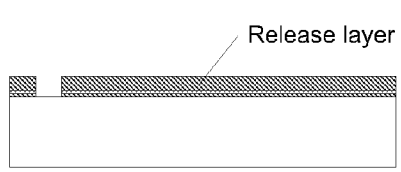
Figure 24D:
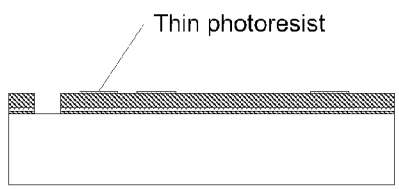
Figure 24E:
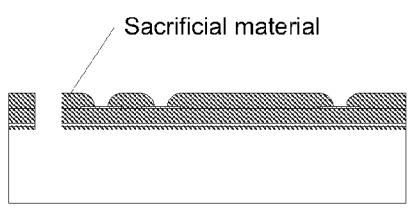
Figure 24F:
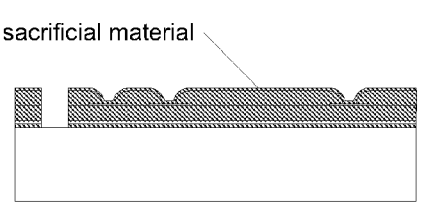
Figure 24G:
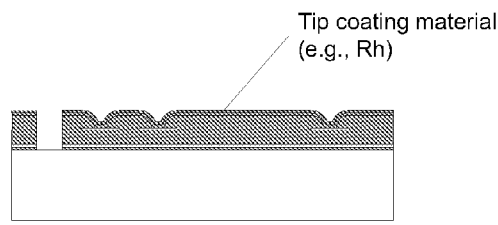
Figure 24H:
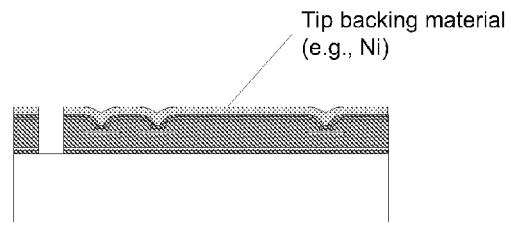
Figure 24I:

FIGS. 24A–24CC depicts the process flow for an embodiment of the invention. In this embodiment the photoresist patterns needed to define the tips through mushrooming are formed at the appropriate layer (adjacent to the eventual tip wherever it may be), but the mushrooming deposition of sacrificial material is deferred until layers are built to a sufficient height to allow the full tip height to be formed. This deferment is accomplished by means of coating the resist with a dielectric film after patterning. Alternative coatings (e.g., with a metal) are also possible, but if such coatings are platable, would require more effort to remove the coating given that it will first be necessary to remove the metal over it. In another embodiment (not shown), the mushrooming is performed in an incremental fashion (i.e., plating Cu as normal on each layer (which will partially mushroom) or plating extra-thick Cu, which can fully mushroom), and then the mushroomed shape is planarized (along with the entire layer) to the layer thickness (which truncates the mushroomed shape); this is then repeated on several layers, gradually building up the mushroomed 'mold' for the tip. This is expected to result in a tip shape that is not identical to that produced by the mushrooming process shown in FIG. 24E, but this may be acceptable. Indeed, if desired for the sake of uniformity, all tips may be plated into molds produced in this layer-by-layer process.

Figure 24J:
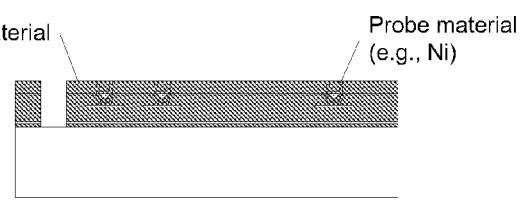

FIGS. 24A–24I are equivalent to FIGS. 23A–23I, but in the case of FIGS. 24A–24CC, not all probes are full height. Only three are shown with their tips being formed adjacent to the release layer. FIG. 24J depicts a state of the process in which some additional layers have been formed, stopping at the layer which needs to be patterned with photoresist to define the mushrooming of the tips.

Figure 24K:
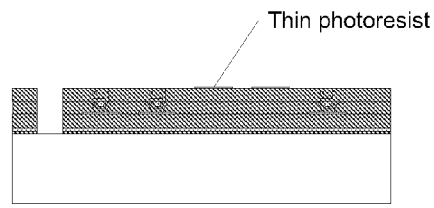
Figure 24L:
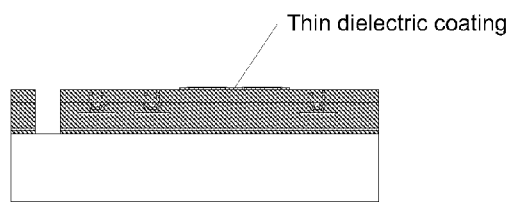

FIG. 24K depicts a thin photoresist has been patterned to form insulating structures over which sacrificial metal can mushroom to form tip geometries. In FIG. 24L, the resist has been coated with a thin dielectric coating. It is critical that the combined thickness of the resist and this dielectric coating not exceed the layer thickness of the next layer, or else the dielectric coating (and possibly the resist) will be damaged by the subsequent planarization of this layer (depending on the nature of the coating and the type of planarization performed, it may be acceptable to remove a portion of the dielectric coating, so long as enough remains to prevent plating over the tips until the correct time).

FIG. 24M depicts a state of the process in which photoresist for patterning the next layer has been applied, and in FIG. 24N, it is patterned. In FIG. 24O, Cu has been plated (it is assumed here that the probes are fabricated by pattern-plating the Cu and not the probe structural material). It should be noted that there is no plating (other than some sideways mushrooming not shown) on the dielectric coating.

Figure 24S:
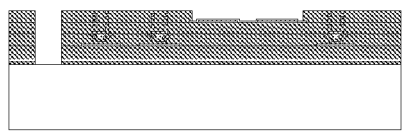

FIG. 24P depicts a state of the process where the resist has been stripped and in FIG. 24R, probe material has been plated. In FIG. 24S, the wafer has been planarized. The process shown in FIGS. 24M–24S may be repeated several times to build up several layers until there is sufficient height available to build the entire tip mold by single-step mushrooming.

Figure 24T:
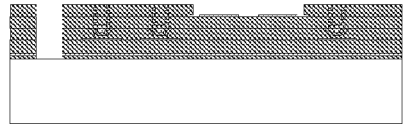
Figure 24U:
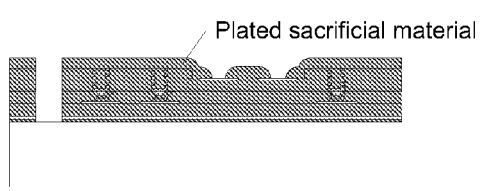
Figure 24V:
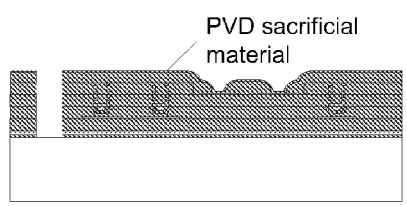

FIG. 24T depicts a state of the process where the coating has been removed and in FIG. 24U, Cu has been mushroomed over the resist features by plating for a controlled time. In FIG. 24V, Cu has been deposited by PVD (e.g., sputtering) over the wafer.

Figure 24W:
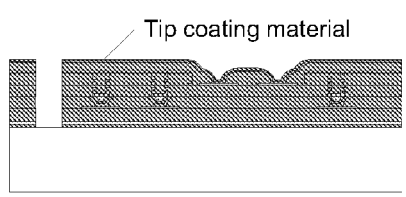

FIG. 24W also depicts that the Cu has again been removed from the end-pointing pad area. In FIG. 24W, a tip coating material (e.g., Re) has been applied, for example, by plating (again, if the tip coating material is applied by PVD, then the previous step of applying Cu by PVD can be bypassed).

Figure 24X:
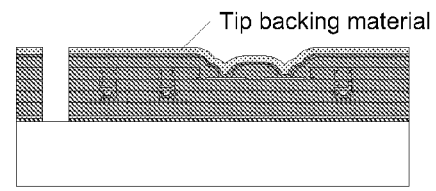
Figure 24Y:
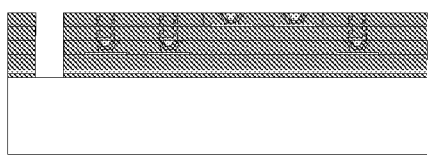

FIG. 24X depicts a tip backing material (e.g., Ni) has been plated. In FIG. 24Y, the wafer has been planarized, resulting in the final form of the tips.

Figure 24Z:
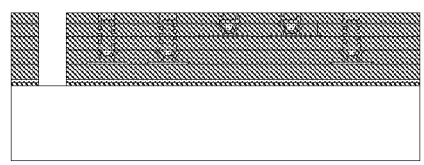
Figure 24A:
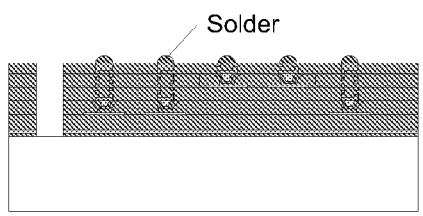
Figure 24B:
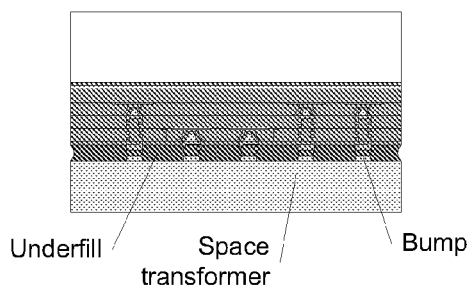
Figure 24C:
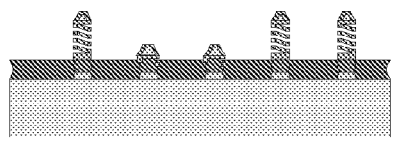

FIG. 24Z depicts a state of the process where the remaining layers of the probes (including a base for the solder) will have been fabricated. In FIG. 24M, solder has been pattern-deposited and then reflowed. Subsequent to this the wafer is cut. In FIG. 24BB, the die has been flipped and the solder reflowed in the presence of flux to self-align and bond the die, and the flux has been removed. Also in FIG. 24BB an under fill polymer has been wicked in to fill the space under the die.

FIG. 24CC depicts a state of the process where the die has been fully released from Cu, resulting in probes with tips of different heights. While the process flow is shown for probes having two different heights, this is by way of example and a group of probes having three or more different heights can be so produced.

In the above embodiment particular a particular sacrificial material, Cu, and structural material, Ni, have been focused on but in alternative embodiments other materials may be used.

FIGS. 25A–25D schematically depict side views at various stages of an alternative process for forming an undercut dielectric pattern similar to that of the embodiment of FIGS. 7A–7F where multiple deposits of photoresist will be used in combination with multiple exposures.

Figure 25A:
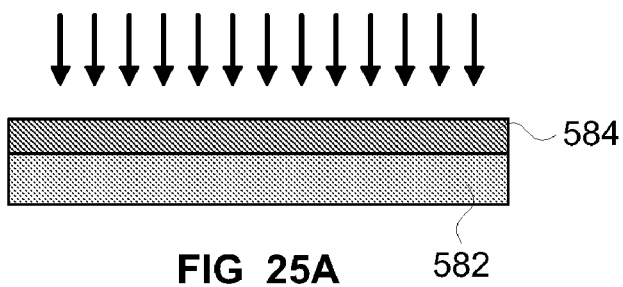
FIGS. 25A–25D schematically depict side views at various stages of an alternative process for forming an undercut dielectric pattern similar to that of the embodiment of FIGS. 7A–7F where multiple deposits of photoresist will be used in combination with multiple exposures.

FIG. 25A depicts a state of the process where a substrate 582 is coated with a positive photoresist material and then is given a relatively small blanket exposure of radiation.

Figure 25B:
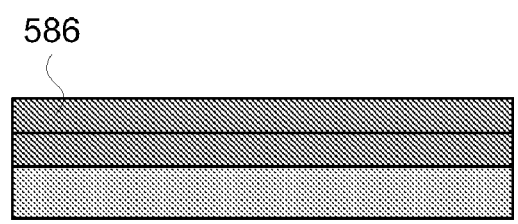

FIG. 25B depicts a state of the process after the first exposed coating of photoresist of over-coated with a second coating 586.

Figure 25C:
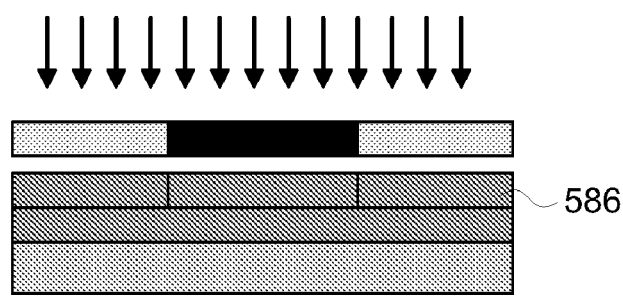

FIG. 25C depicts a state of the process after a photomask is located over or adjacent to coating 586 and a relatively large exposure of radiation is applied to regions where probe tips are to be formed.

Figure 25D:
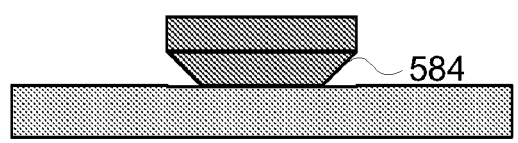

FIG. 25D depicts a state of the process after a development operation causes undercutting of the initial coating 584 of photoresist.

A next embodiment of the invention relates to a method of forming tapered tips for microprobes or other applications. It makes use of a contact mask similar to but molded to have tapered sidewalls in order to create a deposit of sacrificial material (typically Cu) having tapered, vs. straight, sidewalls. Another unique (though optional) aspect of the contact mask is that it is partly transparent so as to allow alignment to targets on the wafer; this can be generically useful (i.e., even for contact masks with straight sidewalls) in that makes the contact mask more like a photomask in alignment requirements, allowing alignment between contact mask and wafer without having to view each with opposite-facing cameras in special alignment equipment, etc. A partly-transparent contact mask is desirable in forming tips if it is desired to form tips partway through a build (i.e., to create probes with tips at different heights) in which case alignment to existing geometry (vs. the largely-unpatterned wafer surface) is necessary.

FIGS. 26A–26H depicts the process for making the contact mask, whereas FIGS. 26I–26M illustrate the use of the contact mask in forming tips on a wafer.

FIGS. 26A–26B depicts a state of the process after the contact mask substrate (normally just a thick Si wafer) is fabricated, assuming a partly-transparent contact mask is desired. In FIG. 26A, low-resistivity (i.e., heavily-doped) Si is shown adjacent to a rigid glass plate larger in diameter than the wafer, having at least one aperture to accommodate a spring contact. In FIG. 26b, the wafer and glass have been bonded (e.g., by anodic bonding) and the spring inserted so as to make electrical contact with the wafer through the glass. It is possible to see through the composite contact mask substrate (around the edges of the Si wafer) for purposes of alignment. Alternate approaches to fabricating a contact mask substrate such as this include drilling viewing holes through a Si wafer and surrounding a Si wafer by a glass ring which is bonded or press fit to it.

FIGS. 26C–26E depict a mold for molding the contact mask is prepared. In FIG. 26C, a Si wafer is shown; while in FIG. 26D it has been anisotropically etched (e.g., using KOH) to form trenches (e.g., pyramids or elongated pyramids with smooth sidewalls at an angle of 54.74° to the surface if the Si surface is the 100 crystal plane of Si). The mold is also treated with a silane or coated with parylene in order to provide a non-adherent surface for the PDMS.

FIG. 26E depicts a state of the process where PDMS has been applied to the mold and in FIG. 26F the contact mask substrate has been lowered onto the mold and pressure applied so as to squeeze out the excess PDMS, which is then cured. In FIG. 26G, the contact mask substrate has been demolded and RIE has been performed to remove any PDMS molding flash from in-between the features, leaving behind bare Si. In FIG. 26H, electrical contact to the Si wafer of the contact mask has been made through the spring and thin Ni (not shown) and then Cu have been plated onto the contact mask substrate, the latter to serve as feedstock for the deposition of Cu when the contact mask is used below. Note that while the contact mask substrate and mold are unusual, the molding and plating processes are otherwise similar to those normally used in the manufacture of contact masks.

Figure 26I:
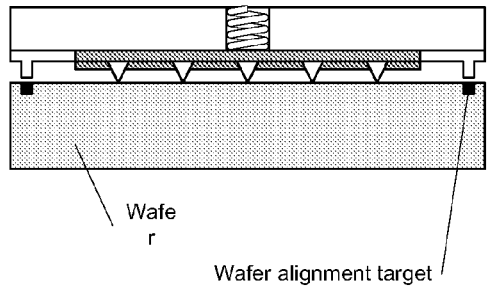
FIGS. 26I–26M illustrate the use of the contact mask in forming tips on a wafer.
Figure 26J:
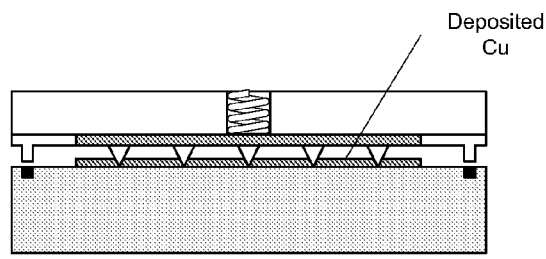
Figure 26K:
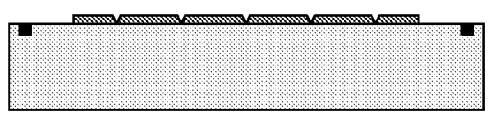

FIG. 26I depicts a state of the process where the contact mask and a wafer (e.g., Ni, Ti/Au-coated alumina) have been aligned using the alignment targets on each and the two have been mated while substantially parallel. A well-controlled pressure is applied (too much will distort the shape of the PDMS tips; too little will allow for plating flash under the tips, though this may be quite acceptable in this situation. Since the intent is to build the probes upside-down on this wafer and eventually release them from the wafer, a deposit of a normally thick release layer of Cu before the step shown in FIG. 26I, so some Cu plating flash is hardly an issue. In FIG. 26J, contact has been made to the contact mask (serving as an anode) and Cu has been plated onto the wafer around the PDMS tips. In FIG. 26K, the contact mask has been de-mated, leaving behind Cu deposits having trenches similar in geometry to the PDMS and thus to the original Si mold.

Figure 26L:
Figure 26M:
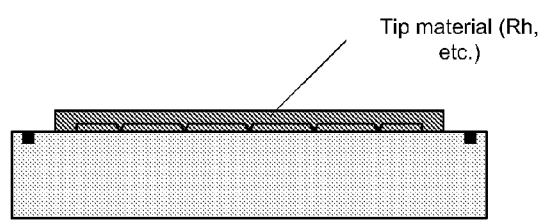

In FIG. 26L, a tip material has been deposited (in fact, this may be two materials: a thin film of one such as Rh backed by a thicker film of another such as Ni). In FIG. 26M, the layer has been planarized, producing an array of tips. At this point, the standard EFAB process can be performed to fabricate the probes in alignment above the tips. If desired, the steps shown in FIGS. 26I–26M can be carried out at one or more heights further up (though normally with a different contact mask pattern than that used to pattern the tips as already shown for the tallest probes) in the build to create probes with tips at multiple heights. In this case, as already noted, the contact mask would be carefully aligned to the alignment targets on the wafer.

It should be noted that the pitch between probe tips cannot be extremely small using this embodiment of the invention since there must be room between the PDMS tips in order to plate Cu feedstock and the distance between the Cu feedstock layer and the wafer must typically be reasonable (e.g., 50 μm or greater) or shorting may occur during plating.

Figure 27A:
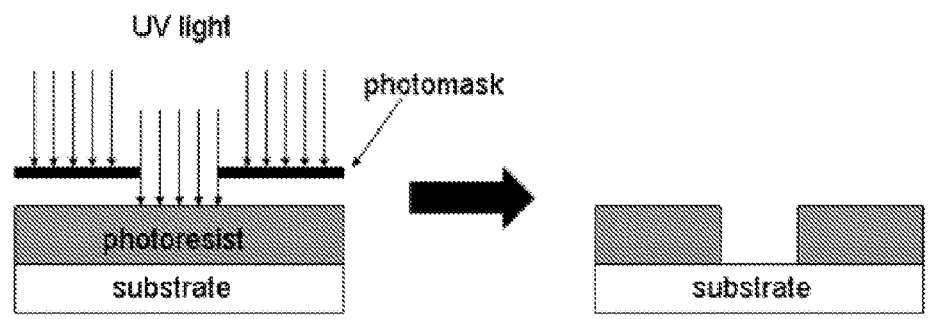
FIGS. 27A–27B depicts an embodiment for generating probe tips which involves the creation of photoresist molds with sloped sidewalls.
Figure 27B:
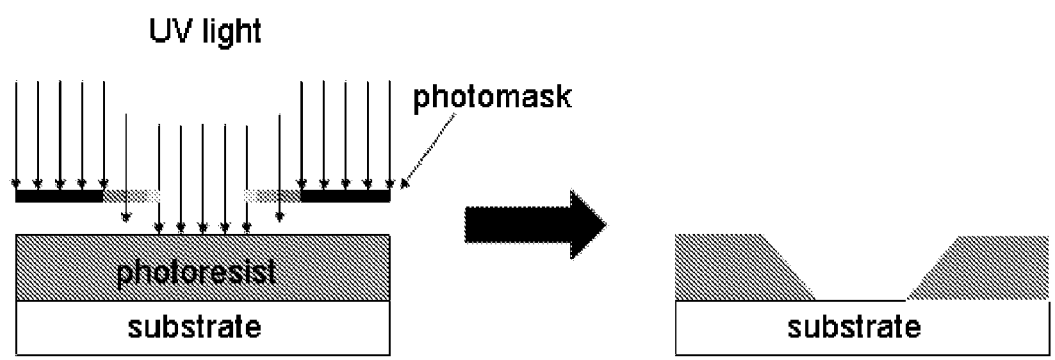

Another embodiment for generating probe tips which involves the creation of photoresist molds with sloped sidewalls. This embodiment is explained with the aid of FIGS. 27A and 27B. A shadow or gray photomask (i.e. a mask having areas through which UV light passes but with less intensity) is used to in combination with positive photoresist (e.g. AZ 4620). FIG. 27A depicts a standard photomask being used to obtain a stair stepped photoresist pattern. FIG. 27B depicts the use of a gray scale mask to obtain sloped sidewalls of the photoresist and thus a sloped mold. Probe tips may be fabricated by plating a suitable metal into the mold.

A next embodiment of the invention relates to a method of fabricating probes with probe tips. The process is shown in FIG. 28.

Figure 28A:
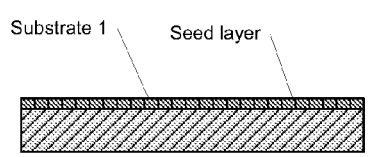
FIGS. 28A–28S depicts an embodiment which relates to a method of fabricating probes with probe tips.
Figure 28B:
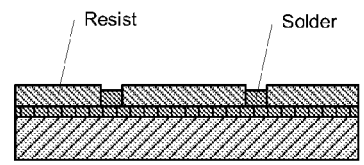
Figure 28C:
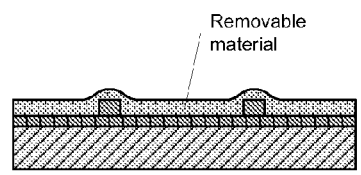
Figure 28D:

FIG. 28A depicts a substrate (e.g., alumina) ('Substrate 1') with a thick (e.g., plated over sputtered) seed layer of sacrificial material (e.g., Cu). An adhesion layer (e.g., Ti—W, not shown) may be used underneath the seed layer if needed. In FIG. 28B, resist has been patterned and solder has been plated into the apertures. In FIG. 28C, a removable material (e.g. in or another material that can be melted at a lower temperature than solder or etched without damage to the solder) has been applied and in FIG. 28D the layer has been planarized. This material is assumed here to be conductive and capable of being plated with sacrificial material with good adhesion; if it is not, suitable seed (and possibly adhesion) layers can be applied before continuing.

Figure 28E:
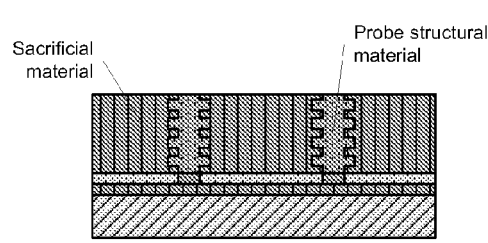
Figure 28F:
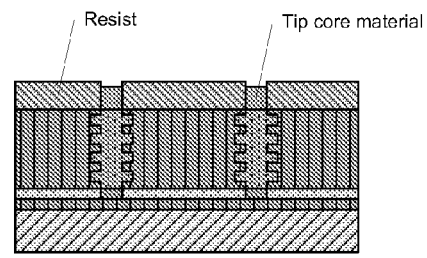
Figure 28G:
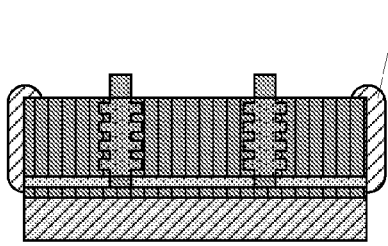
Figure 28H:
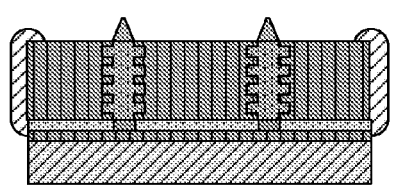

In FIG. 28E, a multi-layer probe structure has been fabricated, embedded in sacrificial material. Note that as shown, In FIG. 28F, resist has been patterned and a relatively tall deposit of material (e.g., Ni) suitable for use as a probe tip core has been plated. In FIG. 28G, the edges of the wafer have been protected (e.g., by lacquer or wax) and in FIG. 28H, electrochemical etching has been performed under conditions that result in a sharpening of the protruding deposited metal structures. Some etching of the sacrificial material surrounding the probes may also occur. If this occurs to an extent that cannot be tolerated, the sacrificial material may be protected (e.g., by patterned resist) prior to the etching.

Figure 28I:
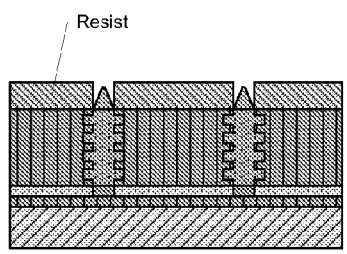
Figure 28J:
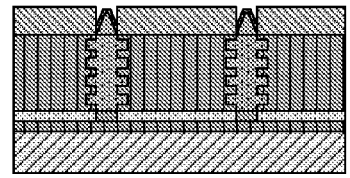
Figure 28K:
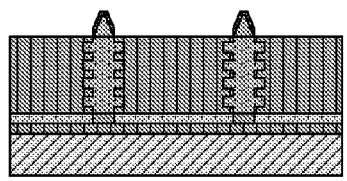

In FIG. 28I, resist has been patterned so as to expose the sharpened tips. In FIG. 28J, a tip coating material (e.g., Rh) has been deposited over the tips. In FIG. 28K, the resist has been stripped and in FIG. 28L, sacrificial material has been deposited so as to envelop the tips, although this step can be eliminated, for example, if the adhesive applied as shown in FIG. 28M is sufficiently thick to accommodate the tip height.

Figure 28L:
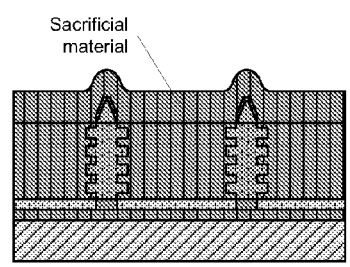
Figure 28M:
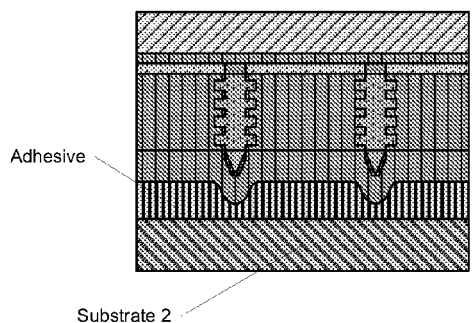
Figure 28N:
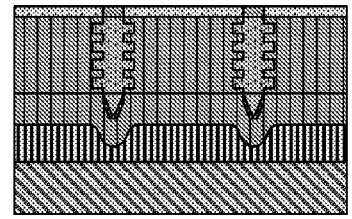
Figure 28O:
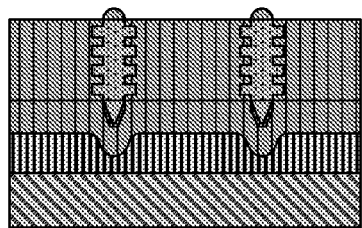

In FIG. 28M, the structure shown in FIG. 28L has been attached to Substrate 2 using an adhesive (this should be capable of tolerating the temperatures associated with subsequent processing). If desired, the sacrificial material applied as shown in FIG. 28L can be planarized prior to this step, such that the adhesive layer can be made thinner. In FIG. 28N, Substrate 1 and the seed layer coating it is removed (e.g., by dissolution of the seed layer). In FIG. 28O, the removable material is removed and then the solder is reflowed. To minimize heating of the adhesive, the removable material can be removed and/or the solder reflowed using a localized flow of hot air.

Figure 28P:
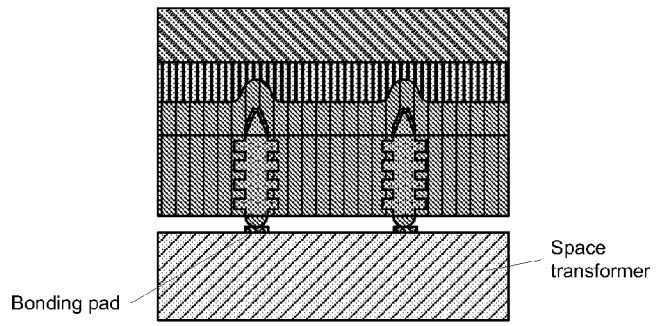
Figure 28Q:
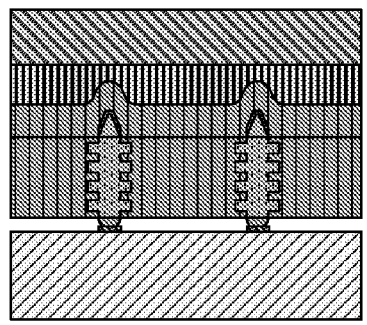
Figure 28R:
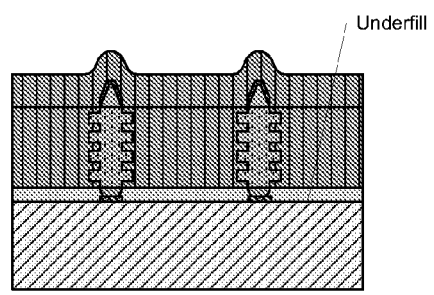
Figure 28S:
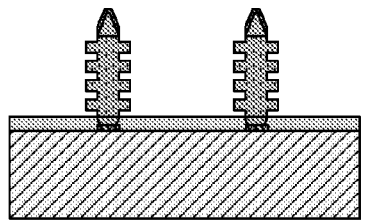
Figure 29A:
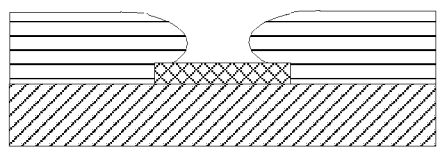
FIGS. 29A–29D depict a process where trumpet-like flare to the tip's leading surface can occur due to bulging of the sacrificial metal.
Figure 29B:
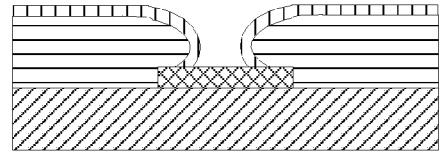
Figure 29C:
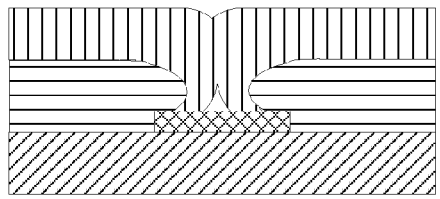
Figure 29D:
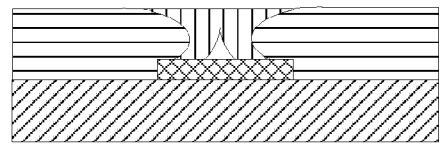
Figure 30A:
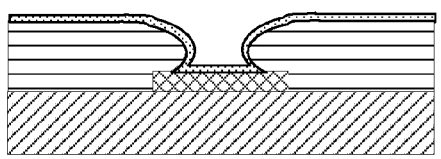
FIGS. 30A–30D depicts an enhanced process which may be used if bulging and flaring occurs.
Figure 30B:
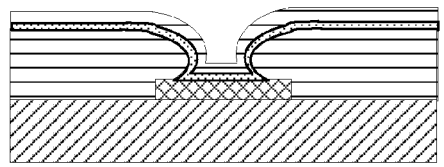
Figure 30C:
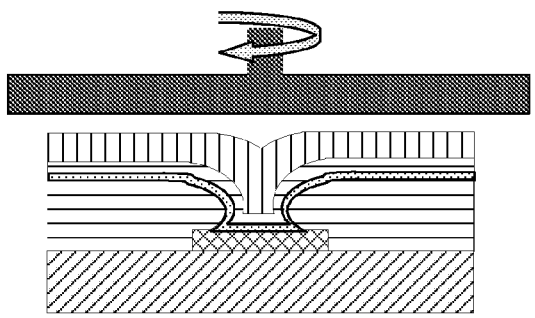
Figure 30D:
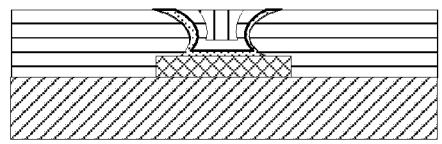

In FIG. 28P, the structure shown in FIG. 28O has been flipped over and placed onto a space transformer (or other device) provided with bonding pads. In FIG. 28Q, the solder has been reflowed, bonding the probes to the space transformer. In FIG. 28R, Substrate 2 has been removed (e.g., by removing the adhesive coating it) and an underfill (in this case, permanent) has been wicked in (if needed, for example, to protect the solder from etching of the sacrificial material) between the sacrificial material and space transformer. In FIG. 28S, the sacrificial material has been etched, leaving behind probes bonded to a space transformer.

In alternative embodiments other techniques may be used to get desired probe tip configurations.

In other examples probe tips may be created by building an extruded shape (i.e., build normally) and then electrochemically sharpening after transfer and release. There may be some distortion to the rest of the probe structure, but this may be acceptable for some applications. If the level of distortion is unacceptable, a combination of probe material, probe tip material, and etchant may be chosen such that etching of the probe tip occurs at a faster rate than the etching of the probe body.

In an alternative or in addition to careful selection of materials an operation may be performed prior to sharpening to preferentially enhance the resistance of the probe body material to sharpening, for example, oxidation or an appropriate CVD reaction.

In the embodiments of FIGS. 9A–9G, 10A–10C, 23A–23U, and 24A–24CC tip formation occurs via a process that makes use of an electroplating effect where the overplating and mushrooming of a sacrificial metal over a patterned photoresist layer forms a sacrificial mold that is used to shape the tips.

It has been noticed that overplating (i.e. mushrooming) may produce a slight bulge in the mushroomed sidewalls of the sacrificial metal. This bulging has several effects. One is that when the structural material is plated in the hole that is formed by the sacrificial metal, the structural material follows the curved contour of the sacrificial metal wall, until it reaches the bottom of that hole where the initial photoresist rests. In this region, due to the bulging of the sacrificial metal, there exists a small skirting space under the bulge such that when the structural material fills that area in and is released, the result is a trumpet-like flare to the tip's leading surface. This is depicted in FIGS. 29A–29D.

If such bulging and flaring occurs an enhanced process may be used as depicted in FIGS. 30A–30D. On a conductive substrate (either a metallic substrate to begin with, or a dielectric substrate with deposited seed layers) a thin photoresist is spun on and patterned with appropriate geometries for the desired tip shape and size [FIG. 30A]. Overplating is performed as per the previously discussed fabrication methods, but using a very low current density. Once this is done, a bulge may exist in the side walls of the holes formed by the sacrificial metal. The low plating current density is assumed to reduce the amount of bulging that will occur. The sample is then subjected to a PVD deposition of a secondary seed layer (for example, sputter deposition of TiW/Cu) that will conformably coat all available surfaces—including the space underneath the bulge as mentioned above [see FIG. 30A]. Once this is complete, a thin layer of Cu is electroplated (e.g. having a thickness of ~5um) over the seed layer [see FIG. 30B]. Next, the structural material is blanket plated over the entire sample, filling in the hole for the tips [see FIG. 30C], and then the surface is lapped and polished [see FIG. 30D]. The tips are thus formed and fabrication of probe bodies may proceed.

This approach offers several benefits. First, by using a secondary seed layer and a subsequent sacrificial material (e.g. copper) electroplated layer, this leads to the filling in of the region that resulted in flaring of the fabricated tips. Thus when the structural material is electroplated, it will not form the trumpet-shaped lip at the leading surface of the tip.

A second benefit is that by adding a seed layer and a conductive layer over that, a third material separate from the sacrificial and the structural material may be used to electroplate into the hole first, and then the rest of the space may be filled with the structural material. This allows coating of the tips with a third, arbitrary material that is electroplatable (for example, a thin film of Rhodium may be electroplated into the hole first, then the structural material Ni may be used to fill in the rest of the hole, thus forming Rh coated Ni tips after release).

Third, it was also noticed in previous experiments that for certain geometries of the tip-patterning photoresist the structural material might not fully fill in the space in the hole resulting in a slit or a gap in the middle of the tips. This may be undesirable for a number of reasons, including contamination issues.

Finally, empirical experience has shown that sometimes the photoresist that had been used for the initial overplating is not always eliminated upon release etching of the tips. Oftentimes the photoresist will remain behind as undesired flaps on top of the tip structures upon release. By adding a seed layer and sacrificial layer above that, any direct physical connection between the tips and the photoresist is eliminated, such that upon release etching of the sacrificial metal, the photoresist loses mechanical adhesion to the build and is removed in the etching solution.

Figure 31A:
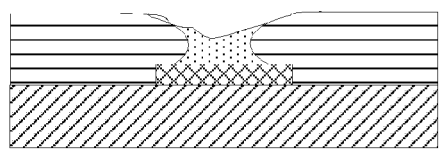
FIGS. 31A–32B depict an alternative processes to allow the polymer to set, then use a directional plasma etch to remove the polymer from the surface of the mushroomed sacrificial material and the bottom of the hole but letting it remain behind in the undercut regions.
Figure 31B:
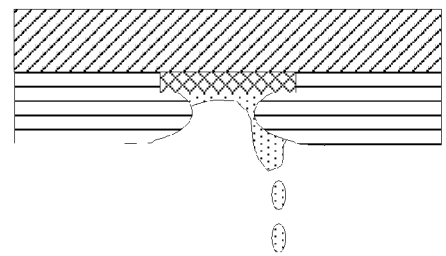
Figure 31C:
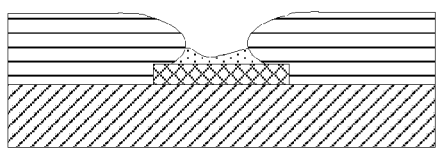
Figure 31D:
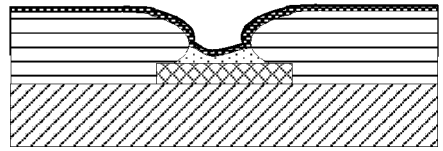
Figure 32A:
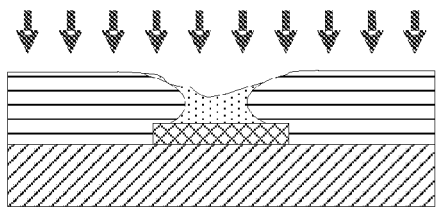
Figure 32B:
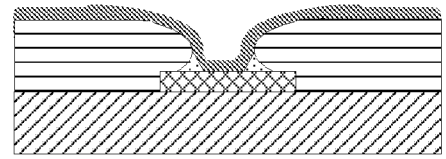

In an alternative embodiment a polymer may be used to fill in the space underneath the bulge created by the mushroomed sacrificial material (e.g. copper). First the polymer may be made to fill the entire hole and then it may be preferentially removed from the central portion of the hole and a seed layer deposited in preparation for depositing tip material. This preferential removal of the polymer may be accomplished by either simply pouring out the polymer out of the hole, and allowing surface tension to keep the polymer in the region underneath-the-bulge, and then curing the polymer. The polymer would need to begin as a very thin liquid to allow for this to occur. A second alternative may be to allow the polymer to set, then use directional plasma etch to remove the polymer from the surface of the mushroomed sacrificial material and the bottom of the hole, but letting it remain behind in the undercut regions. Two examples of this process are depicted in FIGS. 31A–31D and 32A–32B. FIG. 31A depicts formation of mushroomed sacrificial material with an opening filled with polymer. FIG. 31B depicts the removal of a portion of the liquid polymer by pouring it out. FIG. 31C depicts a polymer remaining in the bottom of the hole and filling the region underneath the bulge. FIG. 31D depicts deposition of a seed layer over the entire topology in preparation for depositing tip material. FIG. 32A depicts the coating of the opening with the polymer which is allowed to set after which a directional plasma etch is used to preferentially remove the polymer from the exposed up-facing surfaces. FIG. 32B depicts deposition of a seed layer over the entire topology in preparation for depositing tip material.

In another alternative embodiment, it may be possible to perform an etch of the mushroomed copper to try to reduce the size of the bulge. This would be especially useful in bulges that are particularly pronounced, making use of the extended geometry's tendency to be flattened out during etching.

In another alternative embodiment, it may be possible to minimize or eliminate the bulge with alternating plating baths and plating conditions. Possible baths include, for example, acid-Cu with different formulations than what is currently used, pyrophosphate baths, and electroless baths. Additives may also be considered to regulate the growth more precisely to reduce the amount of the bulge. Modifications in the plating conditions may also be tried by varying the plating current density higher or lower, use of pulse plating to deposit, remove, deposit the material, or to deposit at a continuously varying rate.

A further alternative embodiment may use a different sacrificial material (e.g. something other than copper) in the forming the mushroomed overgrowth. For example, Ni may be used. The Ni may be put down exactly as the Cu, a seed layer deposited, Cu fill-in electroplated, and the rest of the tip fabricated. The Cu fill-in would also serve as a way for later release and separation of the tip material from the Ni mold. An example of this approach is depicted in FIGS. 33A–33D.

Figure 33A:
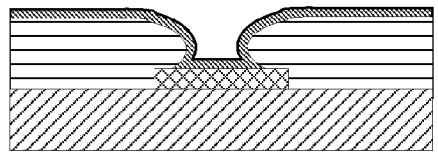
FIGS. 33A–33D depict an approach where Cu fill-in can serve as a way for later release and separation of the tip material from the Ni mold.

FIG. 33A depicts formation of the mushroomed material using a metal other than Cu—for example, nickel—that may produce less of a bulge than Cu which is followed by deposition of a seed layer over the entire topology.

Figure 33B:
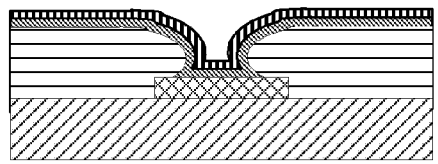

FIG. 33B depicts the electroplating of a thin layer of Cu over the deposited seed layer. This will form a layer of Cu over the photoresist as well as filling in any remaining skirting under the bulge.

Figure 33C:
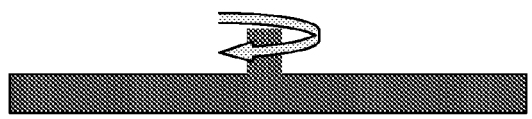
Figure 33C:
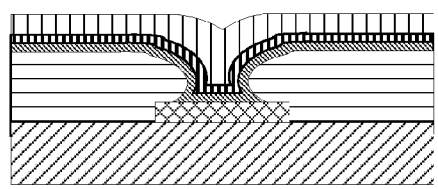
Figure 33D:
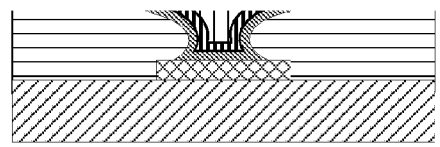

FIG. 33C depicts the beginning of planarization of the deposited materials while FIG. 33D depicts the result of planarization which sets the stage for proceeding with the remaining build operations.

In other alternatives it may be possible to use modified patterns of the photoresist to preferentially shape the mushroomed overgrowth. For example, a "Maya pyramid" shaped 2-layer structure may be made using photoresist first, with a wider 1st layer and a narrower 2nd layer. When the bulging reaches the 2nd layer, the plating stops and the top surface of the 2nd layer is then taken as the now bottom of the tip mold. The crevice underneath the bulge is never exposed to the electroplating since the 2-layer photoresist fits into that profile. Alternatively, a 1st layer can be patterned, the Cu electroplated and mushroomed and the bulge allowed to form, and then a second photoresist/photolithography step may be performed to allow the photoresist to fill in the hole, and then be patterned to have the 2nd layer fill in the bottom of the tip mold. This way, reminiscent of Method Two, the photoresist polymer will fill in the crevice underneath the bulge. Finally, a seed layer is deposited and the rest of the tip built. Another way to use modified patterns may be to use different shapes altogether, for example, a ring of photoresist instead of a circular disk. An example of the pyramid approach is depicted in FIGS. 34A–34D.

Figure 34A:
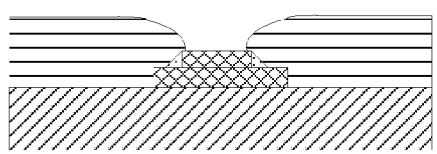
FIGS. 34A–34D depict a 2-layer tip structure which may be made using photoresist first, with a wider 1st layer and a narrower 2nd layer.
Figure 34B:
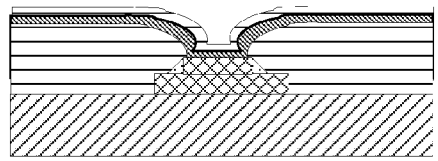
Figure 34C:
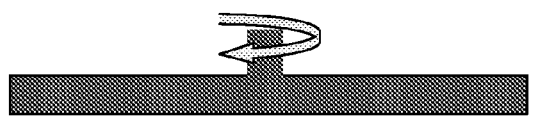
Figure 34C:
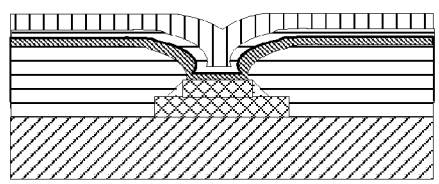
Figure 34D:
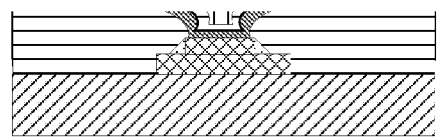

FIG. 34A depicts formation of mushroom using a 2-tiered photoresist pattern. FIG. 34B depicts deposition of a seed layer over the entire topology and a thin layer of electroplated sacrificial material over the deposited seed layer. FIG. 34C depicts the beginning of planarization of the deposited materials while FIG. 34D depicts the result of planarization which sets the stage for proceeding with the remaining build operations.

Figure 35A:
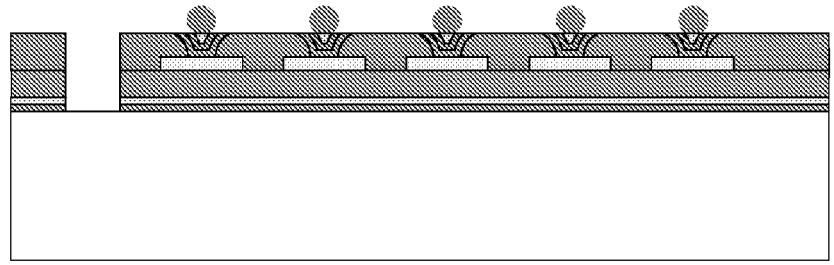
FIGS. 35A–35B depict probe tips as made by one or more of the various processes described herein with an attachment material located thereon and there after used to bond the tips to probes.
Figure 35B:
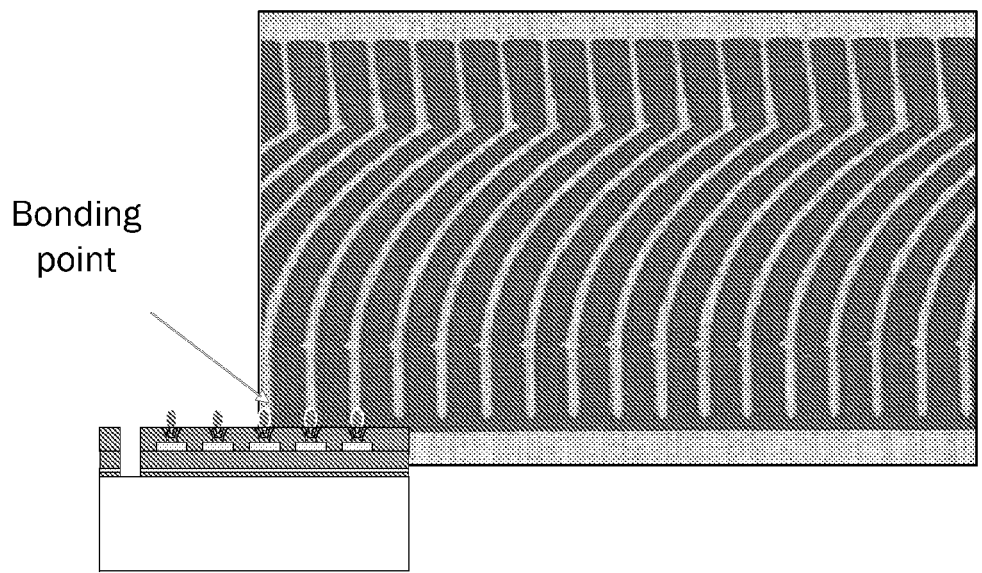

In some alternative embodiments, probe tips as made by one or more of the various processes described herein may have solder or other bonding material located on their back sides (i.e. the side away from the tip) and then the tips may be bonded to any desired prefabricated metal target. Example of such probe tips are shown in FIG. 35A and an example of such probe tips being bonded to a set of COBRA probes is shown in FIG. 35B. Of course in other embodiments, the tips may be bonded to other things, bonding may occur simultaneously with a smaller number of tips or with a larger number of tips, and/or something other than tips may be transferred.

In alternative embodiments other techniques may be used to get desired probe tip configurations. For example, it may be possible to get undercut photoresists by using a shadowed or grey scaled photomask to expose the photoresist which upon development will yield a sloped surface.

In some embodiments probe tips may be made from the same material as the probe elements themselves (e.g. Ni or Ni—P) while in other embodiments probe tips may be formed from one or more different materials (e.g. palladium (Pd), gold (Au), rhodium (Rh), or rhenium) or coating on the probe tips may be formed from these other materials.

Some embodiments may employ diffusion bonding or the like to enhance adhesion between successive layers of material. Various teachings concerning the use of diffusion bonding in electrochemical fabrication process is set forth in U.S. Patent Application No. 60/534,204 filed Dec. 31, 2003 by Cohen et al. which is entitled "Method for Fabricating Three-Dimensional Structures Including Surface Treatment of a First Material in Preparation for Deposition of a Second Material" and which is hereby incorporated herein by reference as if set forth in full.

Further teaching about microprobes and electrochemical fabrication techniques are set forth in a number of U.S. patent applications which are filed on Dec. 31, 2003 herewith. These Filings include: (1) U.S. Patent Application No. 60/533,933 by Arat et al. and which is entitled "Electrochemically Fabricated Microprobes"; (2) U.S. Patent Application No. 60/533,947 by Kumar et al. and which is entitled "Probe Arrays and Method for Making"; (3) U.S. Patent Application No. 60/533,948 by Cohen et al. and which is entitled "Electrochemical Fabrication Method for Co-Fabricating Probes and Space Transformers"; and (4) U.S. Patent Application No. 60/533,897 by Cohen et al. and which is entitled "Electrochemical Fabrication Process for Forming Multilayer Multimaterial Microprobe structures". These patent filings are each hereby incorporated herein by reference as if set forth in full herein.

Further teachings about planarizing layers and setting layers thicknesses and the like are set forth in the following U.S. patent applications: (1) U.S. Patent Application No. 60/534,159 filed Dec. 31, 2003 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 filed Dec. 31, 2003 by Cohen et al. and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

Additional teachings concerning the formation of structures on dielectric substrates and/or the formation of structures that incorporate dielectric materials into the formation process and possibility into the final structures as formed are set forth in a number of patent applications. The first of these filings is U.S. Patent Application No. 60/534,184, filed Dec. 31, 2003 which is entitled "Electrochemical Fabrication Methods Incorporating Dielectric Materials and/or Using Dielectric Substrates". The second of these filings is U.S. Patent Application No. 60/533,932, filed Dec. 31, 2003 which is entitled "Electrochemical Fabrication Methods Using Dielectric Substrates". The third of these filings is U.S. Patent Application No. 60/534,157, filed Dec. 31, 2003 which is entitled "Electrochemical Fabrication Methods Incorporating Dielectric Materials". The fourth of these filings is U.S. Patent Application No. 60/533,891, filed Dec. 31, 2003 which is entitled "Methods for Electrochemically Fabricating Structures Incorporating Dielectric Sheets and/or Seed layers That Are Partially Removed Via Planarization". A fifth such filing is U.S. Patent Application No. 60/533,895, filed Dec. 31, 2003 which is entitled "Electrochemical Fabrication Method for Producing Multi-layer Three-Dimensional Structures on a Porous Dielectric" These patent filings are each hereby incorporated herein by reference as if set forth in full herein.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use selective deposition processes or blanket deposition processes on some layers that are not electrodeposition processes. Some embodiments may use nickel as a structural material while other embodiments may use different materials. Some embodiments may use copper as the structural material with or without a sacrificial material. Some embodiments may remove a sacrificial material while other embodiments may not. Some embodiments may employ mask based selective etching operations in conjunction with blanket deposition operations. Some embodiments may form structures on a layer-by-layer base but deviate from a strict planar layer on planar layer build up process in favor of a process that interlacing material between the layers. Such alternating build processes are disclosed in U.S. application Ser. No. 10/434,519, filed on May 7, 2003, entitled Methods of and Apparatus for Electrochemically Fabricating Structures Via Interlaced Layers or Via Selective Etching and Filling of Voids which is herein incorporated by reference as if set forth in full.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A method for creating a contact structure, comprising a conductive contact tip for contacting a surface to be probed and a conductive compliant probe structure for providing a desired contact force between the contact tip and the surface to be probed, the method comprising:

forming the contact tip having a desired configuration; and forming the compliant probe structure electrochemically, wherein the compliant probe structure is formed on the contact tip.

2. The method of claim 1 wherein the contact tip has a shape wherein the shape is derived at least in part from the mushrooming of an electrodeposited sacrificial material over a dielectric material.

3. The method of claim 1 wherein the contact tip has a shape wherein the shape is derived at least in part from a pattern etched in silicon.

4. The method of claim 1 wherein the contact tip has a shape wherein the shape is derived at least in part via molding contact tip material in voids formed in patterned photoresist.

5. The method of claim 1 wherein the contact tip has a shape wherein the shape is derived at least in part via etching of a patterned tip material.

6. The method of claim 1 wherein the contact tip has a shape wherein the shape is derived at least in part via isotropic etching of a tip material around etching shields.

7. The method of claim 1 wherein the contact tip has a shape wherein the shape is derived at least in part via hot pressing.

8. The method of claim 1 wherein the contact tip comprises a different material than the compliant probe structure.

9. The method of claim 1 wherein the contact tip comprises the same material as the probe structure.

10. The method of claim 1 wherein the contact tip comprises a coating material.

11. The method of claim 1 wherein the contact tip comprises a conductive coating material and the probe structure comprises a conductive coating material.

12. The method of claim 11 wherein the coating material on the tip is different from the coating material on the probe structure.

13. The method of claim 11 wherein the coating material on the tip is the same as the coating material on the probe structure.

14. A method for creating a contact structure, comprising a conductive contact tip for contacting a surface to be probed and a conductive compliant probe structure for providing a desired contact force between the contact tip and the surface to be probed, comprising:

forming a contact tip having a desired configuration; and forming compliant probe structure from a plurality of adhered layers of deposited conductive material, wherein the compliant probe structure is formed on the contact tip.

* * * * *